(12) United States Patent
Kito et al.

(10) Patent No.: US 7,276,750 B2
(45) Date of Patent: Oct. 2, 2007

(54) SEMICONDUCTOR DEVICE HAVING TRENCH CAPACITOR AND FABRICATION METHOD FOR THE SAME

(75) Inventors: Masaru Kito, Yokohama (JP); Masaru Kido, Kawasaki (JP); Hideaki Aochi, Kawasaki (JP); Toshiharu Tanaka, Yokohama (JP); Ryota Katsumata, Yokohama (JP); Hideki Inokuma, Yokohama (JP); Yoichi Takegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 10/922,228

(22) Filed: Aug. 20, 2004

(65) Prior Publication Data

US 2005/0101094 A1 May 12, 2005

(30) Foreign Application Priority Data

Nov. 11, 2003 (JP) ............................. P2003-381520

(51) Int. Cl.
  *H01L 27/08* (2006.01)
  *H01L 31/00* (2006.01)
  *H01L 29/76* (2006.01)
  *H01L 29/06* (2006.01)

(52) U.S. Cl. ...................... 257/296; 257/288; 257/399; 257/618; 257/906

(58) Field of Classification Search ................ 438/238, 438/239, 386, 978; 257/296, 288, 300, 618, 257/906
See application file for complete search history.

(56) References Cited

U.S. PATENT DOCUMENTS

| 6,121,651 A * | 9/2000 | Furukawa et al. .......... 257/296 |
| 6,140,175 A * | 10/2000 | Kleinhenz et al. .......... 438/243 |
| 6,552,382 B1 * | 4/2003 | Wu ............................. 257/305 |
| 6,867,450 B2 * | 3/2005 | Kito et al. .................. 257/301 |
| 2004/0150037 A1 | 8/2004 | Katsumata et al. |

FOREIGN PATENT DOCUMENTS

| JP | 2000-294744 | 10/2000 |
| JP | 2004-214379 | 7/2004 |

* cited by examiner

*Primary Examiner*—Howard Weiss
*Assistant Examiner*—Shrininvas H. Rao
(74) *Attorney, Agent, or Firm*—Banner & Witcoff, Ltd.

(57) ABSTRACT

A semiconductor device includes a semiconductor substrate with a trench; a capacitor; a collar oxide film arranged on a portion of a side of the trench above the capacitor; a storage node arranged on a side of the collar oxide film in an upper portion of the trench and electrically connected to a storage electrode of the capacitor; a select transistor provided on a surface of the semiconductor substrate and having a source region in contact with the trench; a spacer covering a side of the source region; and a surface strap contact arranged upon the spacers, the source region and the storage node.

15 Claims, 86 Drawing Sheets

FIG. 71
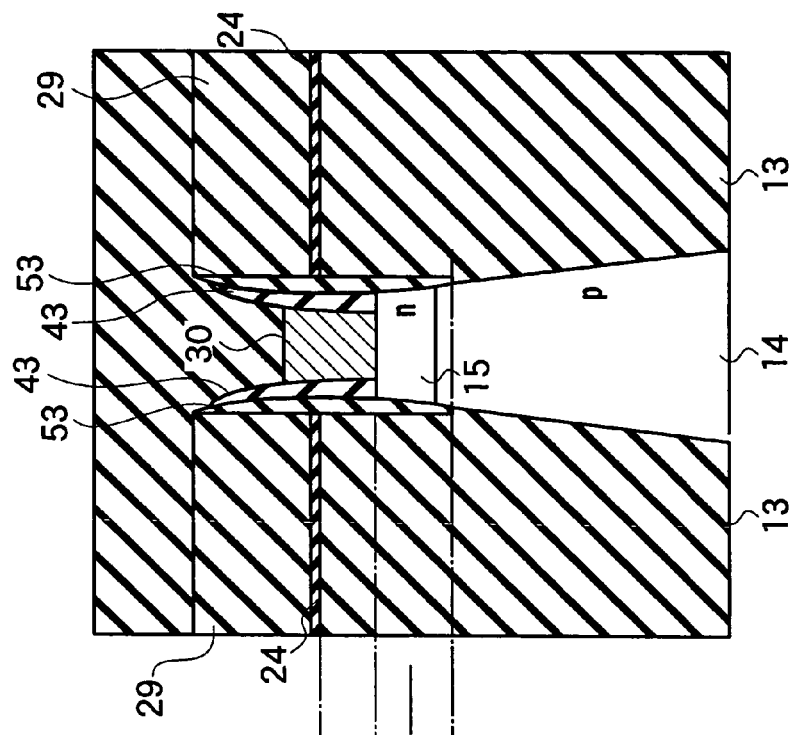
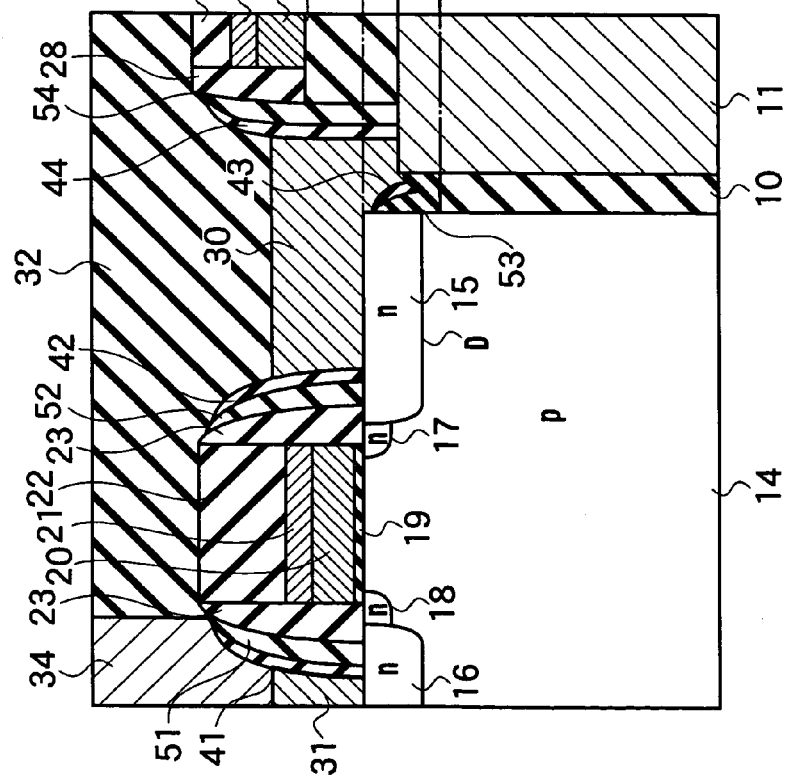

FIG. 74
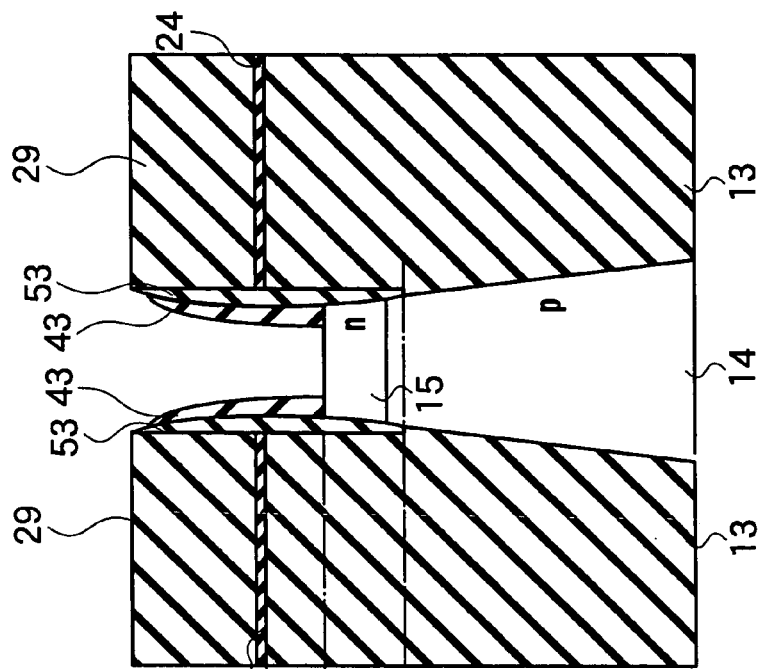
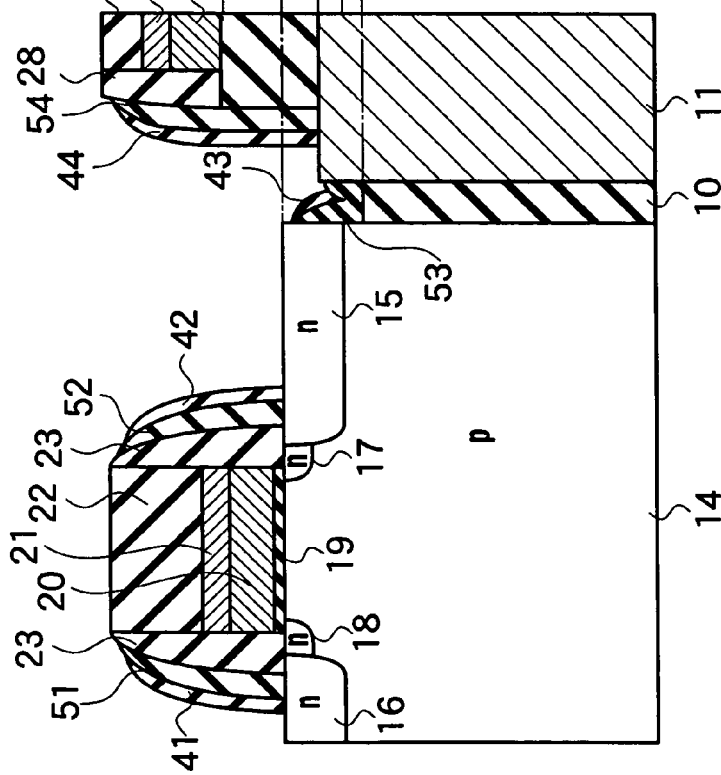

FIG. 84
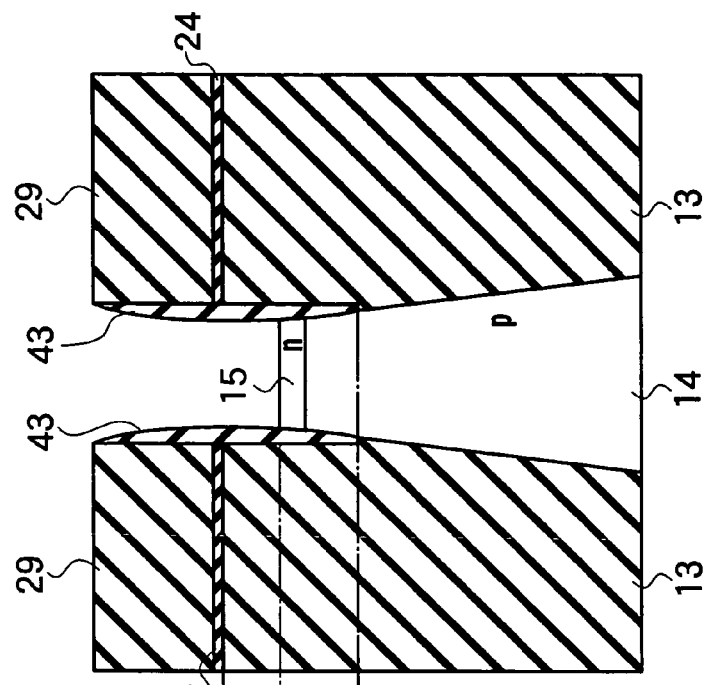
(a)
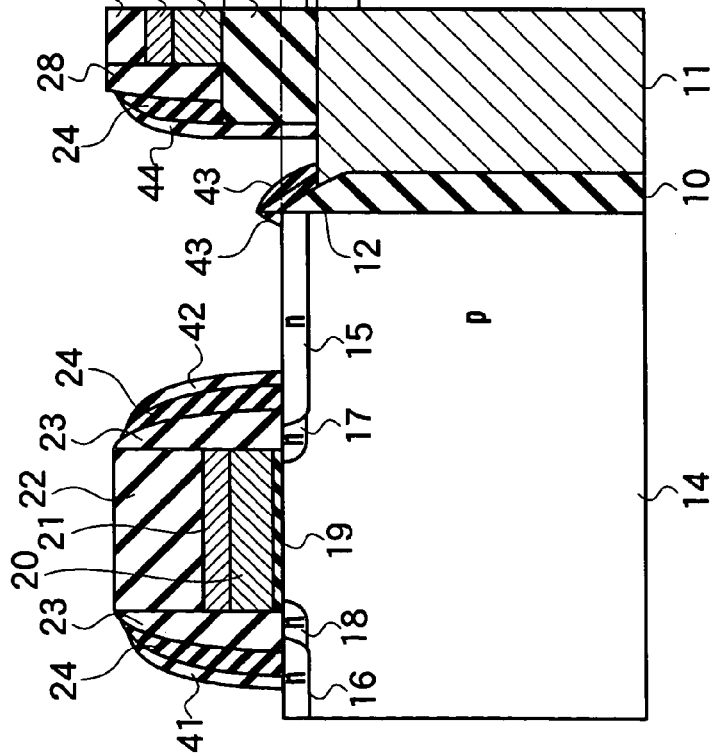
(b)

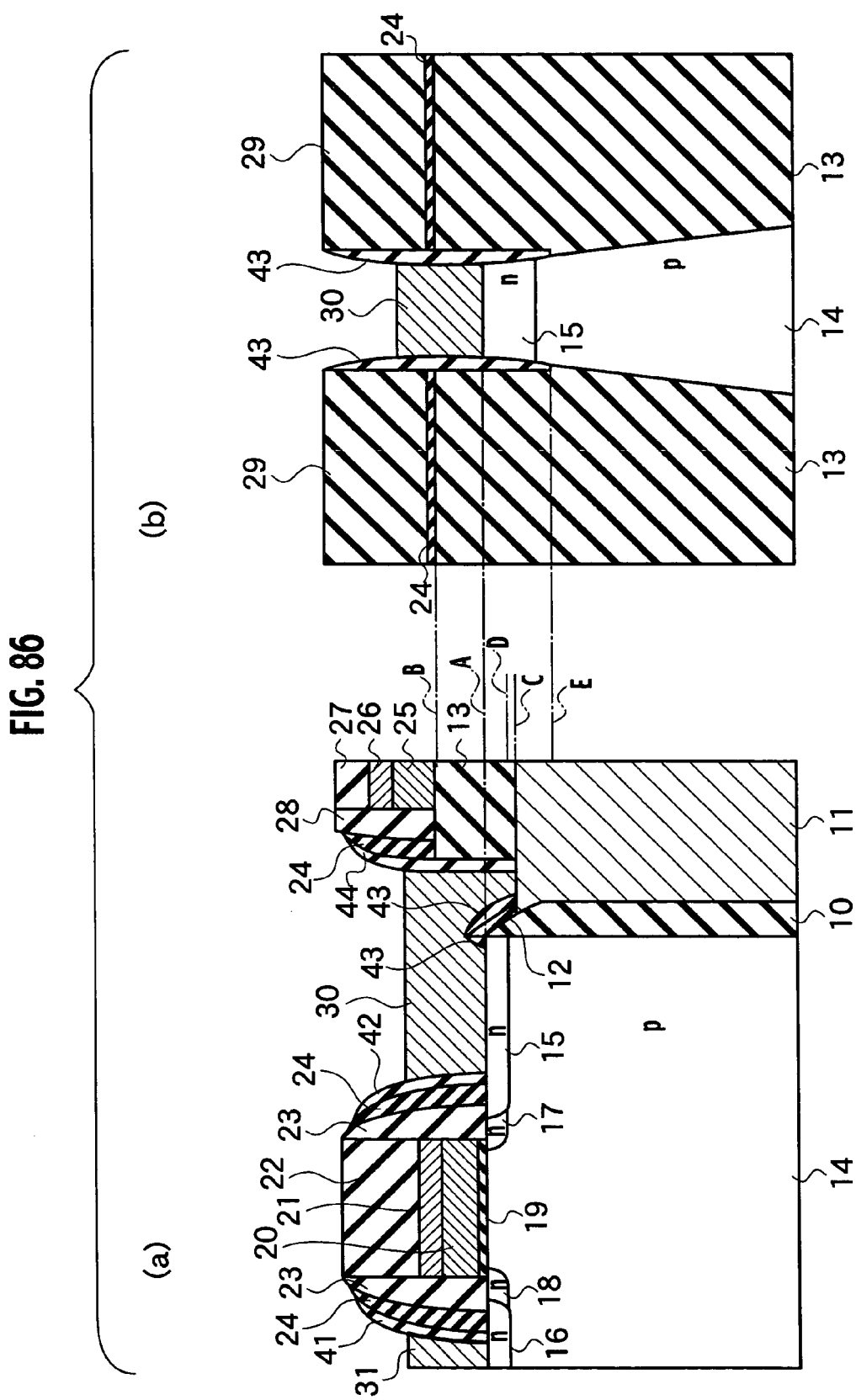

SEMICONDUCTOR DEVICE HAVING TRENCH CAPACITOR AND FABRICATION METHOD FOR THE SAME

CROSS REFERENCE TO RELATED APPLICATIONS

This application is based upon and claims the benefit of priority from prior Japanese Patent Applications No. P2003-381520, filed on Nov. 11, 2003; the entire contents of which are incorporated herein by reference.

BACKGROUND OF THE INVENTION

1. Field of the Invention

The present invention relates to a semiconductor device having capacitors provided in trenches in a semiconductor substrate. Particularly, it is related to a surface strap contact (SS), which provides a conduction connection between a storage node and a source region of a select transistor.

2. Description of the Related Art

Semiconductor devices may be provided with capacitors formed in trenches in a semiconductor substrate. The capacitors are connected to select transistors, and the charges accumulated in the capacitors may be controlled by turning the select transistors on and off. More specifically, the source regions of the select transistors and storage nodes connected to the capacitors are electrically connected by surface strap contacts. The SS contacts are provided on the surface of the semiconductor substrate, but not in the trenches.

SUMMARY OF THE INVENTION

A first aspect of the present invention inheres in a semiconductor device including a semiconductor substrate having a trench; a capacitor having a storage electrode and arranged in a lower portion of the trench; a collar oxide film arranged on a portion of a side of the trench above the capacitor; a storage node arranged on a side of the collar oxide film in an upper portion of the trench and electrically connected to the storage electrode; a select transistor provided on a surface of the semiconductor substrate and having a source region in contact with the trench; a spacer covering a side of the source region; and a surface strap contact arranged upon the spacers, the source region, and the storage node.

A second aspect of the present invention inheres in a semiconductor device fabrication method including forming a trench in a semiconductor substrate; forming a capacitor having a storage electrode, in a lower portion of the trench; forming a collar oxide film on a portion of a side of the trench; forming a storage node electrically connected to the storage electrode, on a side of the collar oxide film in an upper portion of the trench; forming a select transistor having a source region in contact with the trench and provided on a surface of the semiconductor substrate; forming a spacer on a side of the source region; and forming a surface strap contact upon the spacers, the source region, and the storage node.

BRIEF DESCRIPTION OF THE DRAWINGS

FIG. 50(a) is a partial cross-sectional diagram cut along the line XLVII-XLVII of FIG. 47; FIG. 50(b) is a cross-sectional diagram cut along the line XLIXB-XLIXB of FIG. 47;

FIG. 51(a) is a partial cross-sectional diagram cut along the line XLVII-XLVII of FIG. 47;

FIG. 51(b) is a cross-sectional diagram cut along the line XLIXB-XLIXB of FIG. 47;

FIG. 57(a) is a partial cross-sectional diagram cut along the line LV-LV of FIG. 54; FIG. 57(b) is a cross-sectional diagram cut along the line LVI-LVI of FIG. 54;

FIG. 62(a) is a partial cross-sectional diagram cut along the line II-II of FIG. 1; FIG. 62(b) is a cross-sectional diagram cut along the line XXXIXB-XXXIXB of FIG. 1;

FIG. 69(a) is a partial cross-sectional diagram cut along the line LXVII-LXVII of FIG. 66; FIG. 69(b) is a cross-sectional diagram cut along the line LXVIIIB-LXVIIIB of FIG. 66;

FIG. 71(a) is an enlarged view of FIG. 70; FIG. 71(b) is a cross-sectional diagram of the semiconductor device according to the eighth embodiment cut along the line XXXIXB-XXXIXB of FIG. 1;

FIG. 74 is a cross-sectional diagram of the semiconductor device according to the eighth embodiment in the course of fabrication; FIG. 74(a) is a cross-sectional diagram cut along the line LXXIVA-LXXIVA of FIG. 72; FIG. 74(b) is a cross-sectional diagram cut along the line LXXIVB-LXXIVB of FIG. 72;

FIG. 75(a) is a cross-sectional diagram cut along the line LXXIVA-LXXIVA of FIG. 73; FIG. 75(b) is a cross-sectional diagram cut along the line LXXIVB-LXXIVB of FIG. 73;

FIG. 84(a) is an enlarged view of FIG. 83; FIG. 84(b) is a cross-sectional diagram of the semiconductor device according to the ninth embodiment cut along the line LXXXIVB-LXXXIVB of FIG. 82;

FIG. 86(a) is an enlarged view of FIG. 85; and FIG. 86(b) is a cross-sectional diagram of the semiconductor device according to the ninth embodiment cut along the line LXXXIVB-LXXXIVB of FIG. 82.

DETAILED DESCRIPTION OF THE INVENTION

Figure 1:
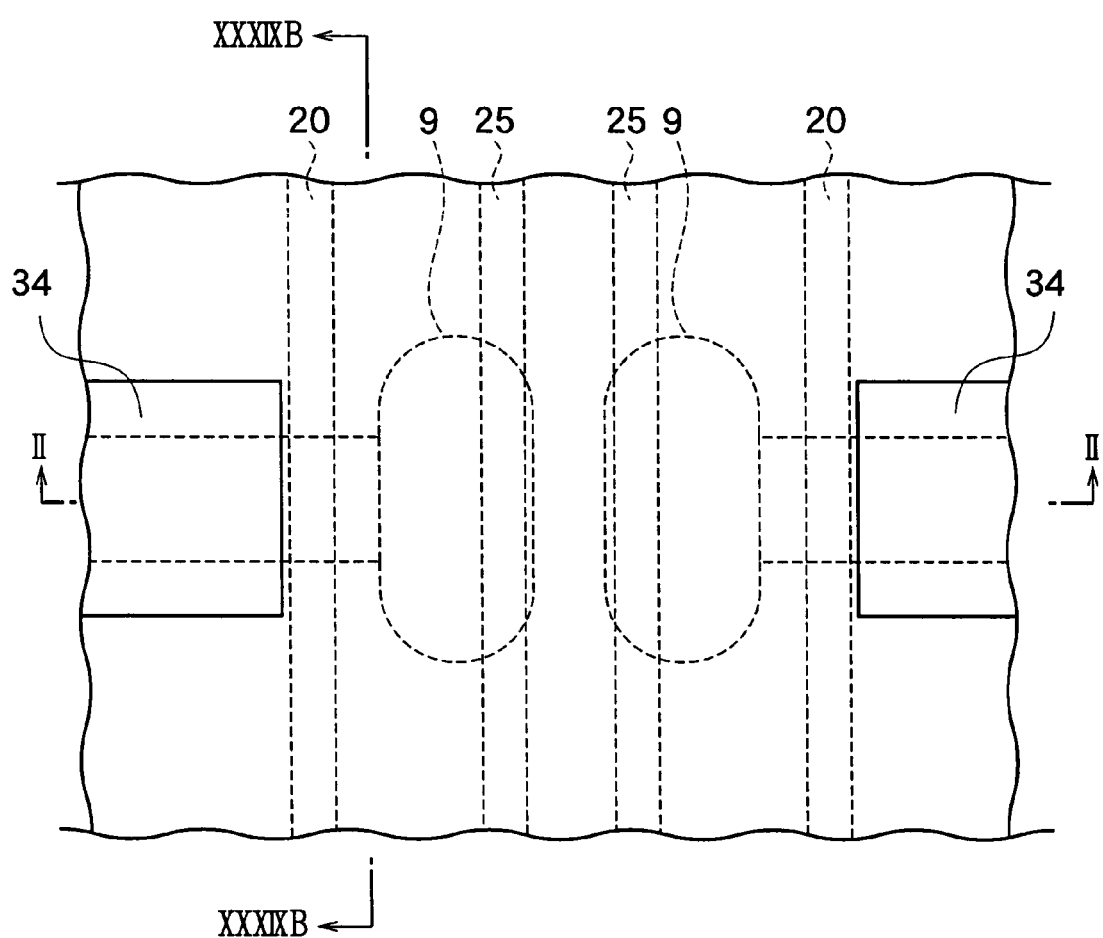
FIG. 1 is a top view of a semiconductor device according to a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Examination for Increasing Integration Density of Semiconductor Device)

An increase in semiconductor device memory capacity is desired. In order to increase the memory capacity, the integration density of select transistors should be increased. In order to increase the integration density, the select transistors must be smaller, and intervals therebetween must be narrower. This is a concern since the distance from the gate electrode of the select transistor to a corresponding storage node is decreased, the threshold of the select transistors decreases, and punch-through occurs. Furthermore, as the area of the source regions on the semiconductor substrate decreases, contact areas between SS contacts and the source regions cannot be decreased. This is because the contact resistance between the SS contact and the source region increases, and the operating speed of the semiconductor device decreases.

FIRST EMBODIMENT

Figure 2:
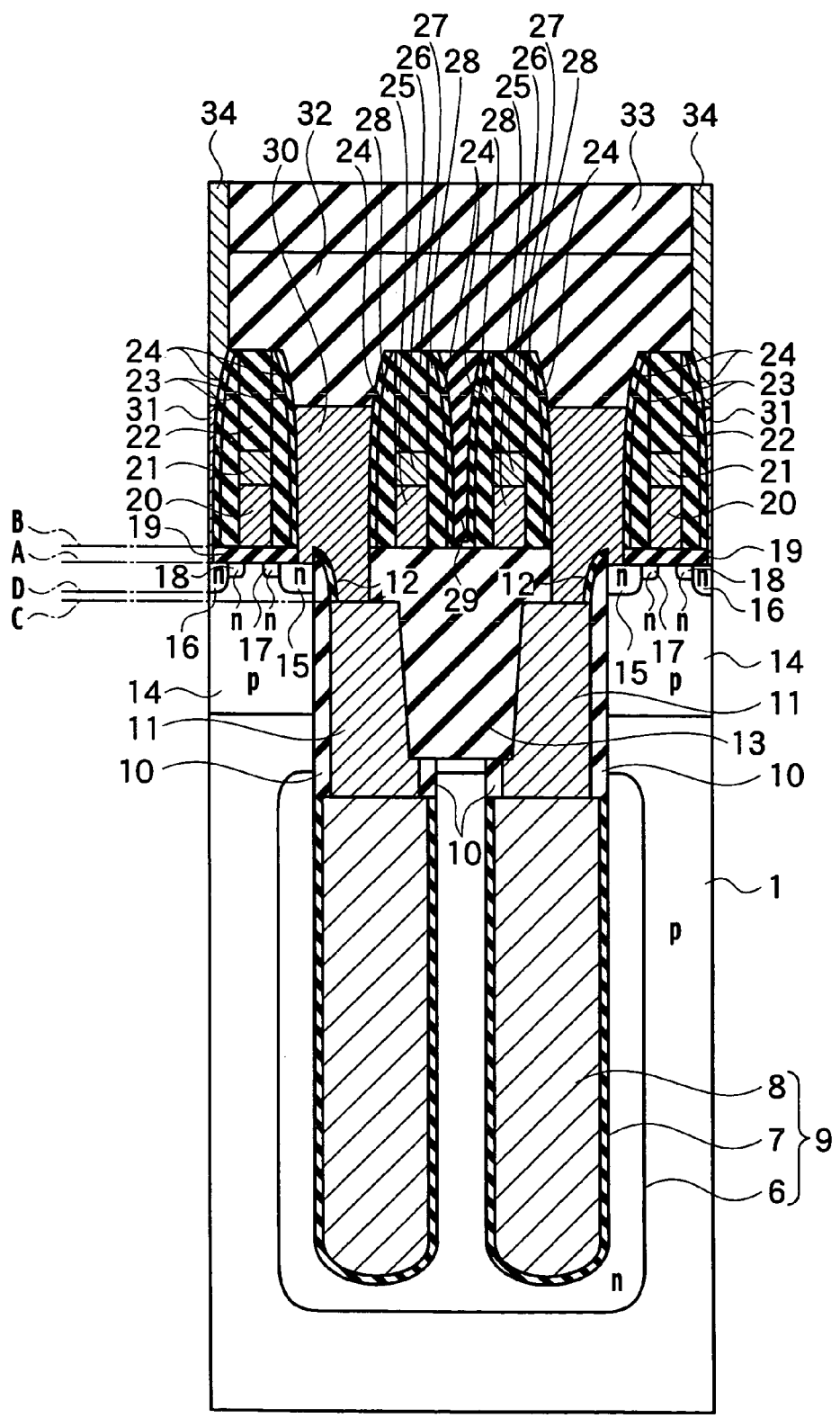
FIG. 2 is a cross-sectional diagram of a semiconductor device according to the first embodiment cut along the line II-II of FIG. 1.

As shown in FIGS. 1 and 2, a semiconductor device according to a first embodiment of the present invention includes a semiconductor substrate 1, capacitors 9, collar oxide films 10, storage nodes 11, select transistors (15-23), SS contacts 30, spacers 12, a shallow trench isolation (STI) 13, gate interconnects (25-28), barrier nitride films 24, pullout electrodes 31, contact plugs 34, and interlayer insulator films 32 and 33.

The semiconductor substrate 1 has p-wells 14 and trenches. The p-wells 14 are provided in the upper portion including the surface (surface A) of the semiconductor substrate 1. A p-type silicon (Si) substrate may be used as the semiconductor substrate 1.

The capacitors 9 are arranged in the lower portions of the trenches below the p-wells 14. The capacitors 9 include storage electrodes 8, a plate electrode 6, and capacitor dielectric films 7. The storage electrodes 8 are arranged in the lower portions of the trenches. An n-type polysilicon may be used as the storage electrodes 8. The plate electrode 6 is arranged in the semiconductor substrate 1 including the trench surfaces. The plate electrode 6 is made of an n-type silicon. The capacitor dielectric films 7 are arranged between the plate electrode 6 and the storage electrodes 8 on the trench sides. A dielectric film such as a silicon nitride film or a PZT film may be used for the capacitor dielectric films 7.

The collar oxide films 10 are arranged on the trench sides of the capacitors 9. The tops of the collar oxide films 10 are higher than the tops of the storage nodes 11. The collar oxide films 10 are arranged on the sides of the p-wells 14 and the source regions 15. Silicon oxide films may be used as the collar oxide films 10.

The storage nodes 11 are arranged on the surfaces of the collar oxide films 10 in the upper portions of the trenches. The storage nodes 11 are electrically connected to the storage electrodes 8. The height of the tops (surface C) of the storage nodes 11 need not be strictly controlled relative to that of the bottom surfaces (surface D) of the source regions 15. In other words, the height of the bottom surfaces (surface D) of the source regions 15 is not influenced by the height of the tops (surface C) of the storage nodes 11. An n-type polysilicon may be used as the storage nodes 11.

The select transistors include the source regions 15, drain regions 16, lightly-doped drain (LDD) regions 17 and 18, gate insulator films 19, lower gate electrodes 20, upper gate electrodes 21, silicon nitride films 22, and sidewalls 23. The source regions 15 are provided on the surface of the semiconductor substrate 1, and are in contact with the trenches. The sides of the source regions 15 are in contact with the collar oxide films 10. The drain regions 16 are provided on the surface of the semiconductor substrate 1. The drain regions 16 are separated from trenches 4 and 5 and the source regions 15. The source regions 15, the drain regions 16, and the LDD regions 17 and 18 are n-type silicon. Silicon oxide films may be used as the gate insulator films 19. The lower gate electrodes 20 may be n-type polysilicon films. Silicide films may be used as the upper gate electrodes 21. Silicon nitride films may be used as the sidewalls 23.

The spacers 12 cover the sides of the source regions 15. The spacers 12 are arranged on the collar oxide films 10 and the storage nodes 11. The upper portions of the spacers 12 are higher than that of the undersurfaces of the source regions 15. Silicon nitride films may be used for the sidewalls 12.

The SS contacts 30 are used as surface strap (SS) contacts. The SS contacts 30 are arranged on the spacers 12, the source regions 15, and the storage nodes 11. The SS contacts 30 provide a conduction connection between the source regions 15 and the storage nodes 11. An n-type polysilicon films may be used for the SS contacts 30.

The gate interconnects (25-28) have lower gate interconnects 25, upper gate interconnects 26, silicon nitride films 27, and sidewalls 28. n-type polysilicon films may be used for the lower gate electrodes 25. Silicide films may be used for the upper gate electrodes 26. Silicon nitride films may be used for the sidewalls 28.

The shallow trench isolation (STI) 13 is embedded in the semiconductor substrate 1. The STI 13 is arranged upon the collar oxide films 10, the storage nodes 11, and the spacers 12. The STI 13 is arranged on the sides of the storage nodes 11. The height of the top (surface B) of the STI 13 is almost equal to that of the top (surface A) of the semiconductor substrate 1. A silicon oxide film may be used for the STI 13.

The barrier nitride films 24 are arranged on the sidewalls 23 and 28 and the STI 13. Silicon nitride films may be used for the barrier nitride films 24.

The interlayer insulator films 29 are provided on the barrier nitride films 24. A BPSG film may be used for the interlayer insulator films 29.

The pullout electrodes 31 are provided above the drain regions 16. An n-type polysilicon film may be used for the pullout electrodes 31.

For the interlayer insulator films 32 and 33, a BPSG film 32 and an NSG film 33 may be used. The BPSG film 32 is provided on the SS contacts 30, the silicon nitride films 22 and 24, and the barrier nitride films 24. The NSG film 33 is provided on the BPSG film 32.

The contact plugs 34 are provided on the pullout electrodes 31. Copper (Cu) plugs or tungsten (W) plugs may be used as the contact plugs 34.

Since the spacers 12 are arranged on the collar oxide films 10, the collar oxide films 10 are not etched when etching a silicon oxide film (TTO) on the storage nodes 11 of the STI 13 so as to expose the source regions 15 and the storage nodes 11. The collar oxide films 10 are arranged on the sides of the p-wells 14 and the source regions 15. Furthermore, the spacers 12 cover the sides of the source regions 15, and the height of the upper portions of the spacers 12 is higher than that of the undersurfaces of the source regions 15. As a result, the sides of the p-wells 14 are not in contact with the SS contacts 30. The sides of the source regions 15 are also not in contact with the SS contacts 30. Even if the sides of the source regions 15 are in contact with the SS contacts 30, only a portion of the upper part of the sides of the source regions 15 are in contact therewith. Accordingly, an impurity such as arsenic doped in the SS contacts 30 does not diffuse to the bottoms of the source regions 15 in the p-wells 14.

As a result, for an increase in semiconductor device memory capacity, the integration density of the select transistors (15-23) is increased, and intervals therebetween must be narrower. In addition, the distance from the gate electrodes 20 and 21 to the storage nodes 11 of the select transistors (15-23) becomes shorter. Even in such case, the threshold of the select transistors (15-23) is not reduced, and punch-through does not develop. A semiconductor device allowing small areas of the source regions 15 on the semiconductor substrate 1 can be provided.

This semiconductor device may be a semiconductor memory device such as DRAM or a DRAM mixed integrated circuit as long as it has the capacitors 9 in the trenches of the semiconductor substrate 1.

A semiconductor device fabrication method of the first embodiment is described forthwith.

(a) A p-type silicon substrate is prepared as the semiconductor substrate 1. A 2 nm-thick pad silicon oxide film (SiO$_2$) 2 is deposited upon the semiconductor substrate 1 through chemical vapor deposition (CVD). A 220 nm-thick pad silicon nitride film (Si$_3$N$_4$) 3 is deposited upon the pad silicon oxide film 2 through CVD. Trenches 4 and 5 are formed in the silicon substrate 1 using photolithography and dry etching techniques.

Figure 3:
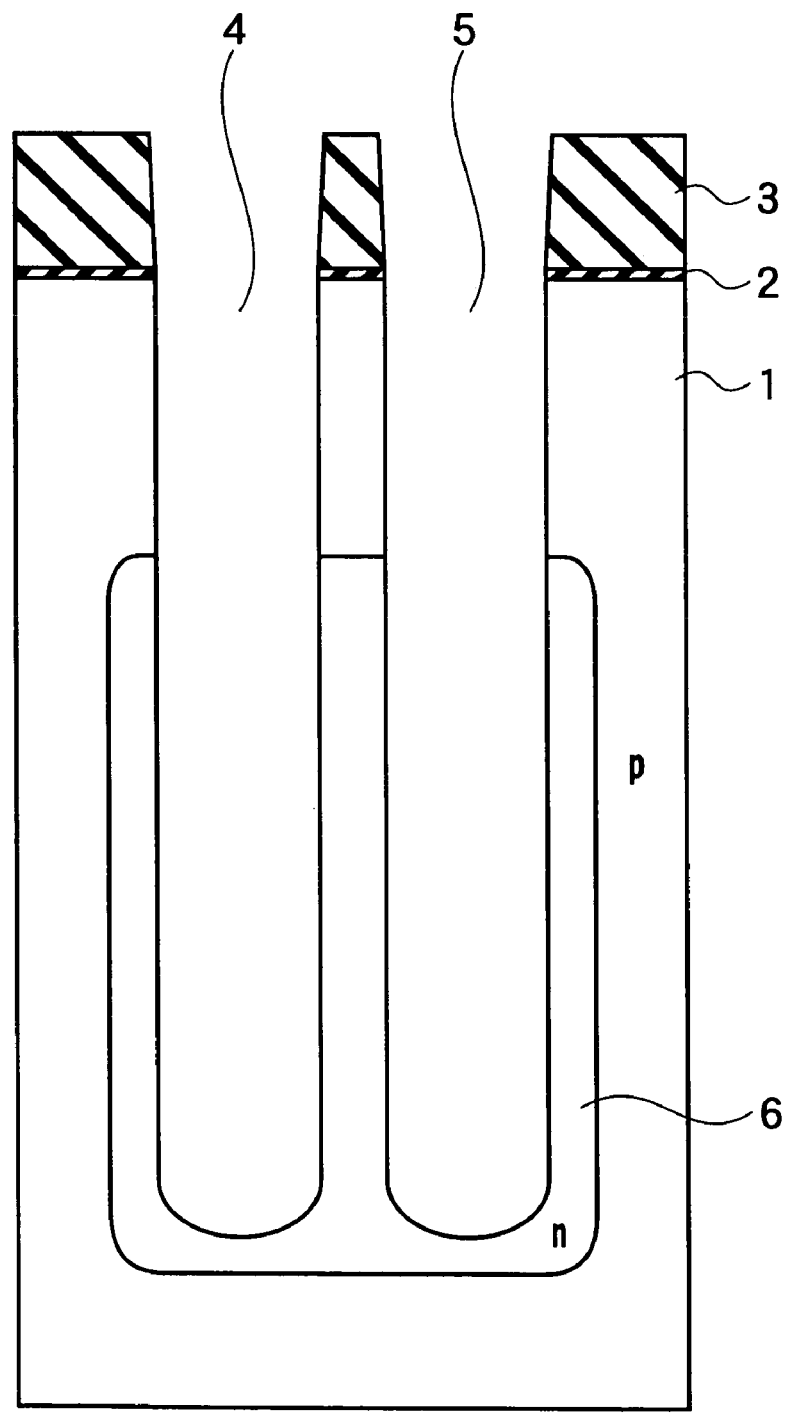
FIGS. 3 through 9 are cross-sectional diagrams of the semiconductor device according to the first embodiment in the course of fabrication.

(b) As shown in FIG. 3, an n-type impurity is diffused deeper in regions of the trenches 4 and 5 than a depth of 1.5" m from the surface of the silicon substrate 1. Note that 'depth' referred to hereafter means a depth from the surface of the semiconductor substrate 1. Activating the diffused n-type impurity forms the plate electrode 6.

(c) Capacitor dielectric films 7, 2-3 nm-thick, are deposited on the sides of the trenches 4 and 5 through CVD. A phosphorous-doped polysilicon film, which becomes the storage electrodes 8, is deposited through CVD. The storage electrodes 8 are embedded in the trenches 4 and 5. The storage electrodes 8 and the capacitor dielectric films 7 are etched back to an appropriate depth of approximately 1.0" m. As a result, the capacitors 9 are formed.

Figure 4:
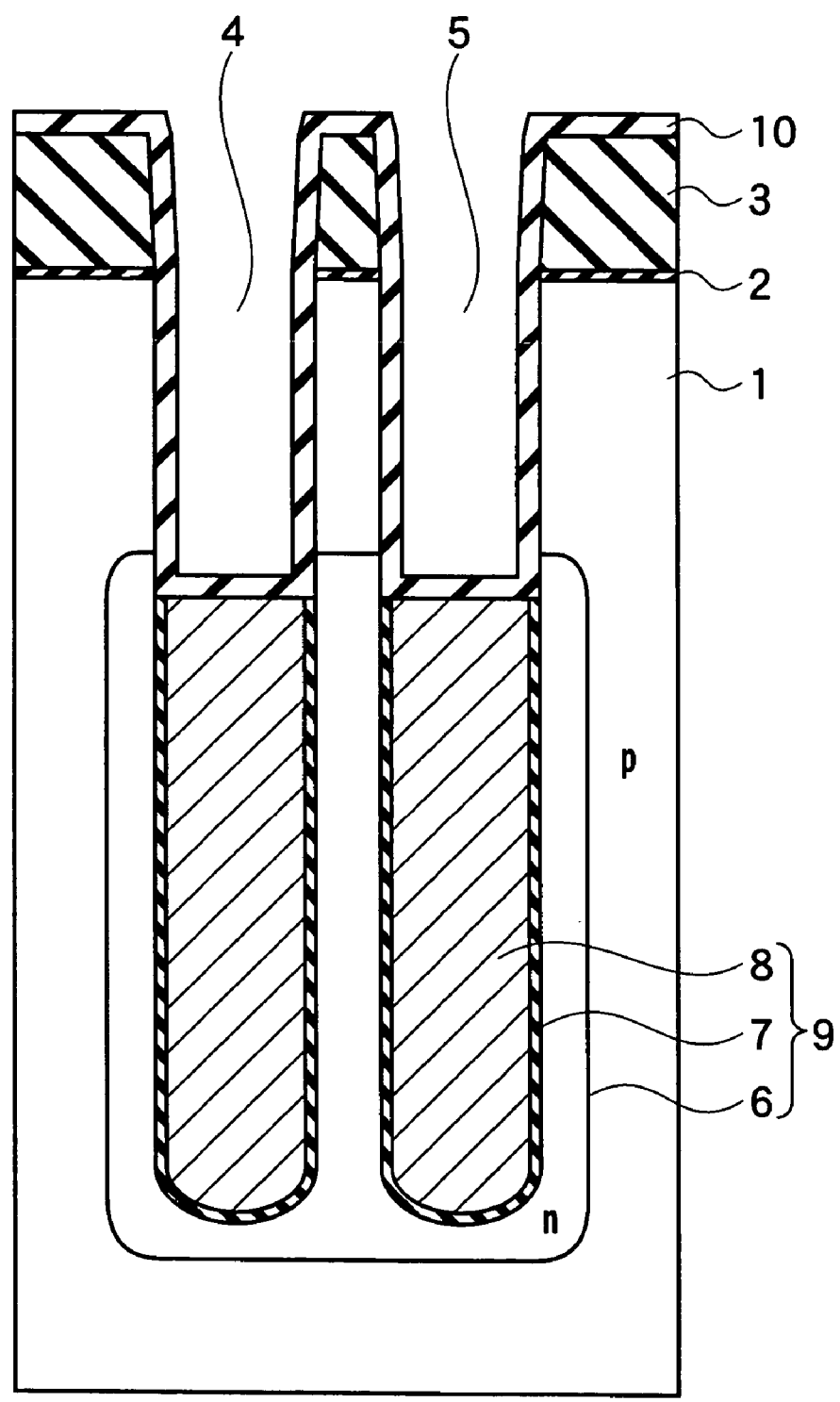
Figure 5:
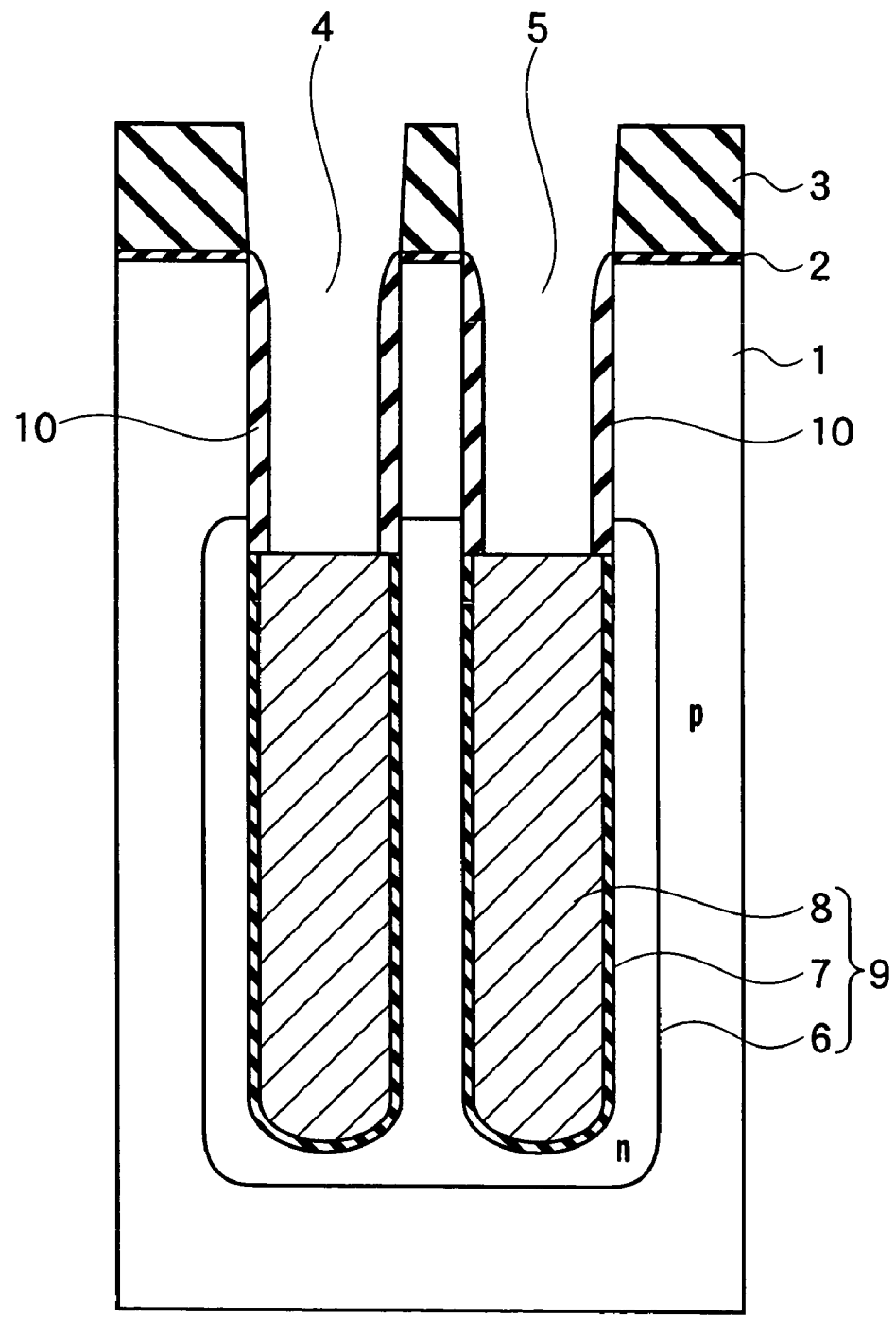

(d) As shown in FIG. 4, a 30 nm-thick collar oxide film 10 is deposited on the sides of the trenches 4 and 5 in the semiconductor substrate 1 through CVD. As shown in FIG. 5, the collar oxide film 10 is etched using isotropic dry etching techniques. The collar oxide film 10 remains on the sides of the trenches 4 and 5, but is removed from the sides of the pad nitride films 3. This is because the sides of the pad nitride films 3 in the trenches 4 and 5 are more forward tapered than the sides of the semiconductor substrate 1.

Figure 6:
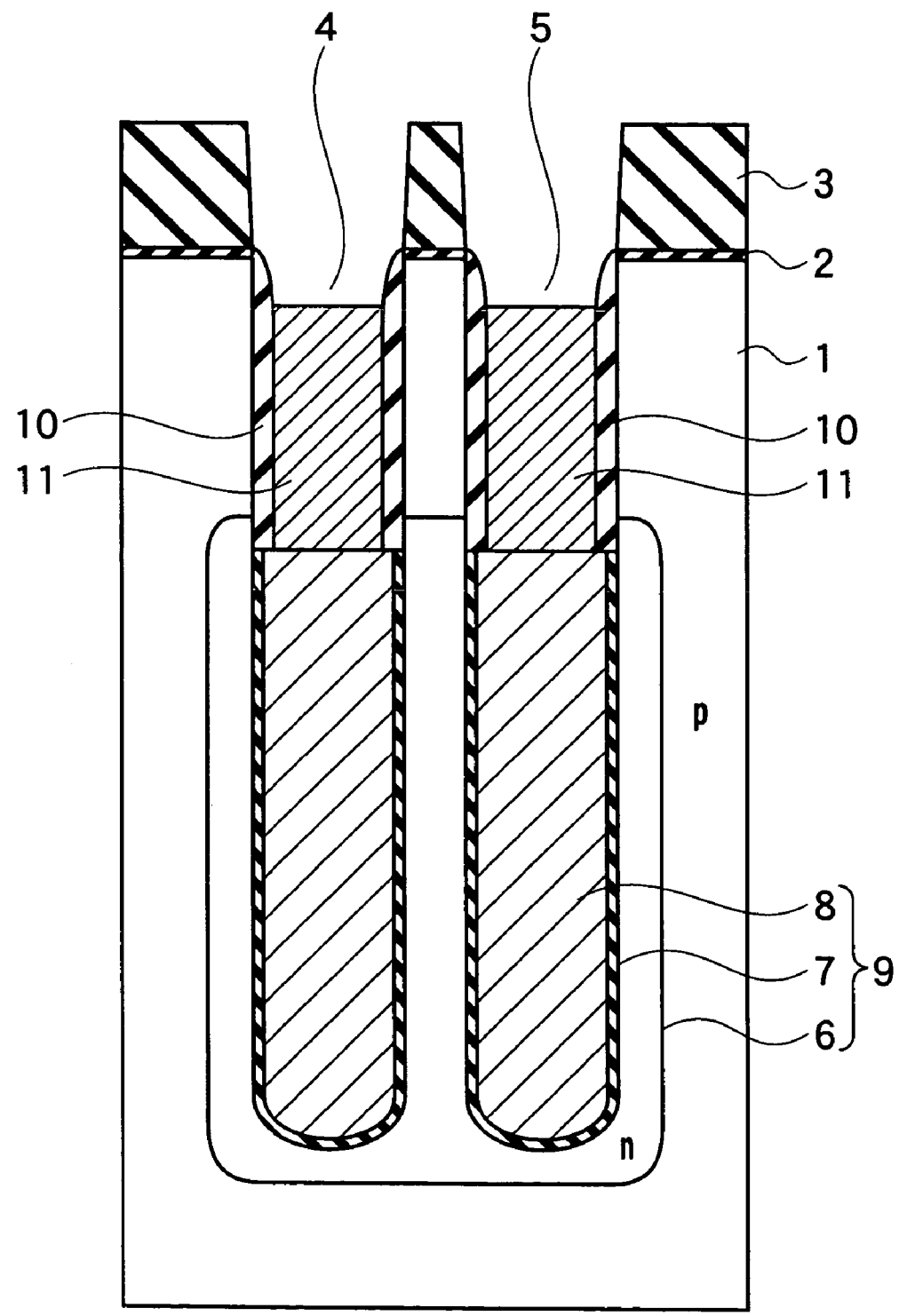

(e) Phosphorous-doped polysilicon films are deposited in the trenches 4 and 5. The storage nodes 11 are embedded in the trenches 4 and 5. As shown in FIG. 6, the storage nodes 11 are etched back to an appropriate depth of at least approximately 150 nm.

Figure 7:
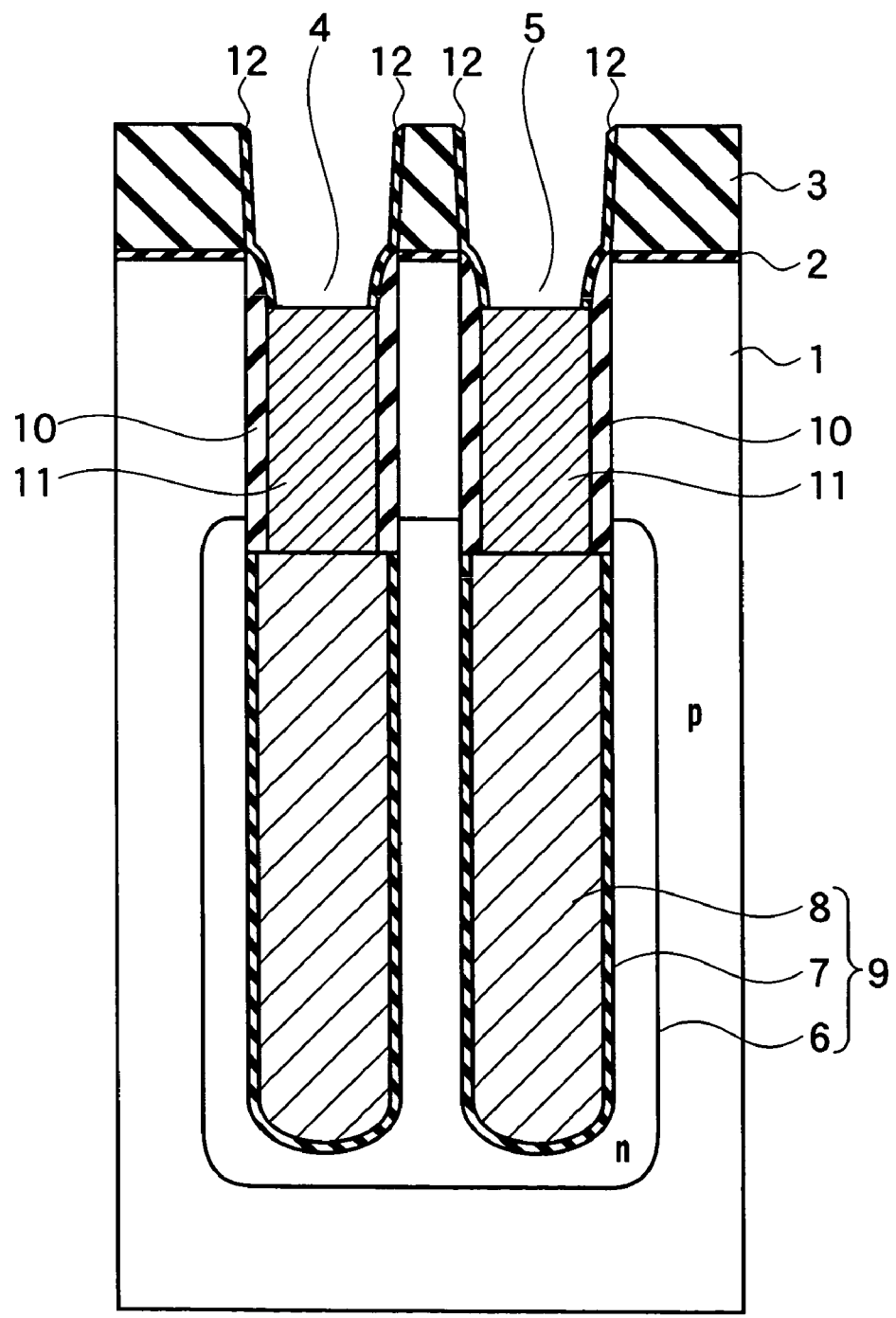

(f) A silicon nitride film, which becomes spacers 12, is deposited through CVD. The silicon nitride film is etched back. As shown in FIG. 7, the spacers 12 remain upon the collar oxide films 10 on the sides of the source regions 15 and the pad nitride films 3.

Figure 8:
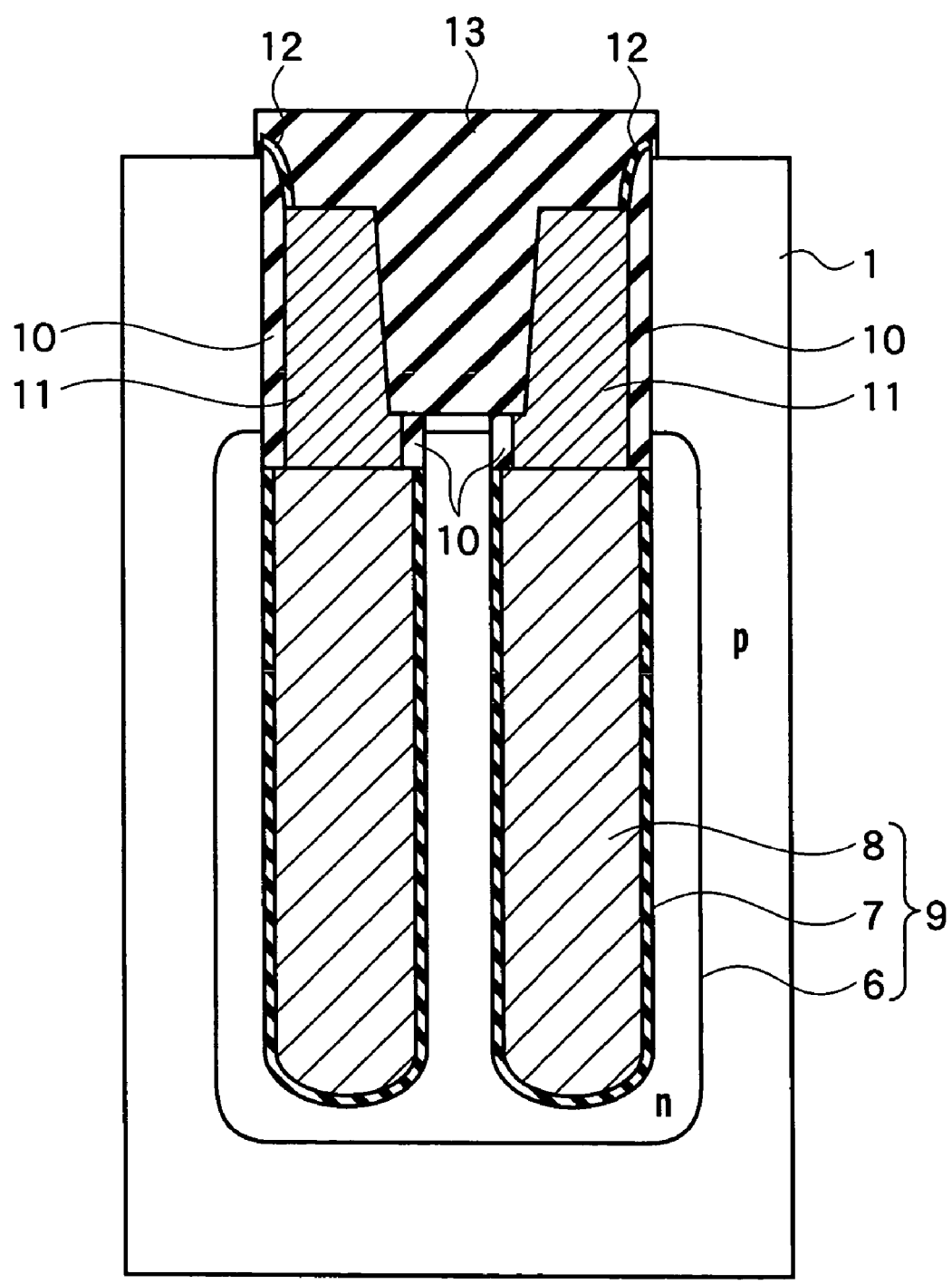
Figure 9:
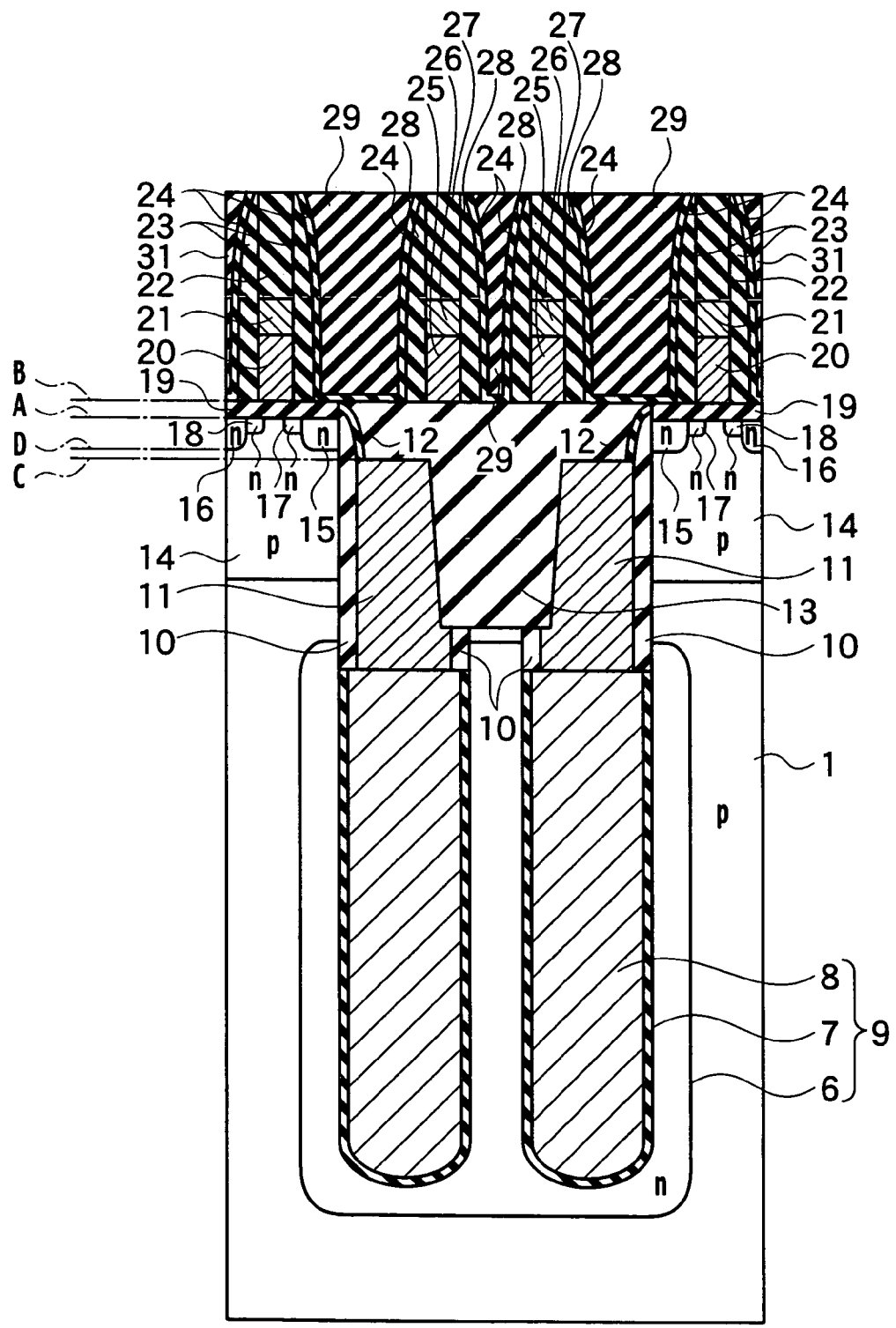

(g) As shown in FIG. 8, the STI and the trench top oxide (TTO) 13 are formed, establishing active areas for the select transistors 15 through 23. As shown in FIG. 9, the p-wells 14, the select transistors 15 through 23, and the gate interconnects 25 through 28 are formed. The barrier nitride films 24 are deposited through CVD. A BPSG film is deposited as the interlayer insulator films 29 upon the barrier nitride films 24 through CVD. The BPSG film is removed through CMP until the height of the tops of the silicon nitride films 22 and 27 is reached.

Figure 10:
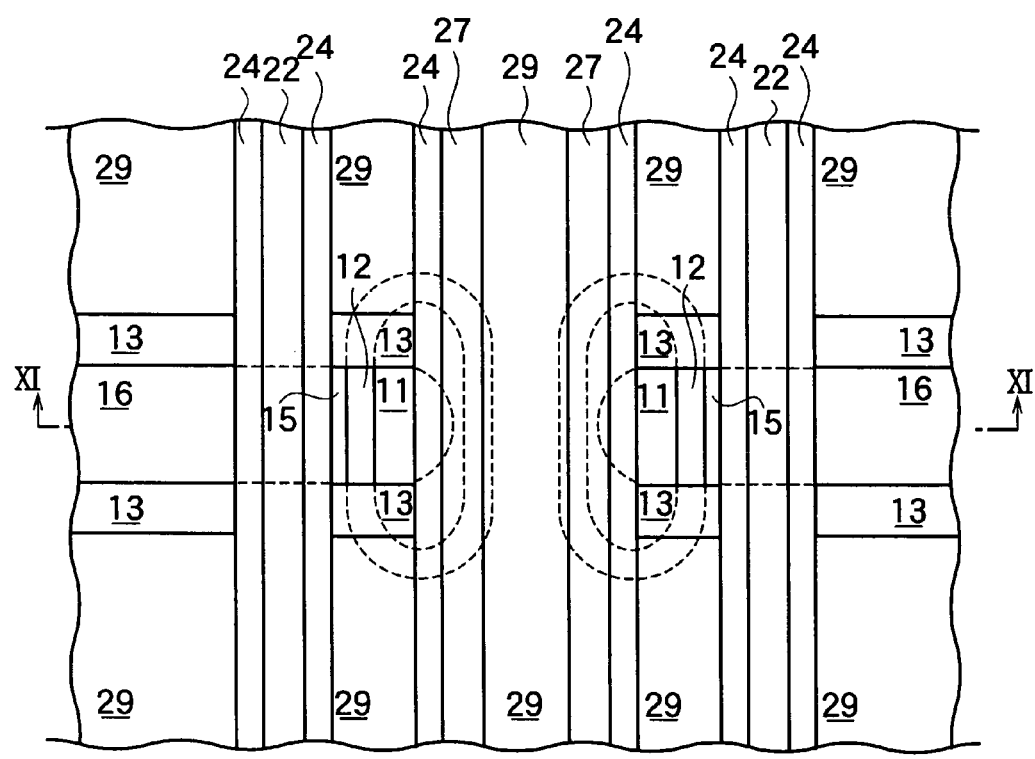
FIG. 10 is a top view of the semiconductor device according to the first embodiment in the course of fabrication.
Figure 11:
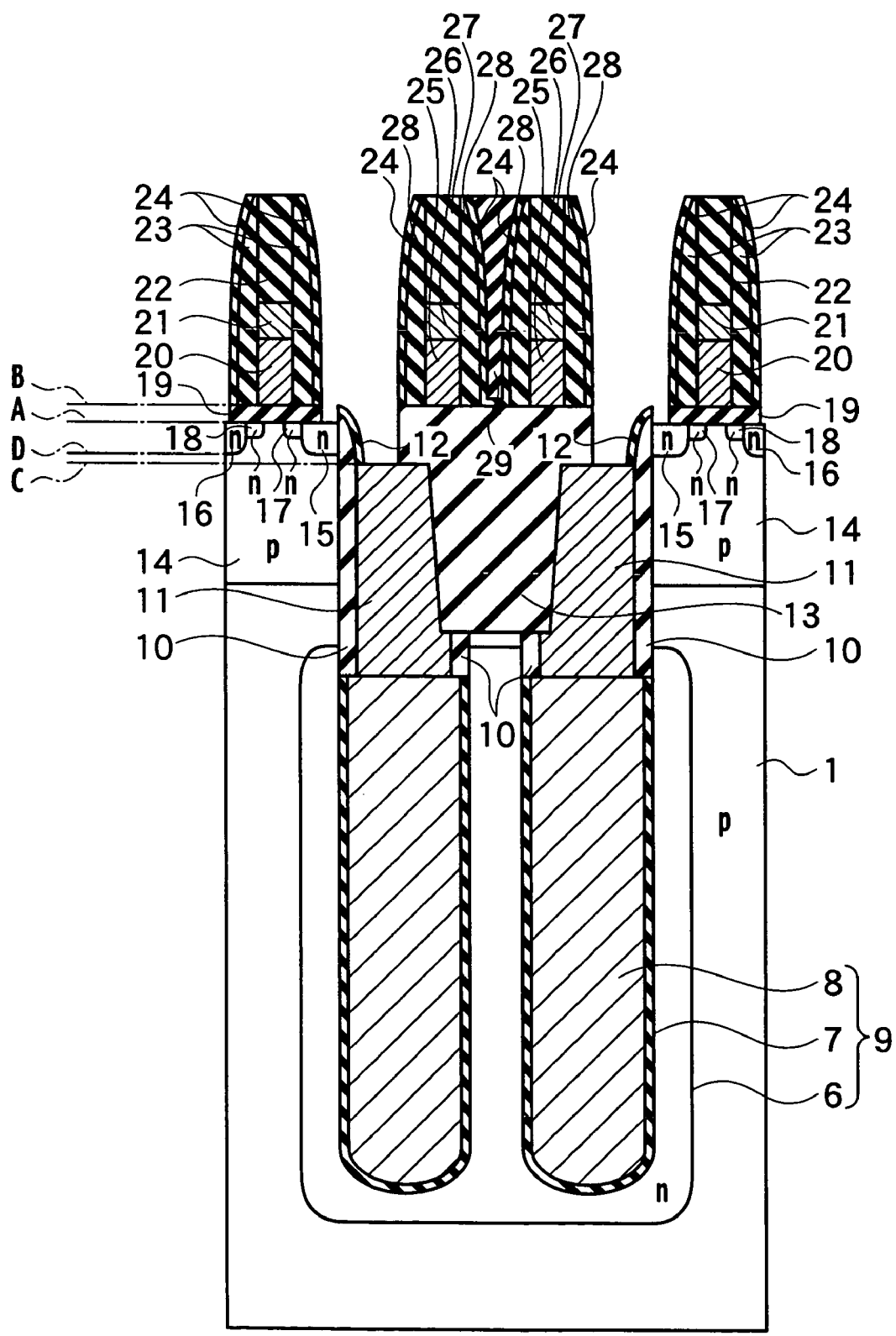
FIG. 11 is a cross-sectional diagram of the semiconductor device, according to the first embodiment in the course of fabrication, cut along the line XI-XI of FIG. 10.

(h) As shown in FIGS. 10 and 11, the BPSG film 29, the barrier nitride films, and the TTO of the STI 13 in areas which become the SS contacts 30 and the pullout electrodes 31 are etched using dry etching techniques such as RIE. The source regions 15, the spacers 12, and the storage nodes 11 are exposed. The collar oxide films 10 are not etched since the spacers 12 act as protective films. Accordingly, the sides of the source regions 15 and the p-wells 14 are not exposed.

Figure 12:
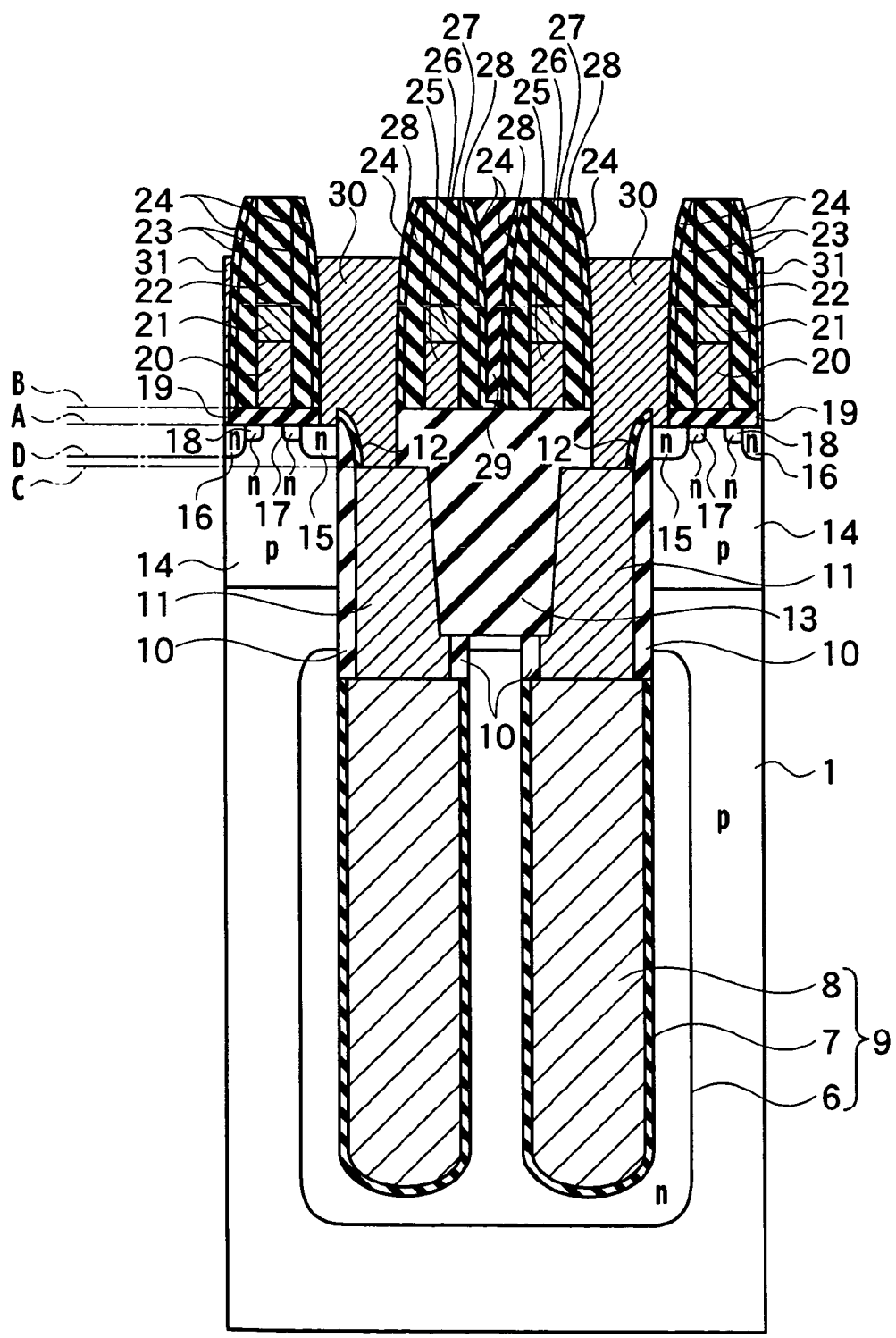
FIG. 12 is a cross-sectional diagram of the semiconductor device according to the first embodiment in the course of fabrication.

(i) Before deposition of the SS contacts 30 and the pullout electrodes 31, the natural oxide film formed on the surface of the source regions 15 and the storage nodes 11 is removed using hydrofluoric acid (HF) as an etchant. During this removal, the collar oxide films 10 are not etched. An arsenic-doped polysilicon film is deposited so as to form the SS contacts 30 and the pullout electrodes 31. The SS contacts 30 are not in contact with the sides of the source regions 15 and the p-wells 14. As shown in FIG. 12, the SS contacts 30 and the pullout electrodes 31 are etched back and separated.

(j) As shown in FIGS. 1 and 2, the BPSG film 32 and the NSG film 33 are deposited. Contact holes are formed on the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, a semiconductor device, according to the first embodiment, allowing small areas of the source regions on the semiconductor substrate can be provided. Also according to the first embodiment, a fabrication method for the semiconductor device allowing small areas of the source regions on the semiconductor substrate can be provided.

SECOND EMBODIMENT

Figure 13:
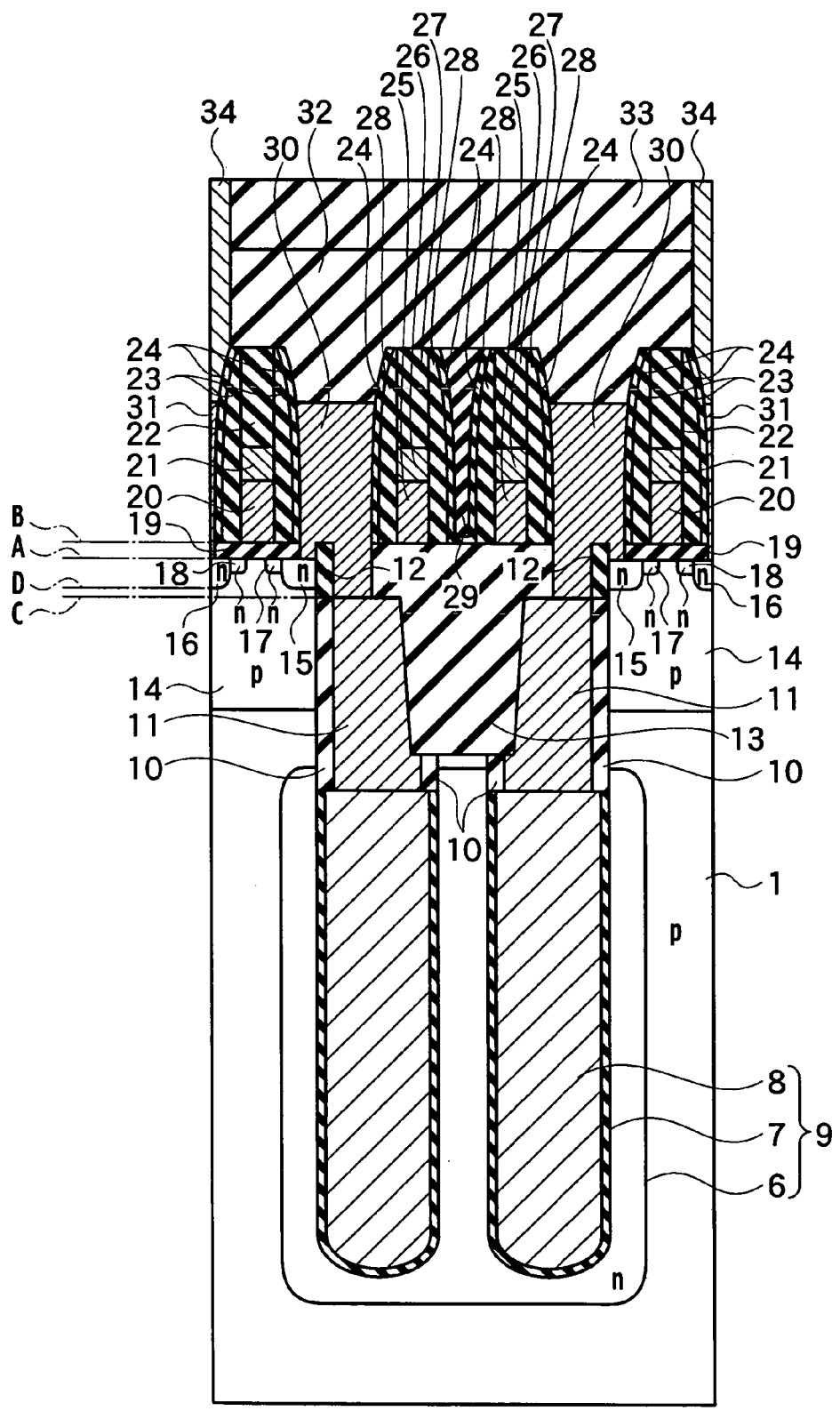
FIG. 13 is a cross-sectional diagram of a semiconductor device according to a second embodiment cut along the line II-II of FIG. 1.

With a semiconductor device according to a second embodiment of the present invention, a top view is represented by FIG. 1 as with the first embodiment, and a cross section is represented by FIG. 13. The difference with the semiconductor device of the second embodiment from the semiconductor device of the first embodiment is the structure around the spacers 12.

With the first and the second embodiment, the spacers 12 are arranged upon the collar oxide films 10; however, the difference with the second embodiment is that the top ends of the collar oxide films 10 are parallel to the surface (surface A) of the semiconductor substrate 1.

With the first and the second embodiment, the spacers 12 are arranged laterally to the collar oxide film 15 side; however, the difference with the second embodiment is that the sides of the spacers 12 are in contact with the sides of the source regions 15.

With the first embodiment, it is found that the film thickness of the spacers 12 provides etching resistance for the collar oxide films 10 as protective films. With the second embodiment, it is found that the film thickness of the spacers 12 is equal to or greater than that of the collar oxide films 10, so as to cover the collar oxide films 10. Note that with the second embodiment, when the film thickness of the spacers 12 is thinner than that of the collar oxide films 10, a part of the collar oxide films becomes thinner. However, the sides of the source regions 15 are not in contact with the SS contacts 30.

A semiconductor device fabrication method according to the second embodiment is described forthwith. The semiconductor device fabrication method according to the second embodiment uses some of the same steps (a) through (c) as with the semiconductor device fabrication method according to the first embodiment.

Figure 14:
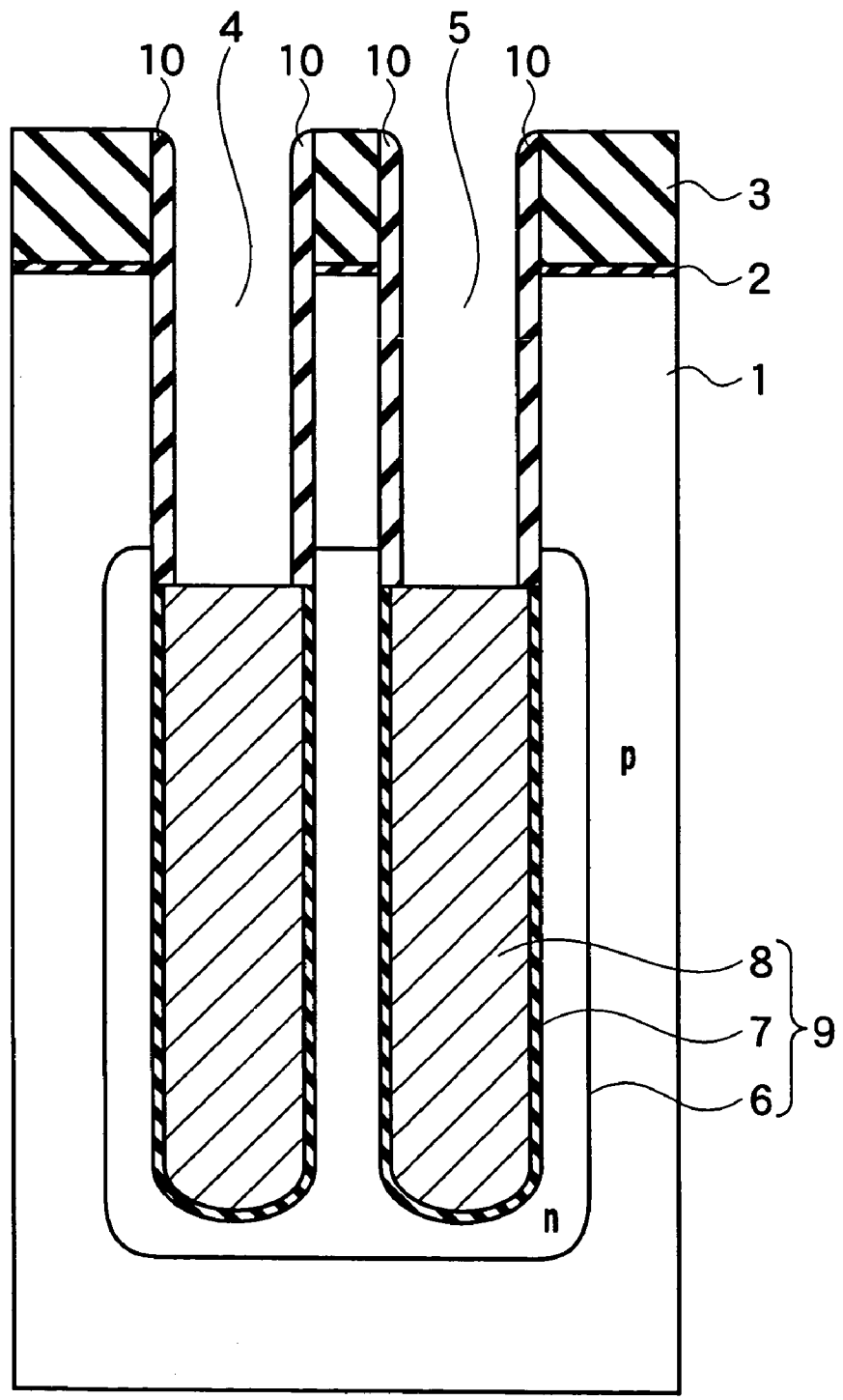
FIGS. 14 through 18 are cross-sectional diagrams of the semiconductor device according to the second embodiment in the course of fabrication.

(a) As shown in FIG. 4, a 30 nm-thick collar oxide film 10 is deposited on the sides of the trenches 4 and 5 in the semiconductor substrate 1 through CVD. As shown in FIG. 14, the collar oxide film 10 is etched using isotropic dry etching techniques. The collar oxide film 10 remains on the sides of the trenches 4 and 5, but is removed from the sides of the pad nitride films 3. This is because the sides of the pad nitride films 3 in the trenches 4 and 5 are tapered in the same way as the sides of the semiconductor substrate 1.

Figure 15:
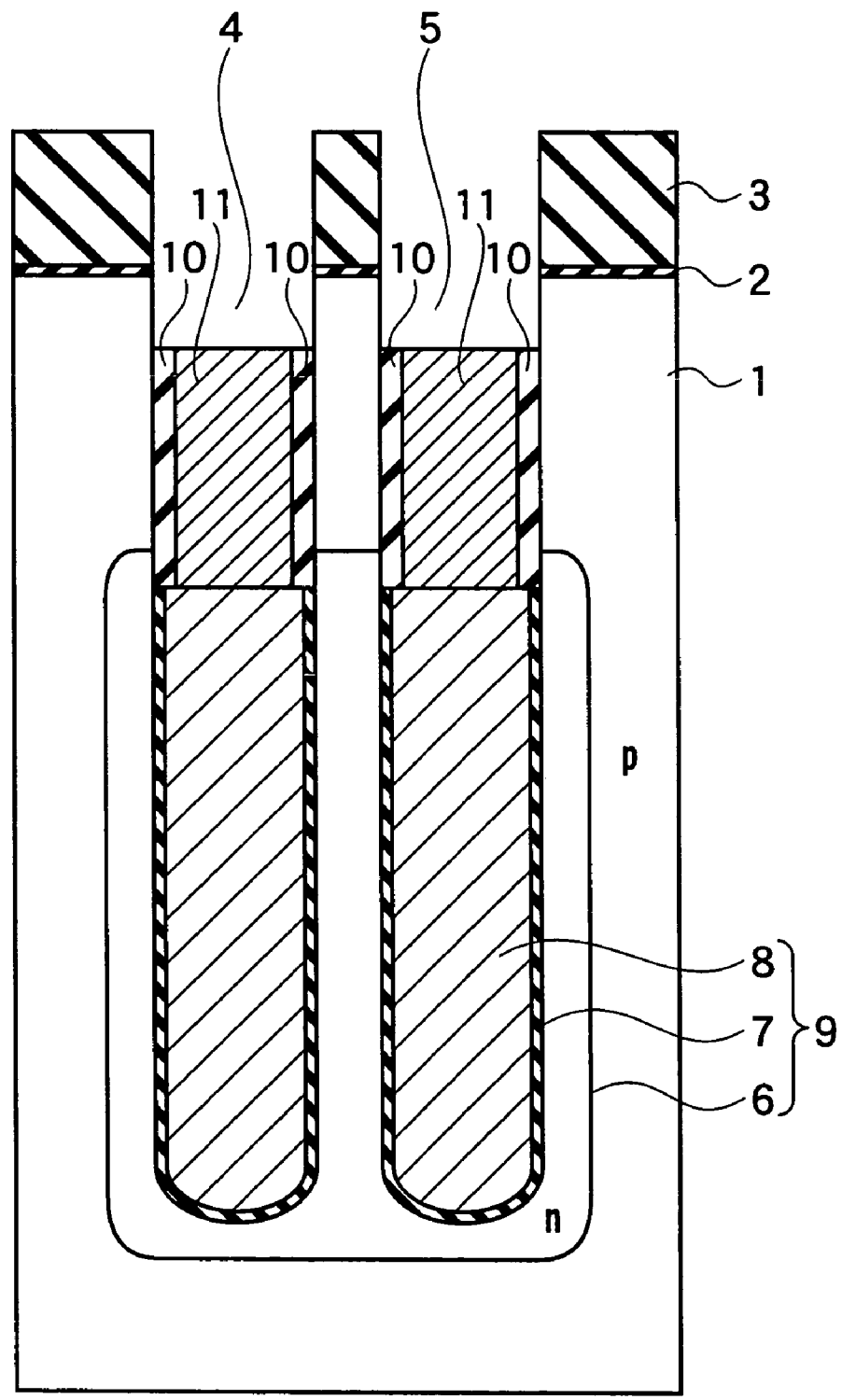

(b) A phosphorous-doped polysilicon film is deposited in the trenches 4 and 5. The storage nodes 11 are embedded in the trenches 4 and 5. The storage nodes 11 are etched back to an appropriate depth of at least approximately 150 nm. As shown in FIG. 15, the collar oxide film 10 is etched using the storage nodes 11 as a mask.

Figure 16:
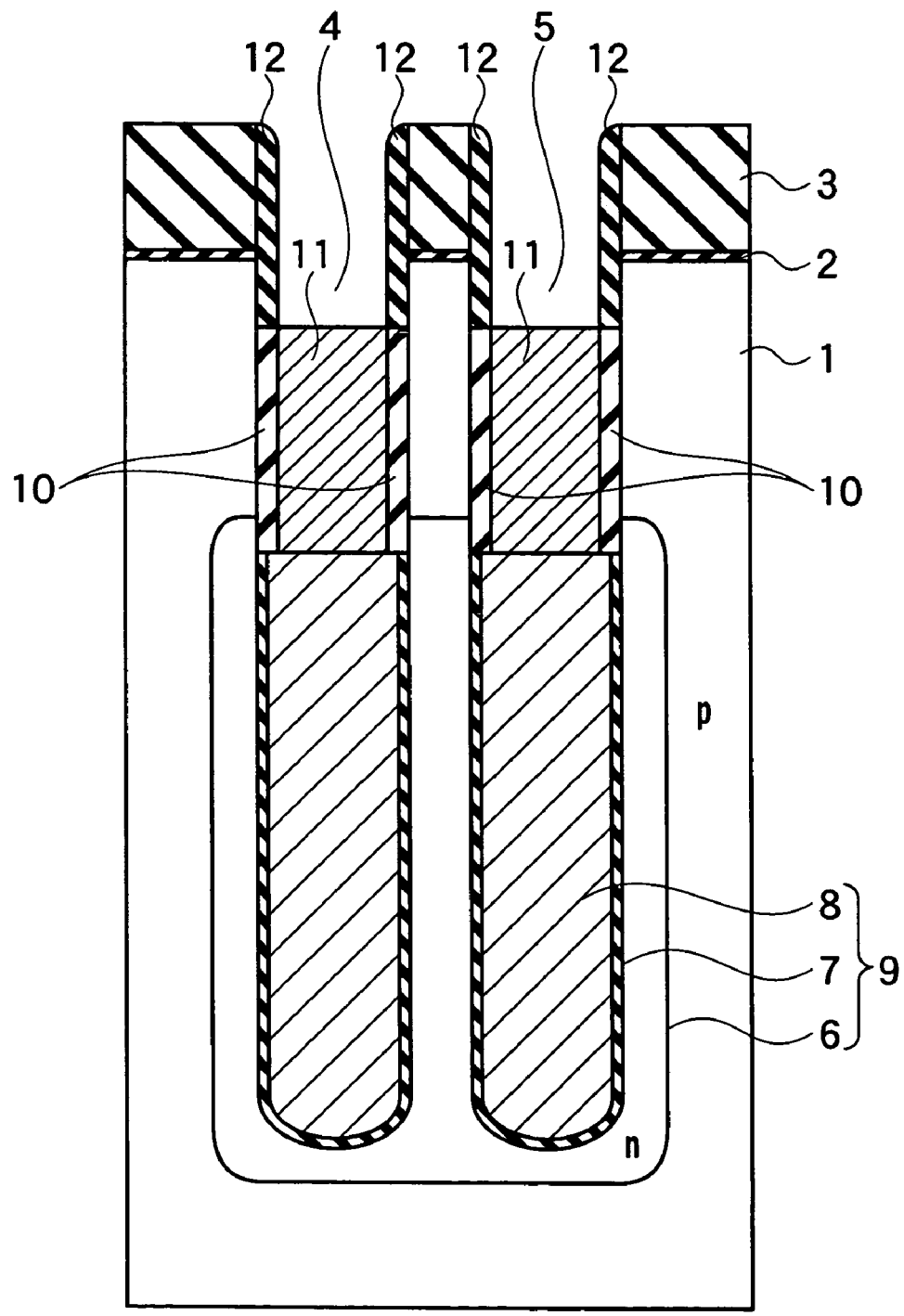

(c) A silicon nitride film, which becomes the spacers 12, is deposited through CVD. The thickness of the silicon nitride film is thicker than that of the collar oxide film 10. The silicon nitride film is etched back. As shown in FIG. 16, the spacers 12 cover the sides of the source regions 15 and the tops of the collar oxide films 10. The sides of the source regions 15 and the tops of the collar oxide films 10 are not exposed.

Figure 17:
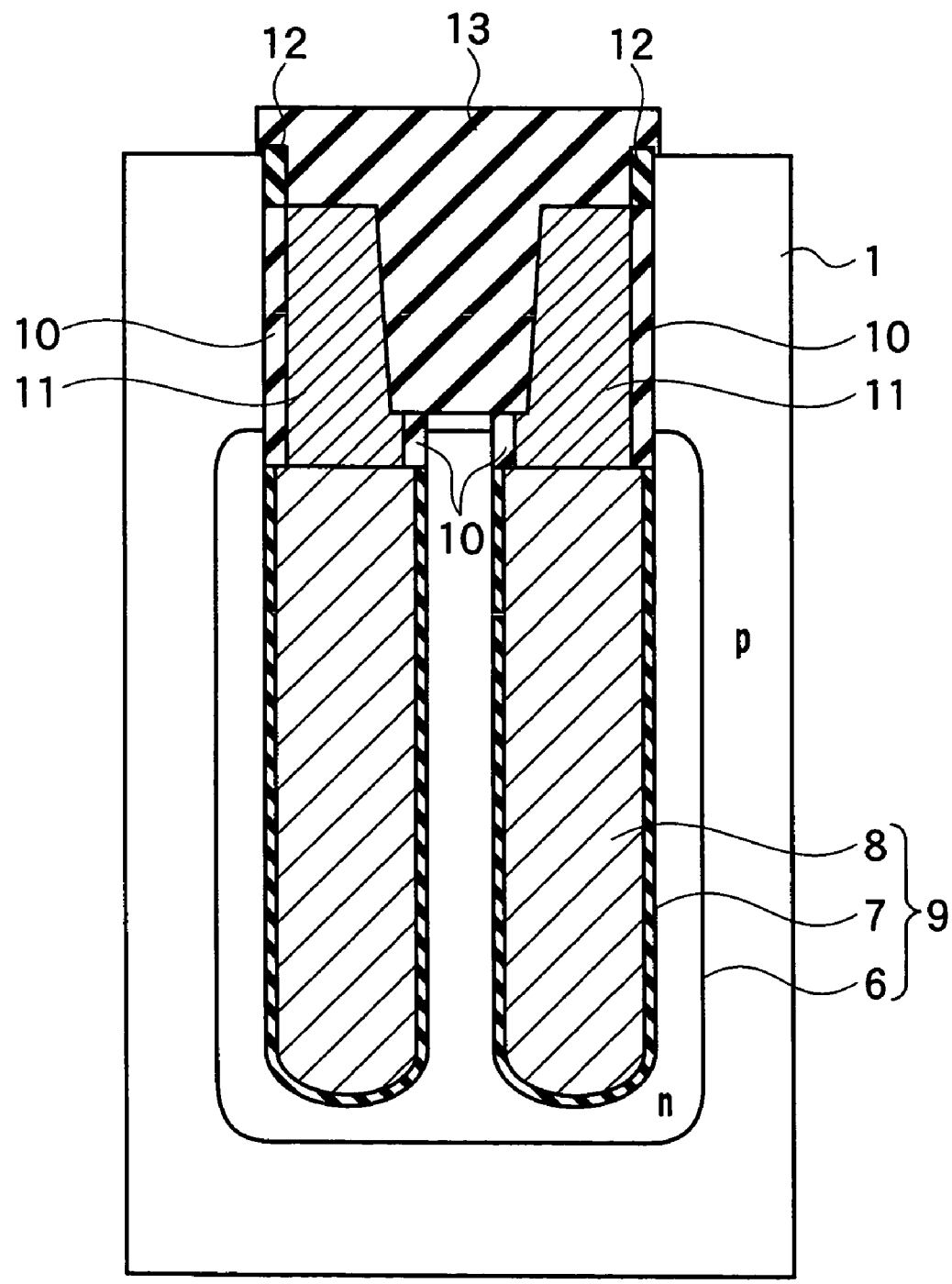
Figure 18:
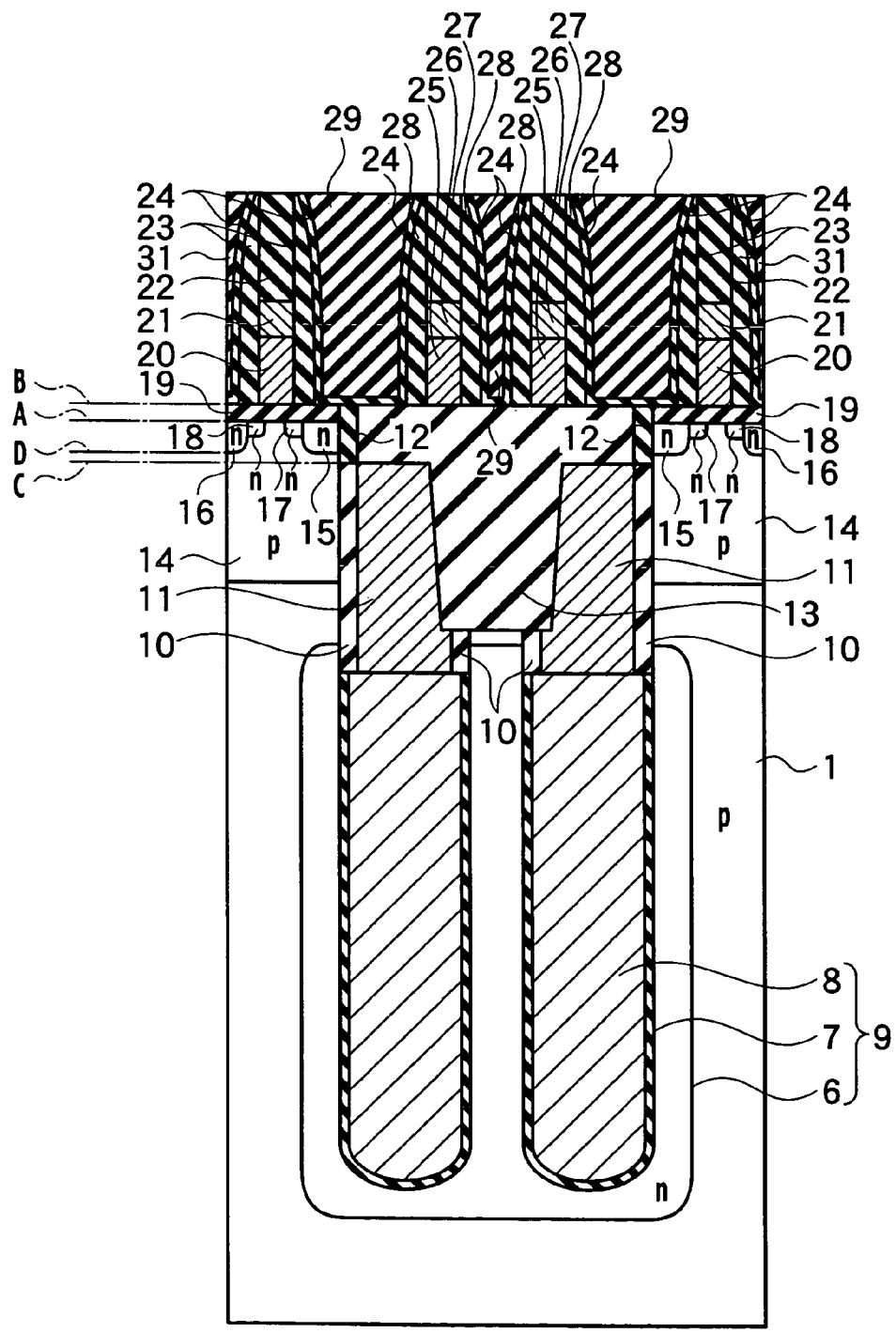

(d) As shown in FIG. 17, the STI and the trench top oxide (TTO) 13 are formed, establishing active areas for the select transistors 15 through 23. As shown in FIG. 18, the p-wells 14, the select transistors 15 through 23, and the gate interconnects 25 through 28 are formed. A barrier nitride film 24 is deposited through CVD. A BPSG film is deposited as the interlayer insulator films 29 upon the barrier nitride film 24 through CVD. The BPSG film is removed through CMP until the tops of the silicon nitride films 22 and 27 is reached.

Figure 19:
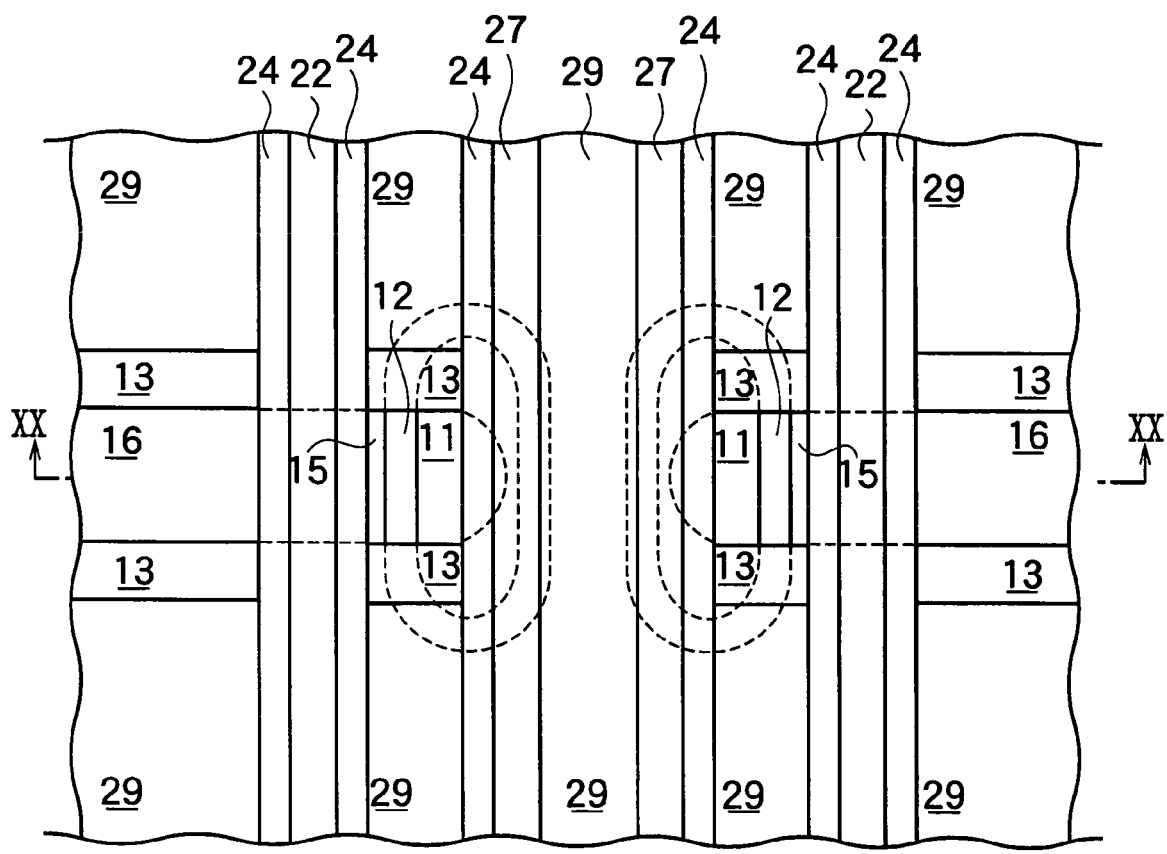
FIG. 19 is a top view of the semiconductor device according to the second embodiment in the course of fabrication.
Figure 20:
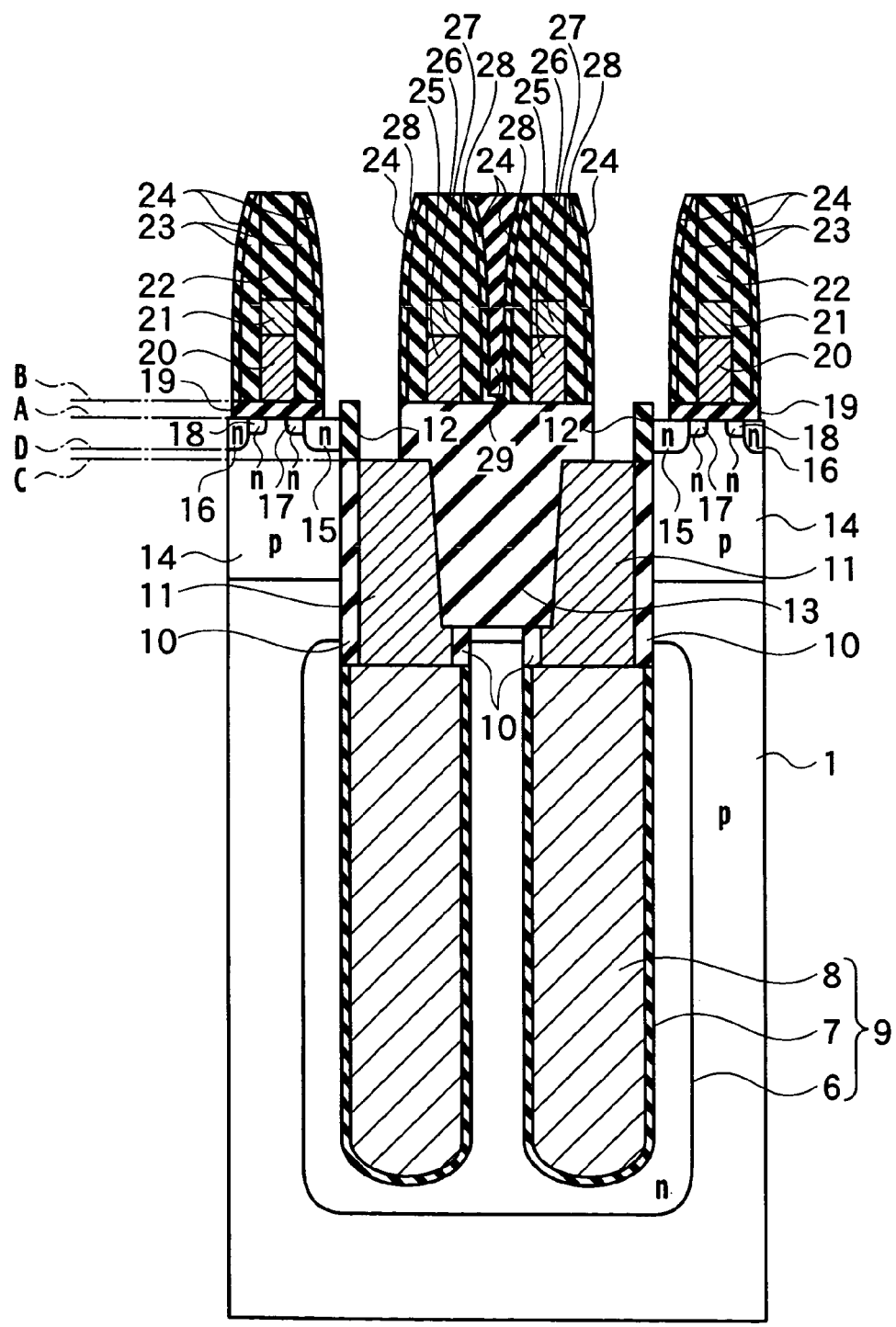
FIG. 20 is a cross-sectional diagram of the semiconductor device, according to the second embodiment in the course of fabrication, cut along the line XX-XX of FIG. 19.

(e) As shown in FIGS. 19 and 20, the BPSG film 29, the barrier nitride films 24, and the TTO of the STI 13 in areas which become the SS contacts 30 and the pullout electrodes 31 are etched using dry etching techniques such as RIE. The source regions 15, the spacers 12, and the storage nodes 11 are exposed. Since the spacers 12 are not etched, the collar oxide films 10 are not etched or exposed. Accordingly, the sides of the source regions 15 and the p-wells 14 are not exposed.

Figure 21:
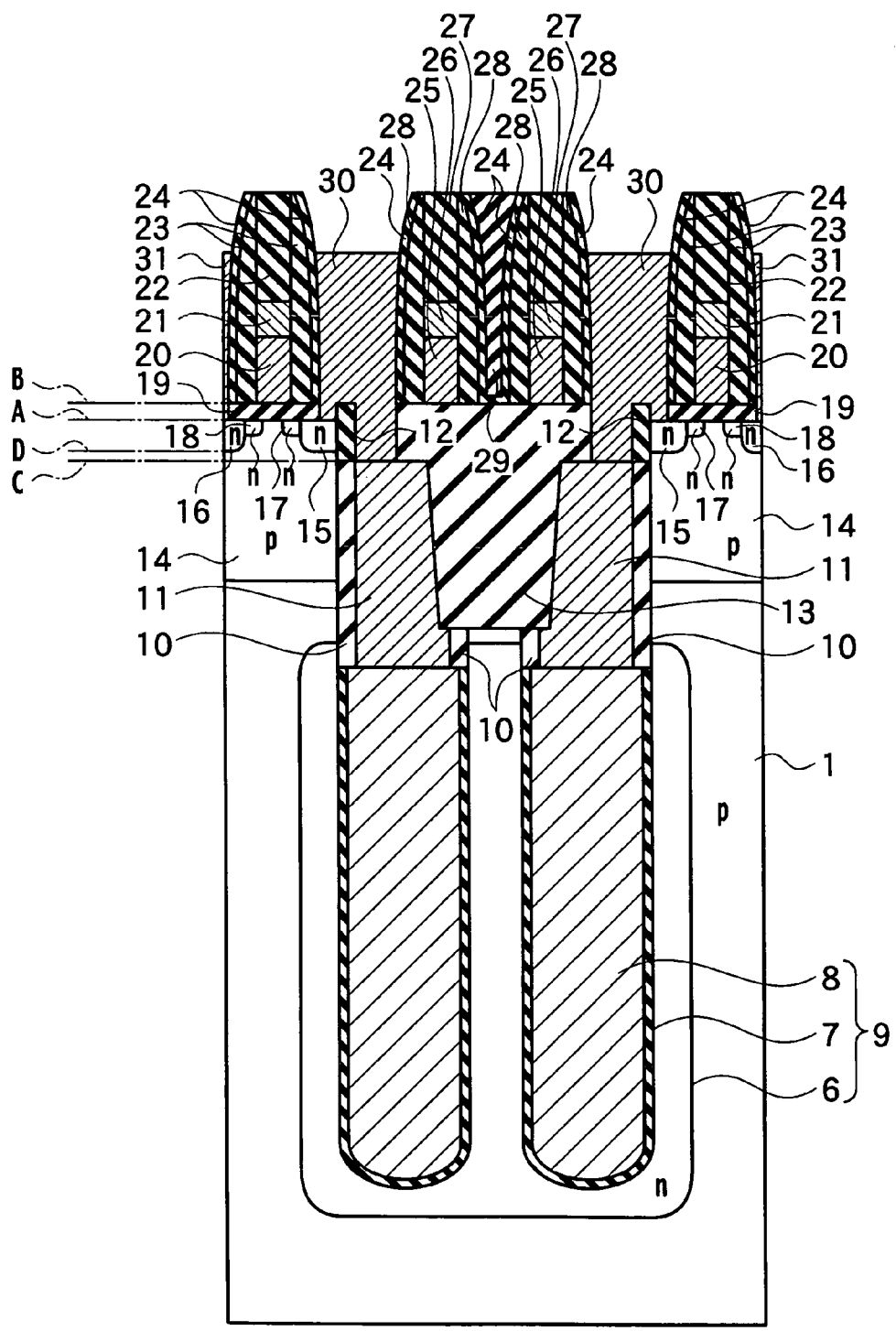
FIG. 21 is a cross-sectional diagram of the semiconductor device according to the second embodiment in the course of fabrication.

(f) Before deposition of the SS contacts 30 and the pullout electrodes 31, natural oxide films formed on the surface of the source regions 15 and the storage nodes 11 are removed. During this removal, the collar oxide films 10 are not etched. An arsenic-doped polysilicon film is deposited so as to form the SS contacts 30 and the pullout electrodes 31. The SS contacts 30 are not in contact with the sides of the source regions 15 and the p-wells 14. As shown in FIG. 21, the SS contacts 30 and the pullout electrodes 31 are etched back and separated.

(g) As shown in FIGS. 1 and 13, the BPSG film 32 and the NSG film 33 are deposited. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the first embodiment, a semiconductor device allowing small areas of the source regions on the semiconductor substrate can be provided. Also according to the second embodiment, a fabrication method for the semiconductor device allowing small areas of the source regions on the semiconductor substrate can be provided.

THIRD EMBODIMENT

Figure 22:
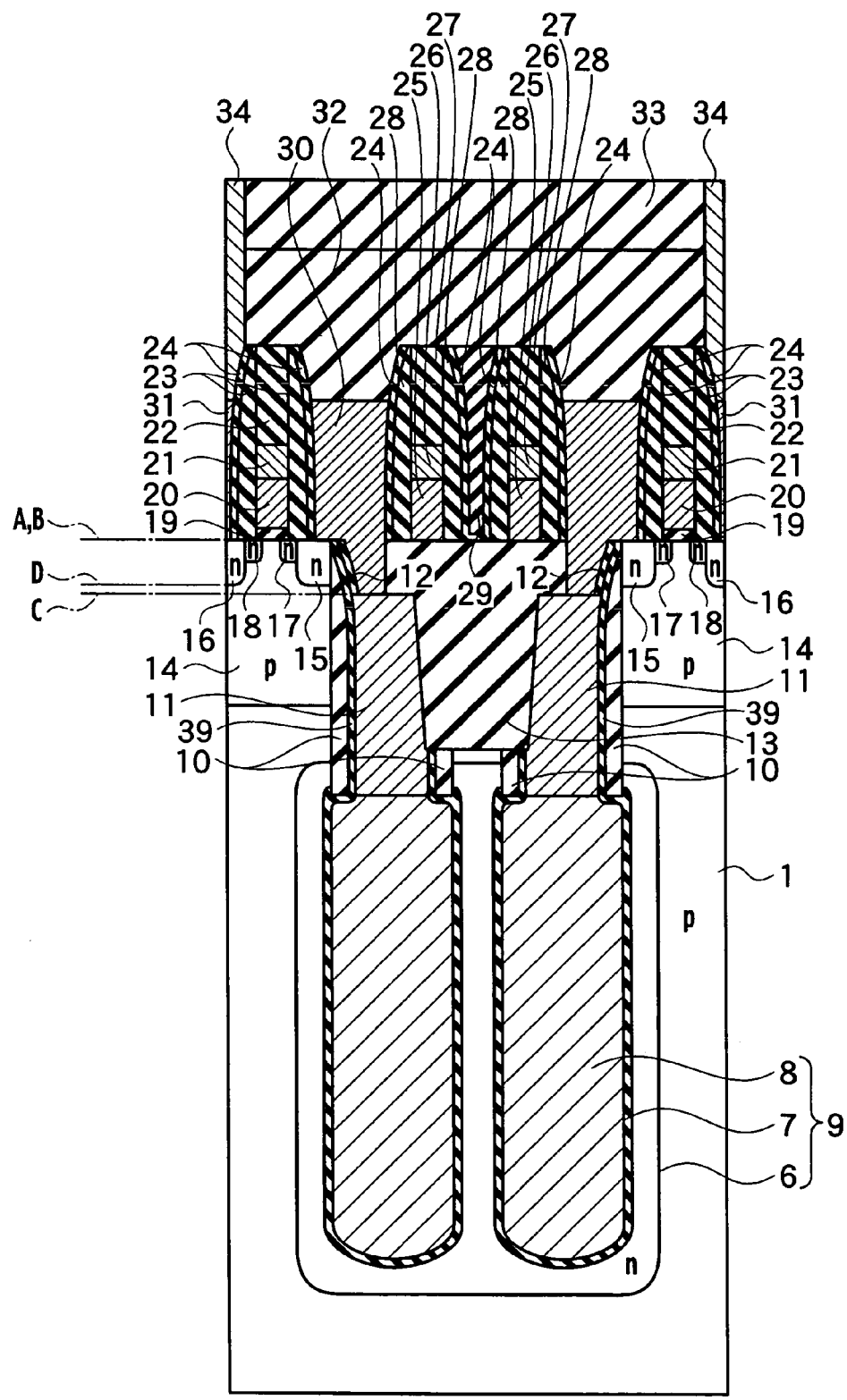
FIG. 22 is a cross-sectional diagram of a semiconductor device according to a third embodiment cut along the line II-II of FIG. 1.

With a semiconductor device according to a third embodiment of the present invention, a top view is represented by FIG. 1 as with the first embodiment, and a cross section is represented by FIG. 22. The difference with the semiconductor device of the third embodiment from the semiconductor device of the first embodiment is the structure of the capacitors 9 and the area around the spacers 12 and the collar oxide films 10.

As with the first and the third embodiment, the capacitors 9 and the collar oxide films 10 are provided; however, a difference with the third embodiment is that the width of the trenches is wider at the capacitors 9 than at the collar oxide films 10. The increased width allows an increase in electrode area in the capacitors 9 and an increase in capacitance of the capacitors.

With the third embodiment, dielectric films 39 arranged between the spacers 12 and the source regions 15 is different from the first embodiment. The dielectric films 39 arranged between the spacers 12 and the collar oxide films 10 are different from the first embodiment. Therefore, the sides of the source regions 15 are not in contact with the SS contacts 30. The dielectric films 39 arranged between the collar oxide films 10 and the storage nodes 11 is also a difference. The dielectric films 39 and the capacitor dielectric films 7 are continuous; therefore there is no interface therebetween.

With the third embodiment, the storage electrodes 8 and the storage nodes 11 are continuous; therefore there is no interface therebetween, which is a difference from the first embodiment. Therefore, there is no resistance at the interface.

A semiconductor device fabrication method according to the third embodiment is described forthwith. The semiconductor device fabrication method according to the third embodiment uses some of the initial same steps (a) and (b) as in the semiconductor device fabrication method according to the first embodiment in FIG. 3.

(a) A 30 nm-thick amorphous silicon film 35 is deposited on the sides of the trenches 4 and 5 through CVD. A silicon oxide film 36 is deposited on the surface of the amorphous silicon film 35 so as to cover it. A silicon nitride film 37 is deposited on the surface of the silicon oxide film 36 so as to cover the silicon oxide film 36.

Figure 23:
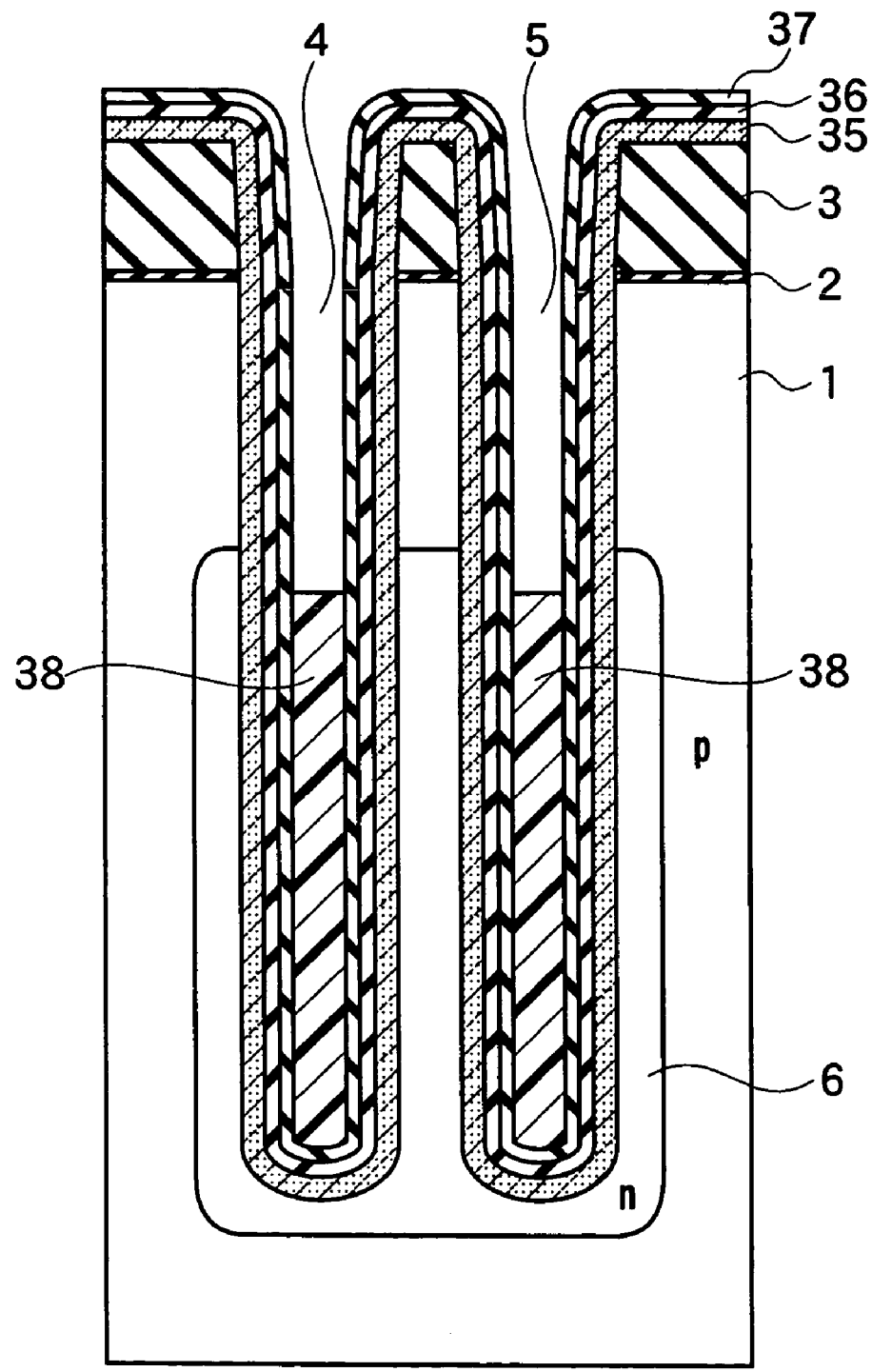
FIGS. 23 through 30 are cross-sectional diagrams of the semiconductor device according to the third embodiment in the course of fabrication.
Figure 24:
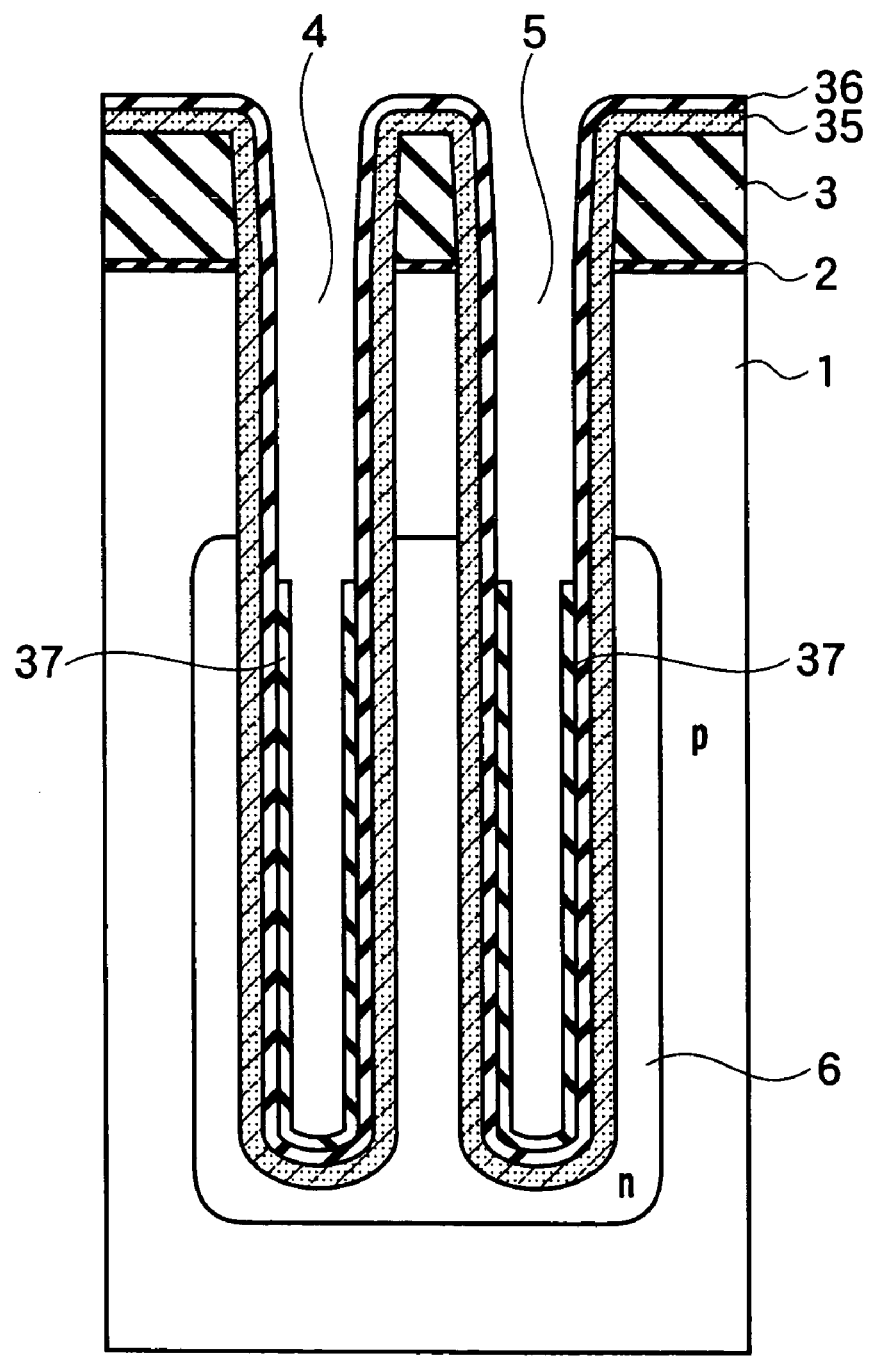

(b) A resist is applied so as to embed resist portions 38 in the lower portions of the trenches 4 and 5. As shown in FIG. 23, the resist portions 38 are etched back to an appropriate depth of approximately 1" m, for example. As shown in FIG. 24, the exposed silicon nitride films 37 are removed through wet etching using the resist portions 38 as a mask and the silicon oxide film 36 as a stopper. The resist portions 38 are removed.

Figure 25:
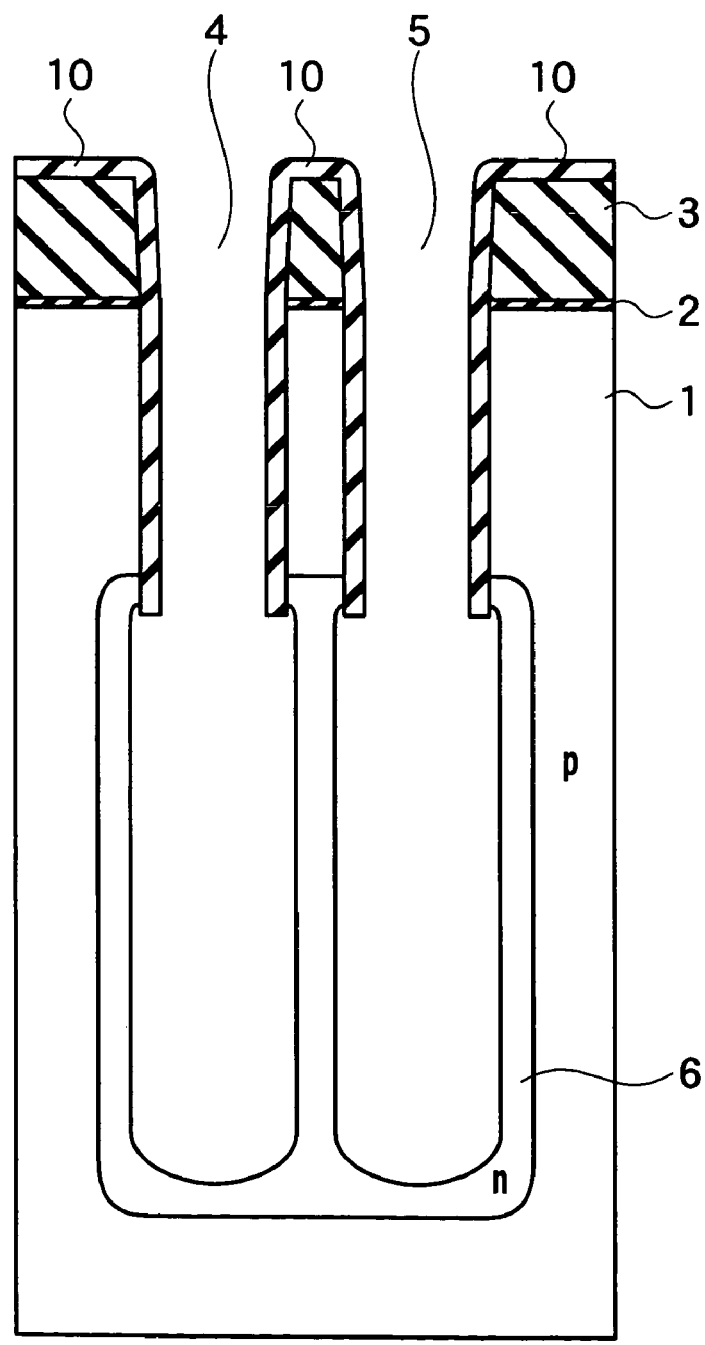

(c) The amorphous silicon film 35 is thermally oxidized using the silicon nitride films 37 as a mask, forming the collar oxide films 10. The thickness of the collar oxide films 10 is approximately 30 nm. Next, the silicon nitride films 37 are completely removed by selectively wet etching the silicon oxide film 36. The silicon oxide film 36 is removed by selectively wet etching the amorphous silicon film 35. As shown in FIG. 25, the amorphous silicon film 35 and the plate electrode 6 are isotropically etched through chemical dry etching (CDE) or the like using the collar oxide films 10 as a mask. This allows an increase in capacity of the trenches 4 and 5, and an increase in surface area of the capacitor dielectric films 7. The capacitance of the capacitors 9 may also be increased.

Figure 26:
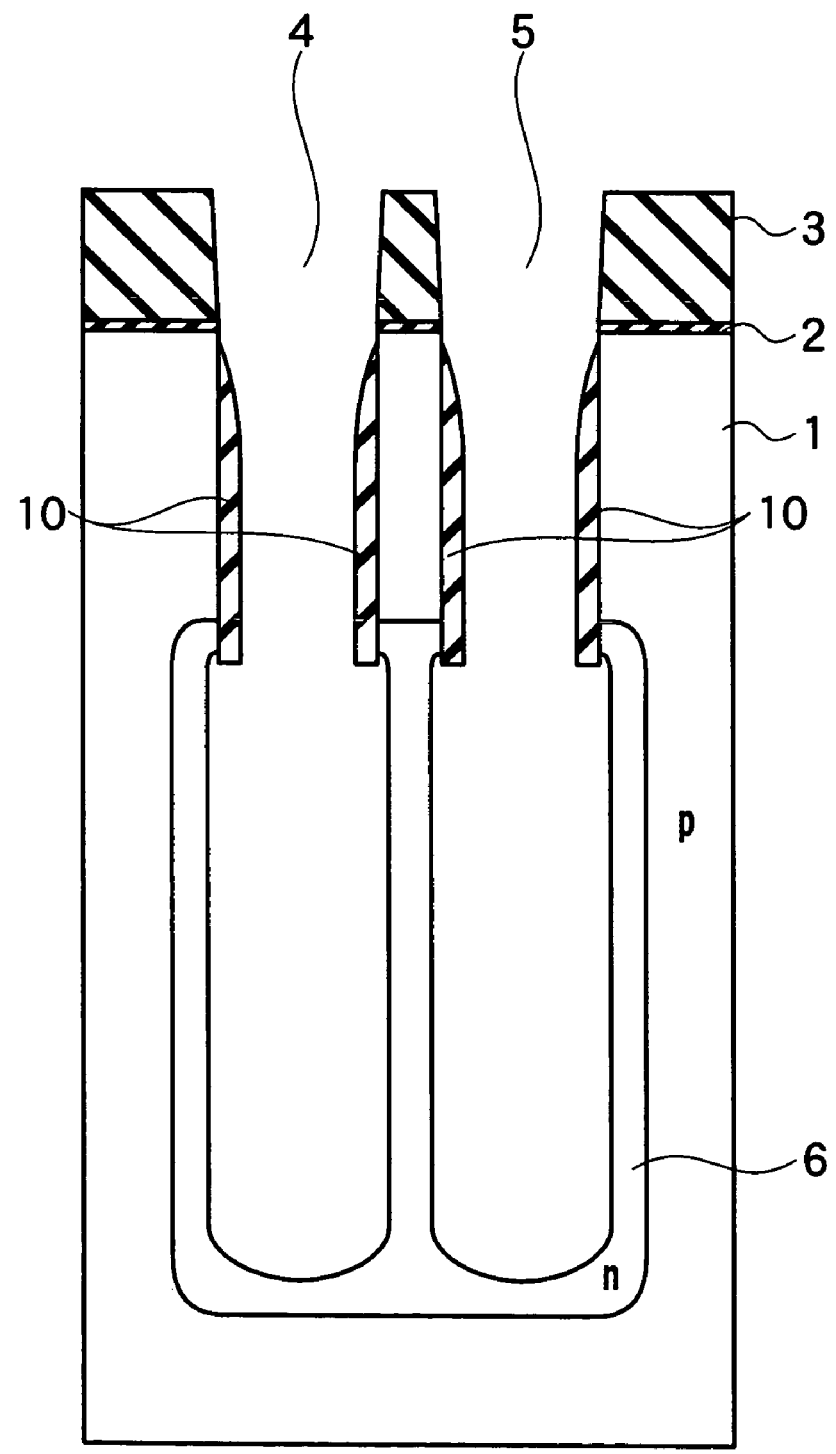

(d) As shown in FIG. 26, the collar oxide films 10 are etched using isotropic dry etching techniques. The collar oxide film 10 remains on the sides of the trenches 4 and 5, but is removed from the sides of the pad nitride films 3. This is because the sides of the pad nitride films 3 in the trenches 4 and 5 are more forwardly tapered than the sides of the semiconductor substrate 1.

Figure 27:
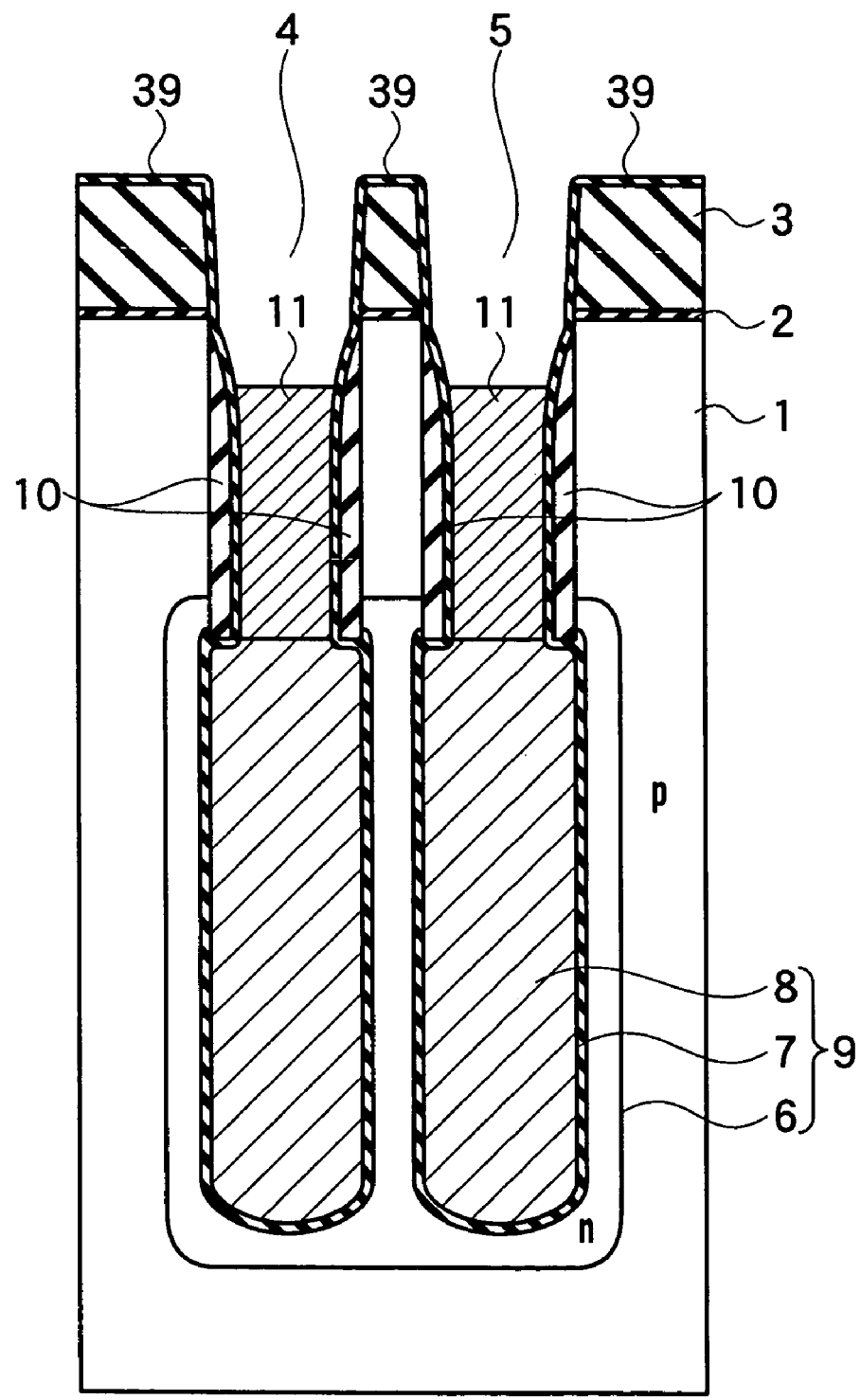

(e) A 2-3 nm-thick capacitor dielectric films 7 and the dielectric films 39 are deposited on the exposed surfaces of the trenches 4 and 5. Since the capacitor dielectric films 7 and the dielectric films 39 are simultaneously deposited, they are continuous, not having interfaces therebetween. A phosphorous-doped amorphous silicon film is deposited, and the storage electrodes 8 and the storage nodes 11 are embedded in the trenches 4 and 5. Since the storage electrodes 8 and the storage nodes 11 are simultaneously embedded, they are continuous, not having interfaces therebetween. This allows reduction in electric resistance between the storage electrodes 8 and the storage nodes 11. As shown in FIG. 27, the storage nodes 11 are etched back to a necessary depth.

Figure 28:
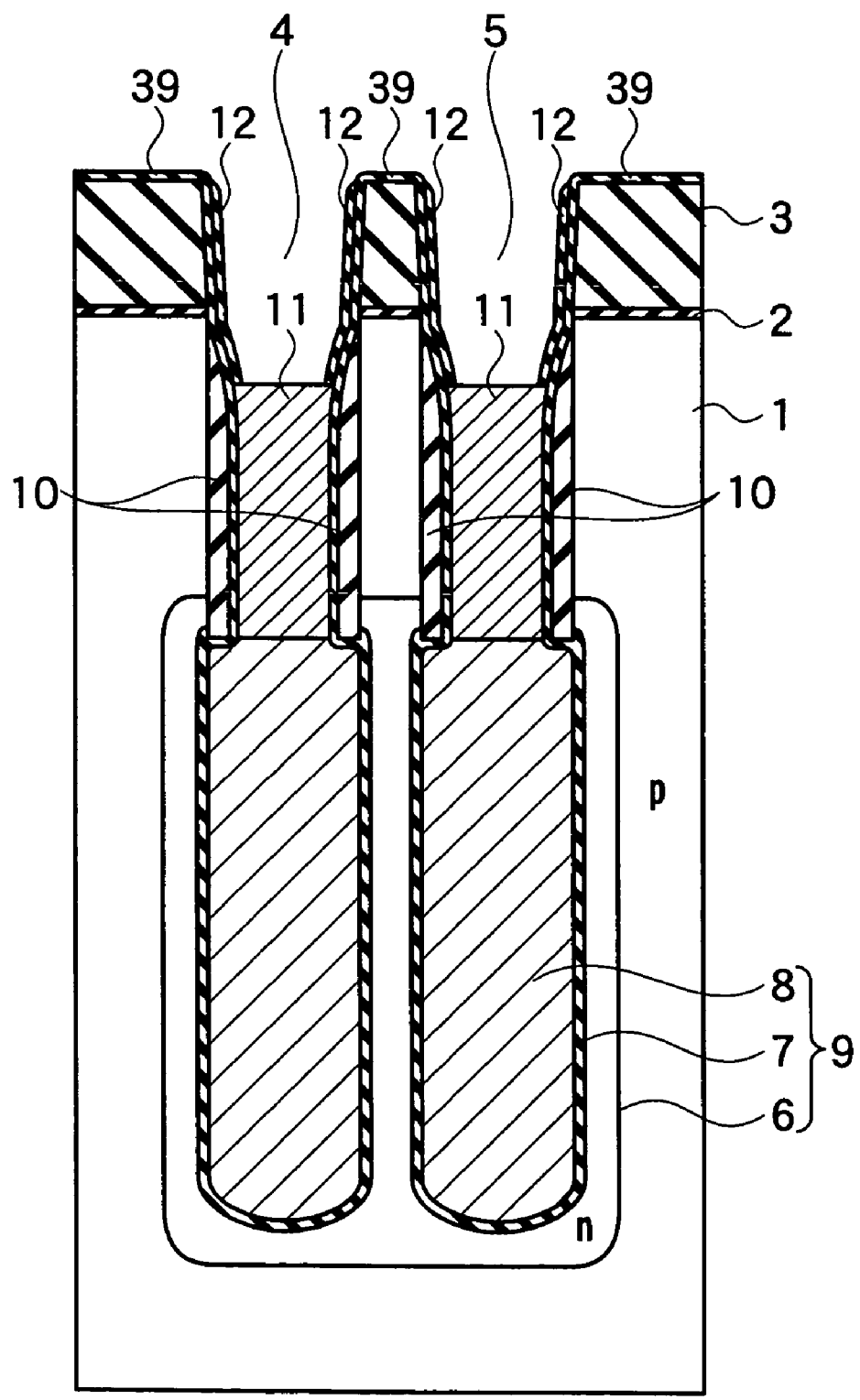

(f) A silicon nitride film, which becomes the spacers 12, is deposited through CVD. The silicon nitride film is etched back. As shown in FIG. 28, the spacers 12 remain upon the dielectric films 39 on the source region 15 side. The spacers 12 also remain on the surface of the dielectric films 39 on the pad nitride film 3 side.

Figure 29:
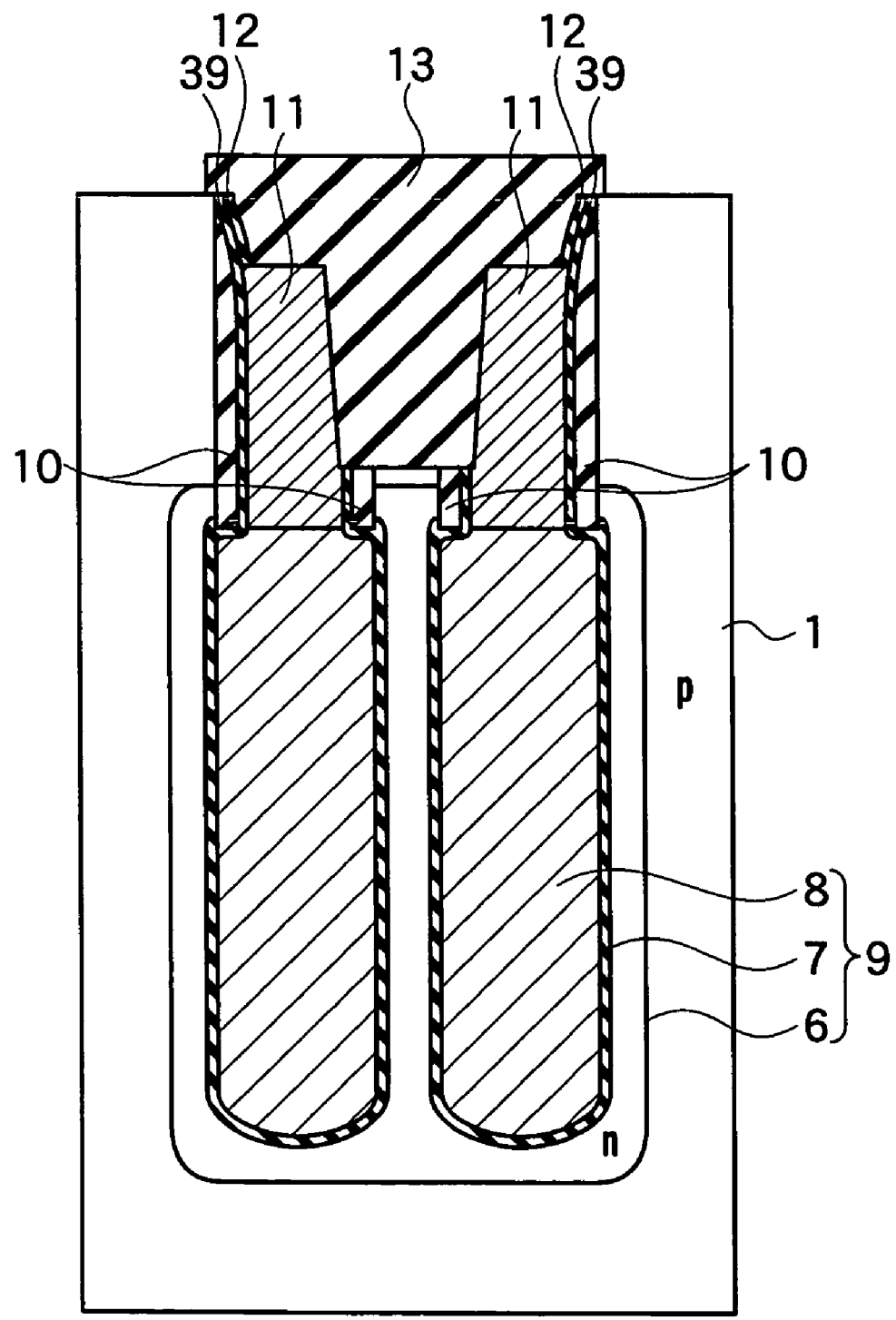
Figure 30:
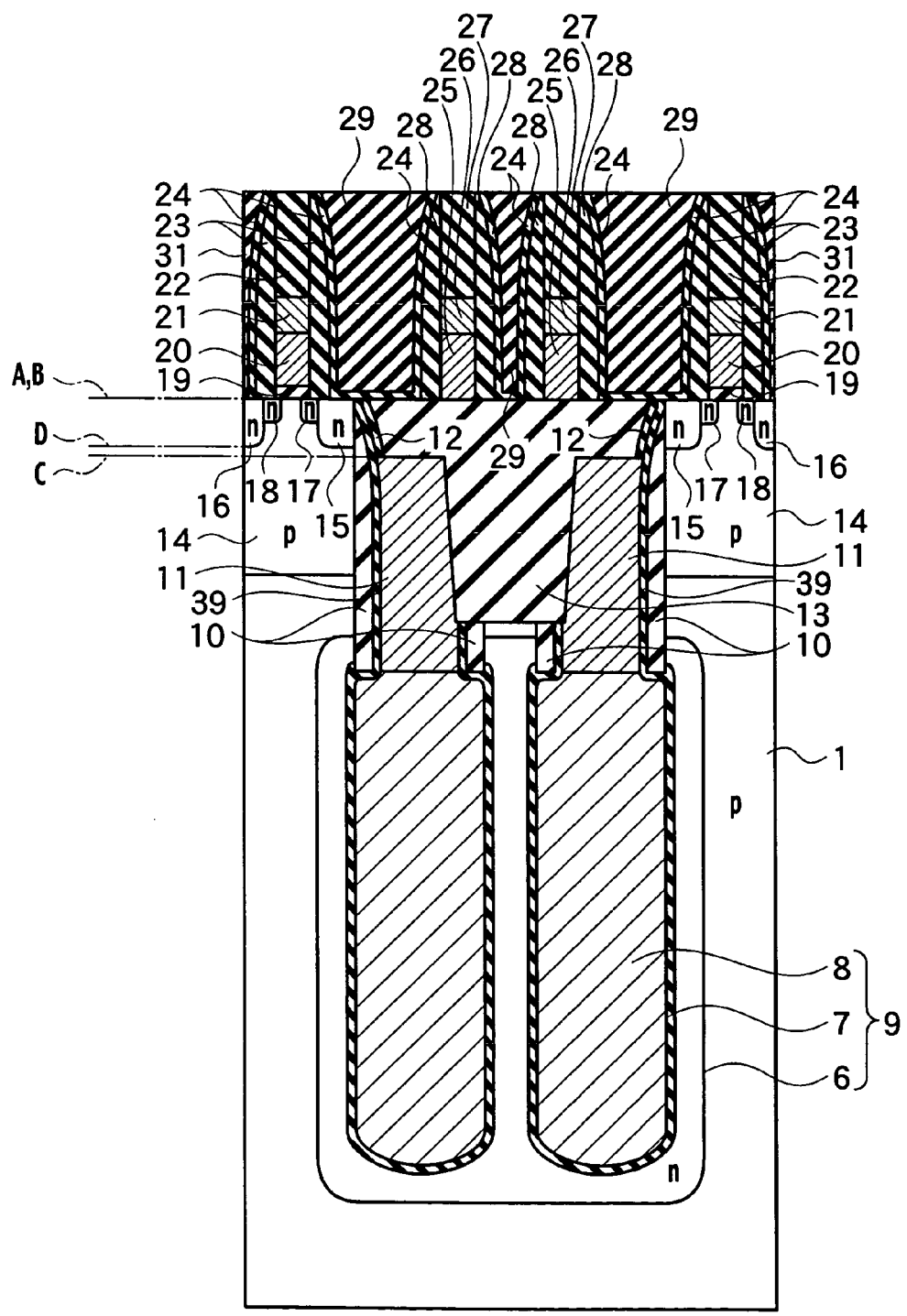

(g) As shown in FIG. 29, the STI and the trench top oxide (TTO) 13 are formed, establishing active areas for the select transistors 15 through 23. As shown in FIG. 30, the p-wells 14, the select transistors 15 through 23, and the gate interconnects 25 through 28 are formed. The barrier nitride films 24 are deposited through CVD. A BPSG film is deposited as the interlayer insulator film 29 upon the barrier nitride film 24 through CVD. The BPSG films are removed through CMP until reaching the height of the tops of the silicon nitride films 22 and 27.

Figure 31:
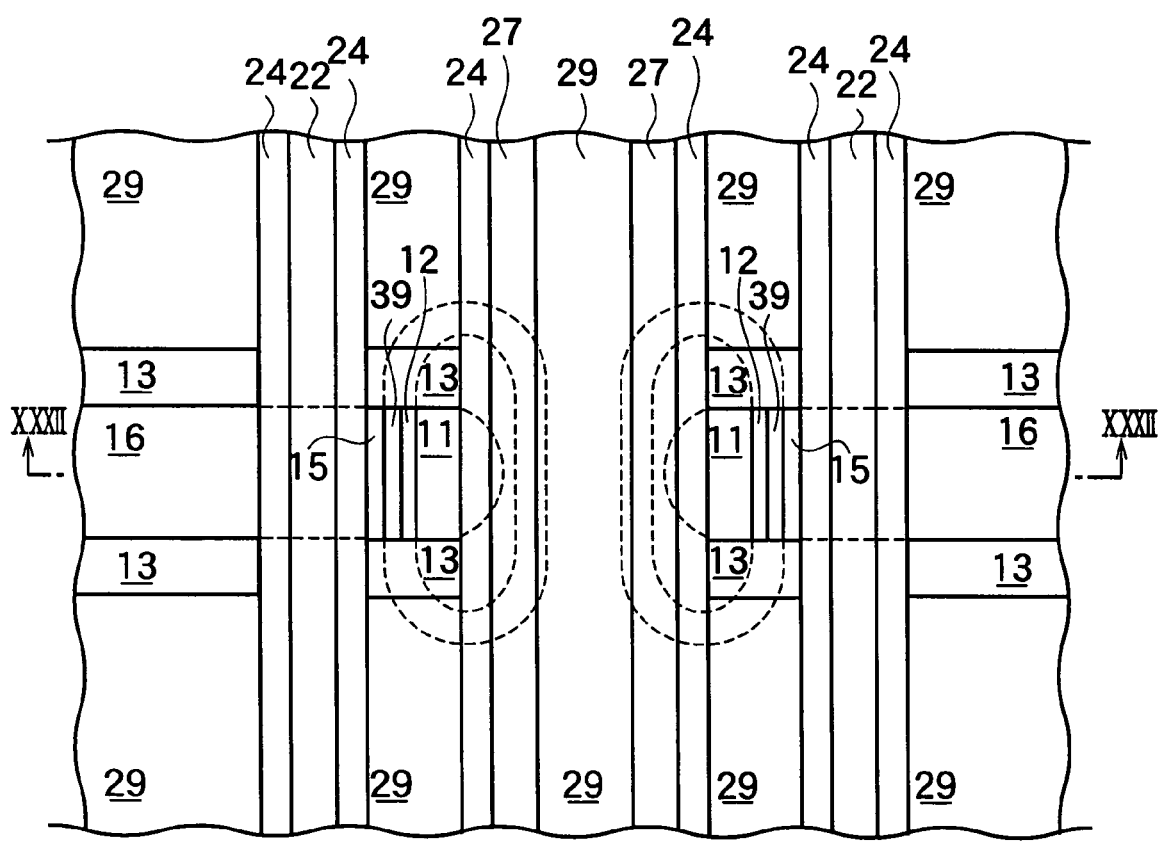
FIG. 31 is a top view of the semiconductor device according to the third embodiment in the course of fabrication.
Figure 32:
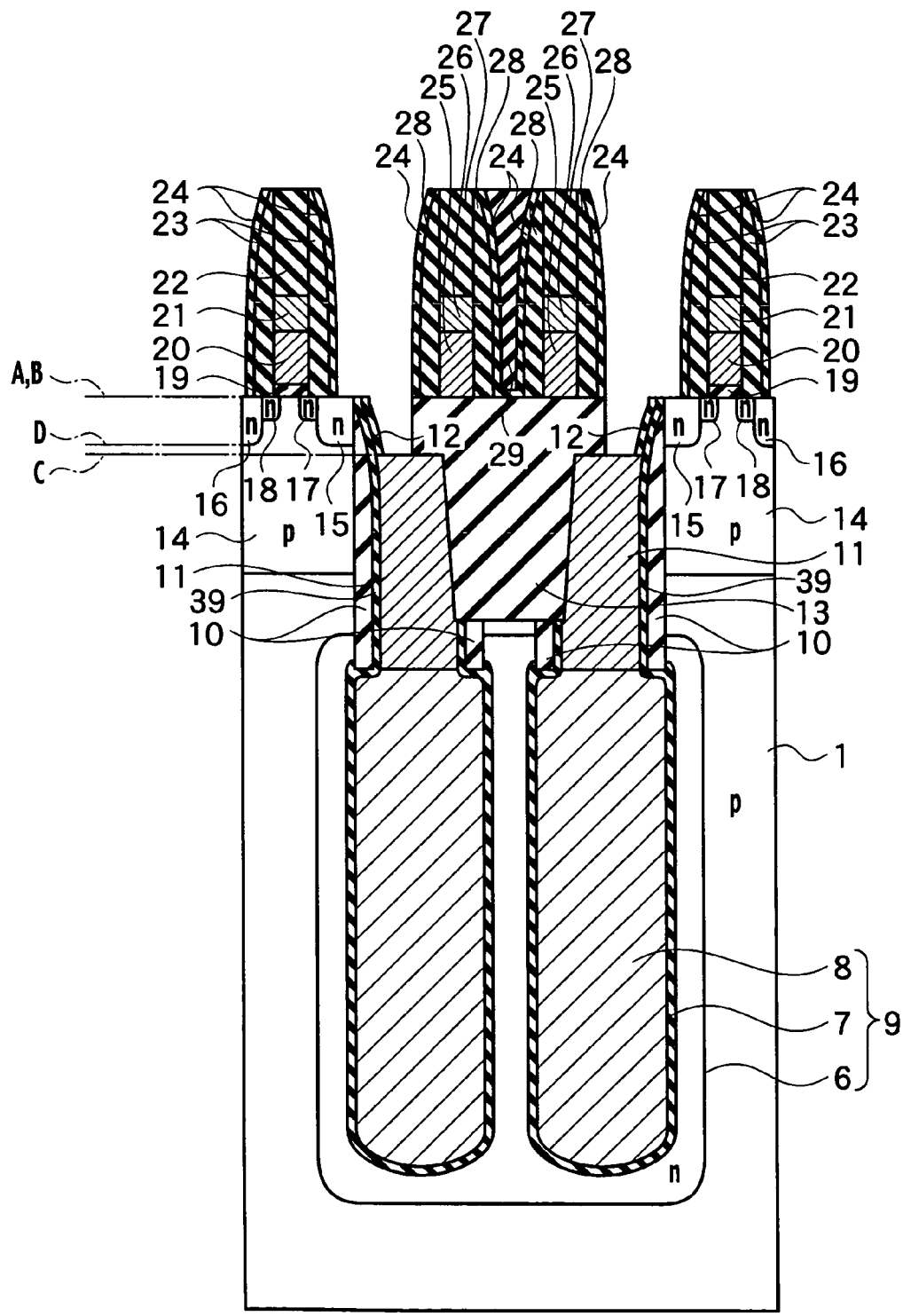
FIG. 32 is a cross-sectional diagram of the semiconductor device, according to the third embodiment in the course of fabrication, cut along the line XXXII-XXXII of FIG. 31.

(h) As shown in FIGS. 31 and 32, the BPSG film 29, the barrier nitride films, and the TTO of the STI 13 in areas which become the SS contacts 30 and the pullout electrodes 31 are etched using dry etching techniques such as RIE. The source regions 15, the spacers 12, and the storage nodes 11 are exposed. The collar oxide films 10 are not etched since the spacers 12 and the dielectric films 39 act as protective films. Accordingly, the sides of the source regions 15 and the p-wells 14 are not exposed.

Figure 33:
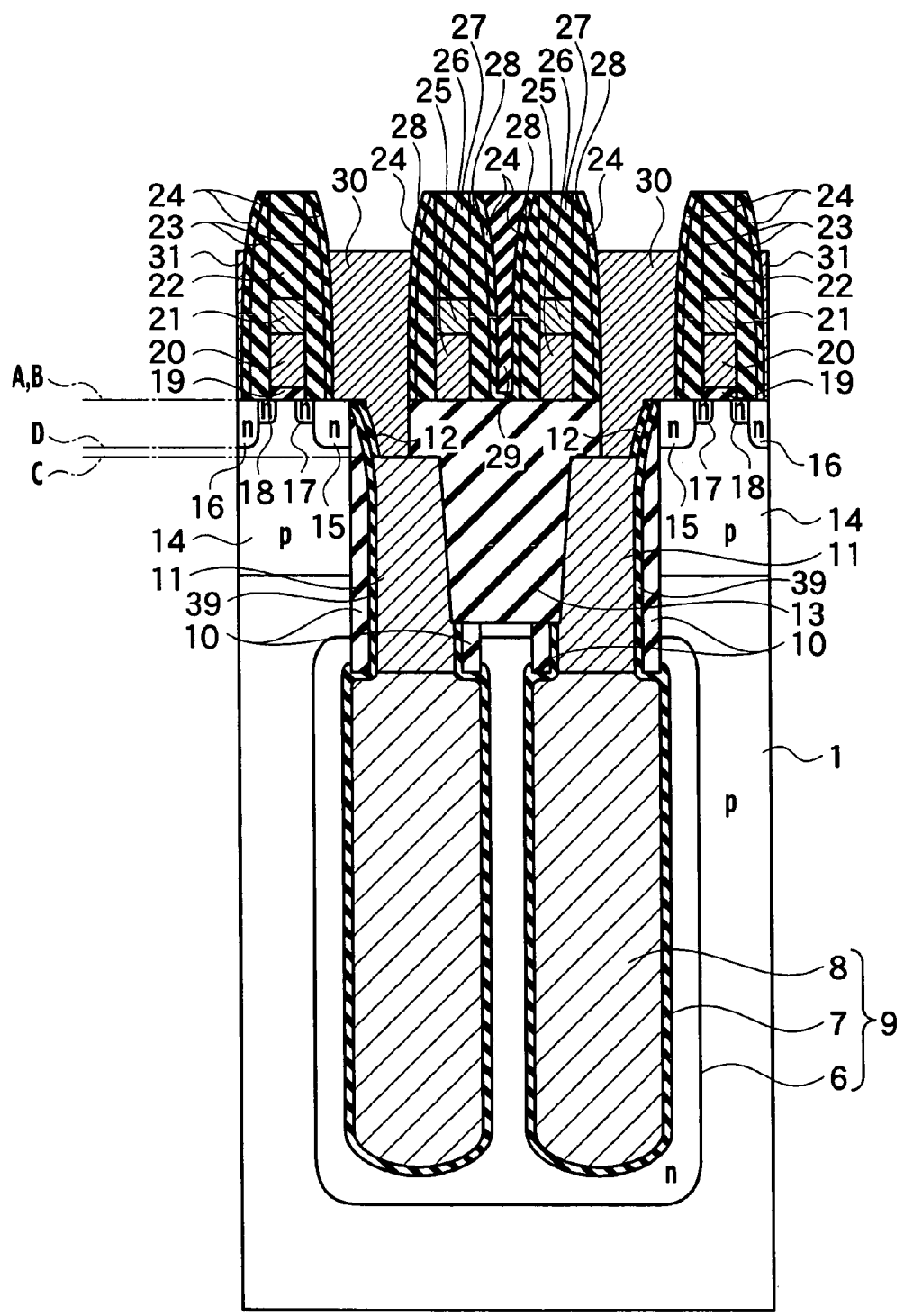
FIG. 33 is a cross-sectional diagram of the semiconductor device according to the third embodiment in the course of fabrication.

(i) Before deposition of the SS contacts 30 and the pullout electrodes 31, the natural oxide film formed on the surface of the source regions 15 and the storage nodes 11 is removed. During this removal, the collar oxide films 10 are not etched. An arsenic-doped polysilicon film is deposited so as to form the SS contacts 30 and the pullout electrodes 31. The SS contacts 30 are not in contact with the sides of the source regions 15 and the sides of the p-wells 14. As shown in FIG. 33, the SS contacts 30 and the pullout electrodes 31 are etched back and separated.

(j) As shown in FIGS. 1 and 22, the BPSG film 32 and the NSG film 33 are deposited. Contact holes are formed in the pullout electrodes 31, and the contact plugs 34 are formed in the contact holes. Bit lines are formed so as to be connected to the contact plugs 34. Since the SS contacts 30 are not in contact with the sides of the source regions 15 and the p-wells 14, an impurity such as arsenic in the SS contacts 30 does not diffuse to the p-wells 14.

As described above, according to the third embodiment, a semiconductor device allowing small areas of the source regions on the semiconductor substrate can be provided. Also according to the third embodiment, a fabrication method for the semiconductor device allowing small areas of the source regions on the semiconductor substrate can be provided.

FOURTH EMBODIMENT

With a semiconductor device according to a fourth embodiment of the present invention, a top view is represented by FIG. 1 as with the first embodiment, and a cross section is represented by FIG. 22 as with the third embodiment. In other words, the semiconductor device of the fourth embodiment has a structure equivalent to that of the third embodiment.

Figure 34:
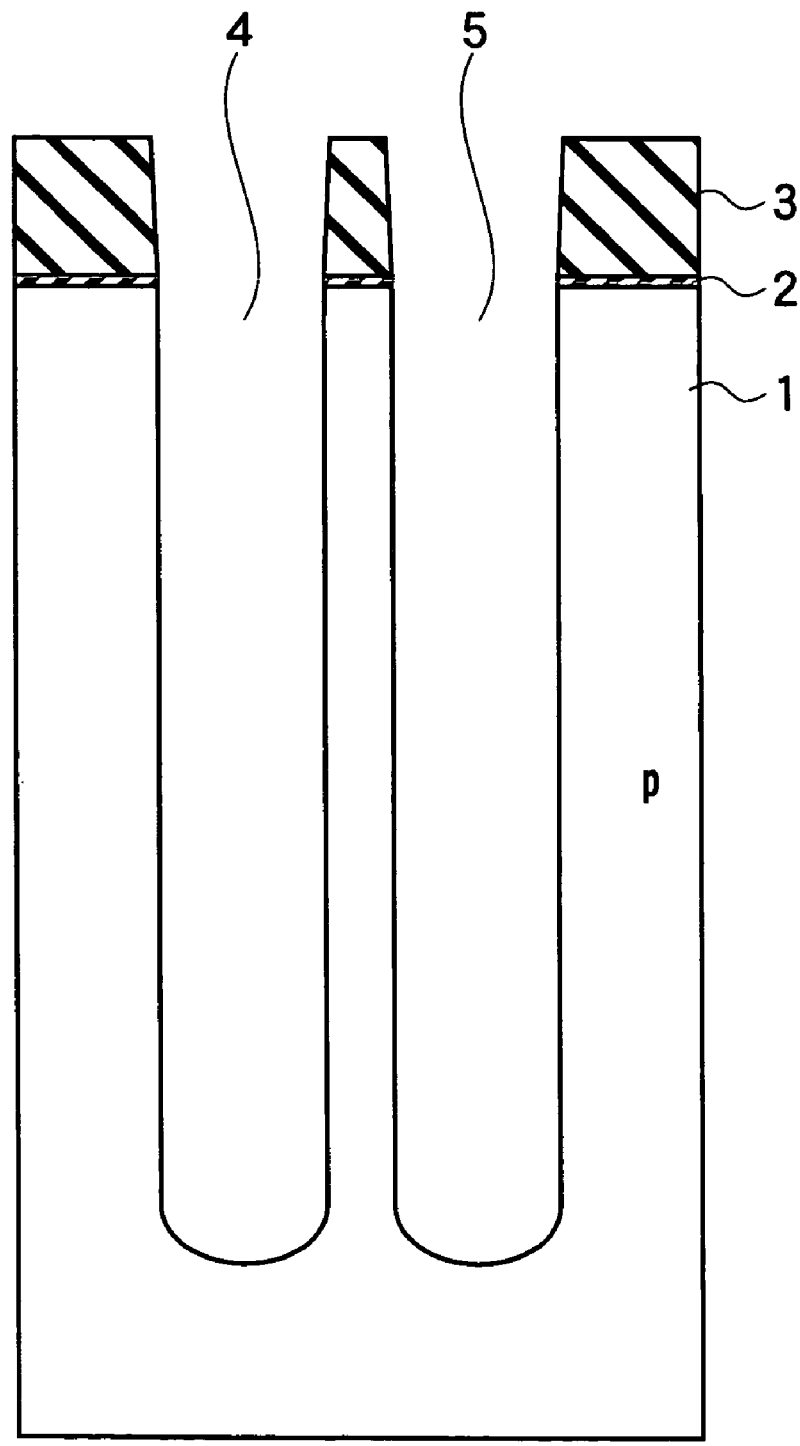
FIGS. 34 through 37 are cross-sectional diagrams of a semiconductor device according to a fourth embodiment in the course of fabrication.

A semiconductor device fabrication method according to the fourth embodiment is described forthwith. As shown in FIG. 34, the semiconductor device fabrication method according to the fourth embodiment uses the first step (a) of the semiconductor device fabrication method according to the first embodiment.

(a) A 30 nm-thick amorphous silicon film 35 is deposited on the sides of the trenches 4 and 5 through CVD. A silicon oxide film 36 is deposited on the surface of the amorphous silicon film 35 so as to cover it. A silicon nitride film 37 is deposited on the surface of the silicon oxide film 36 so as to cover it.

Figure 35:
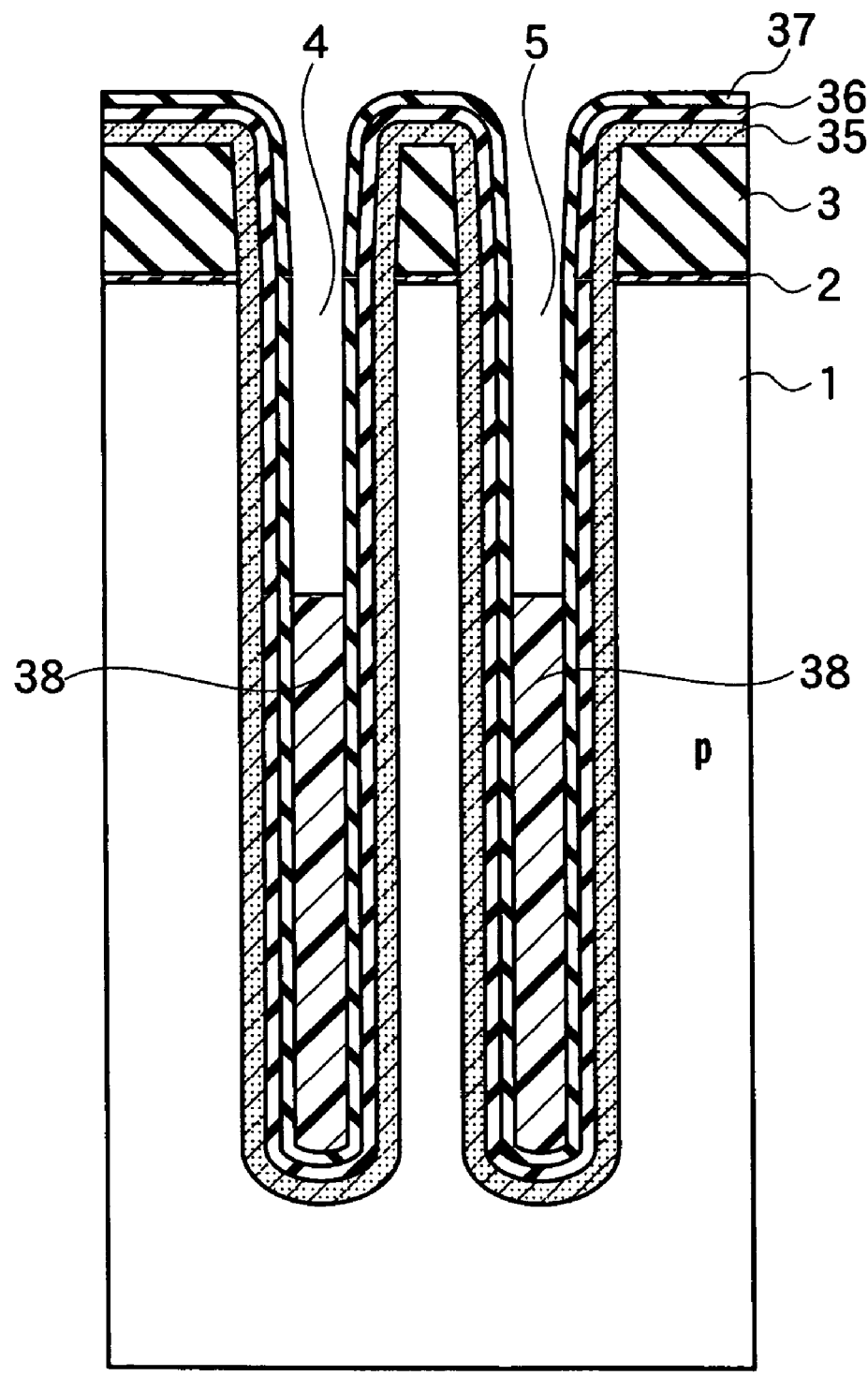
Figure 36:
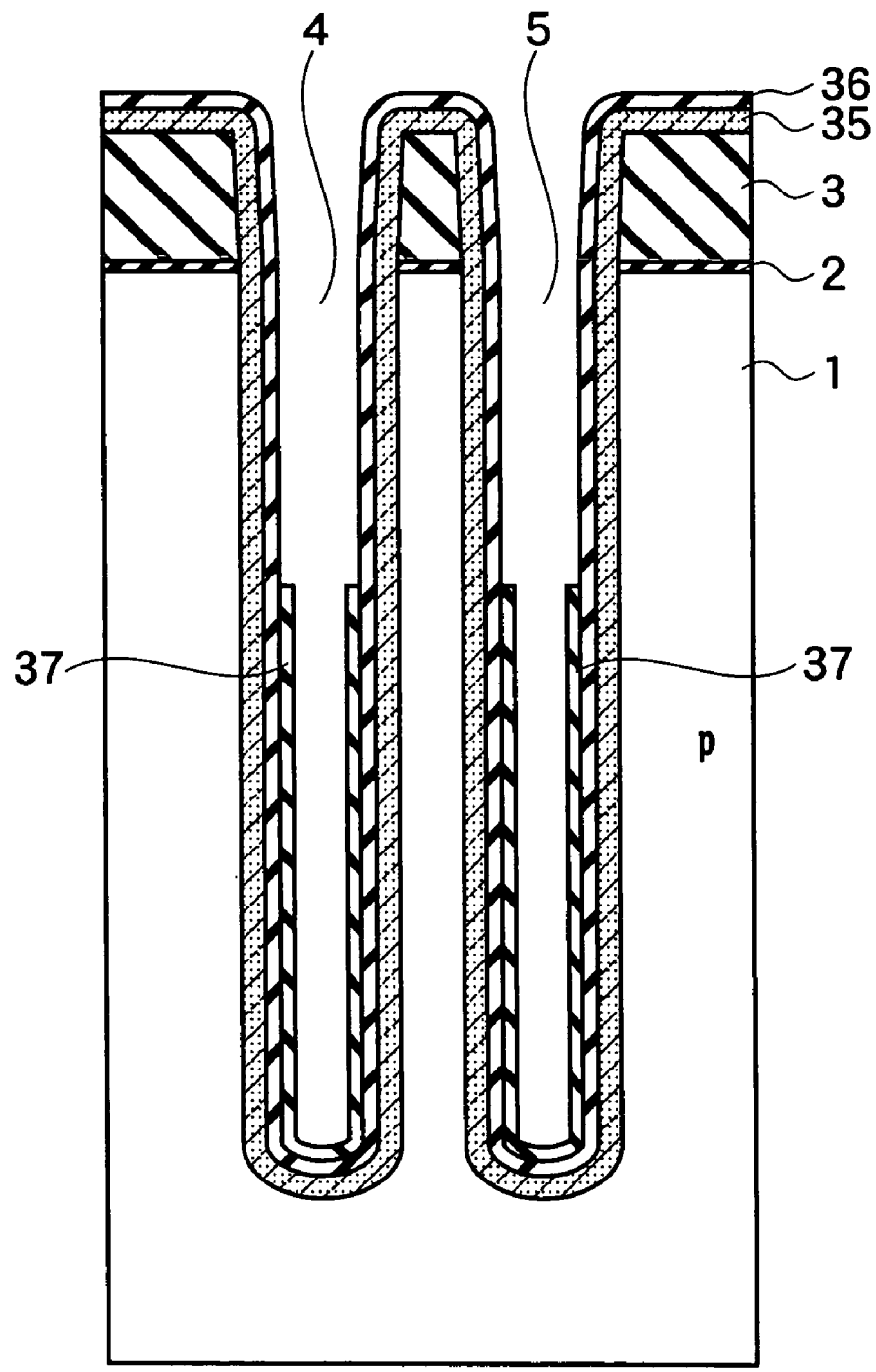

(b) A resist is applied so as to embed resist portions 38 in the lower portions of the trenches 4 and 5. As shown in FIG. 35, the resist portions 38 are etched back to an appropriate depth of approximately 1" m, for example. As shown in FIG. 36, the exposed silicon nitride film 37 is removed using the resist portions 38 as a mask and the silicon oxide film 36 as a stopper. The resist portions 38 are removed.

(c) The amorphous silicon film 35 is thermally oxidized using the silicon nitride films 37 as a mask, forming the collar oxide films 10. Next, the silicon nitride films 37 are completely removed by selectively wet etching the silicon oxide film 36. The silicon oxide film 36 is removed by selectively wet etching the amorphous silicon film 35. The amorphous silicon film 35 and the plate electrode 6 are isotropically etched through CDE using the collar oxide films 10 as a mask. This increases the capacity of the trenches 4 and 5.

Figure 37:
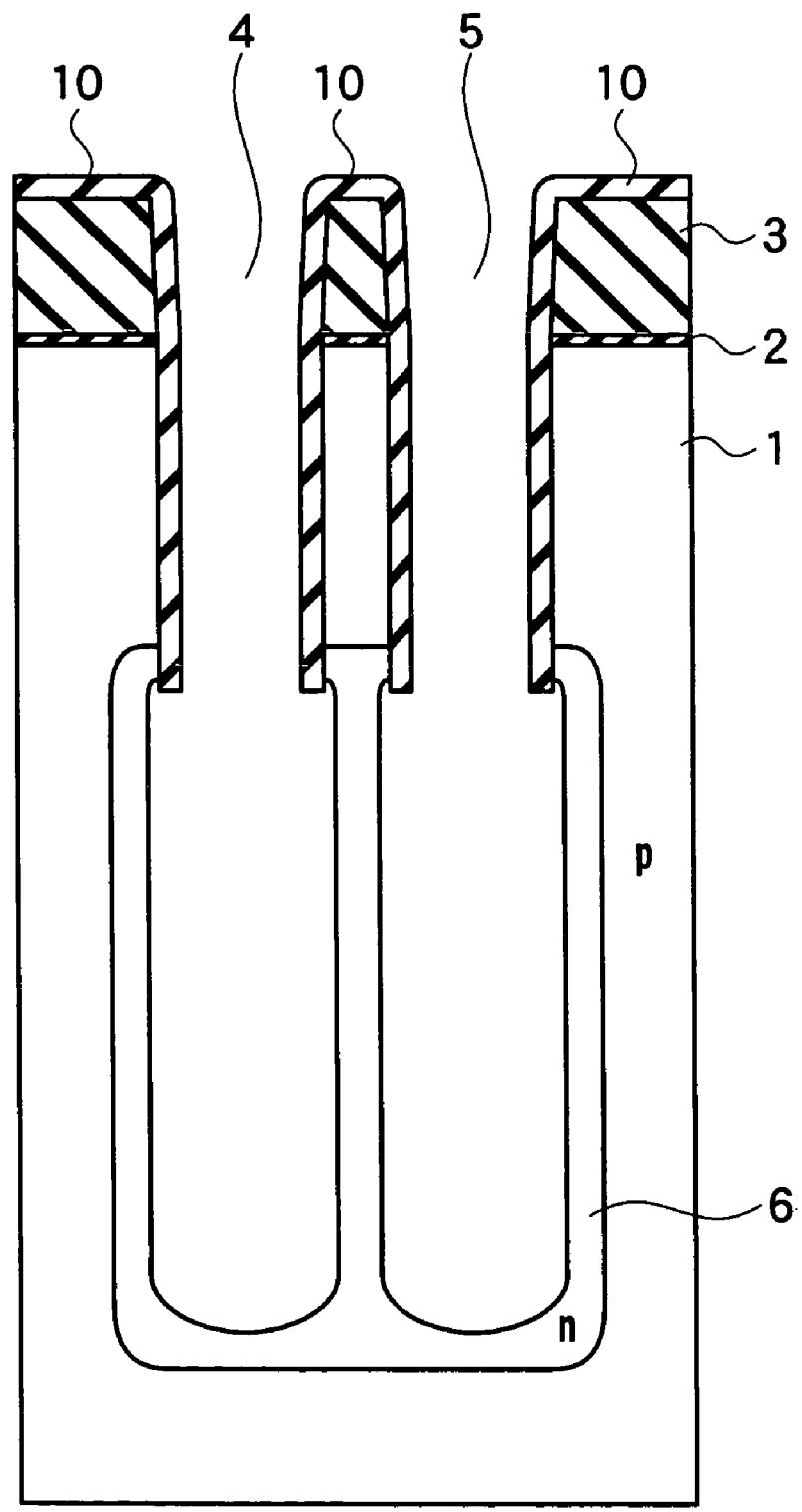

(d) As shown in FIG. 37, an n-type impurity is diffused from the exposed surface of the silicon substrate 1 in the trenches 4 and 5. Activating the diffused n-type impurity forms the plate electrode 6. The semiconductor device fabrication method according to the fourth embodiment can use the other steps (d) through (j) of the semiconductor device fabrication method according to the third embodiment. Since the SS contacts 30 are not in contact with the sides of the source regions 15 and the p-wells 14 even with the semiconductor device fabrication method according to the fourth embodiment, an impurity such as arsenic in the SS contacts 30 does not diffuse to the p-wells 14.

As described above, according to the fourth embodiment, a semiconductor device allowing small areas of the source regions on the semiconductor substrate can be provided. Also according to the fourth embodiment, a fabrication method for the semiconductor device allowing small areas of the source regions on the semiconductor substrate can be provided.

FIFTH EMBODIMENT

Figure 38:
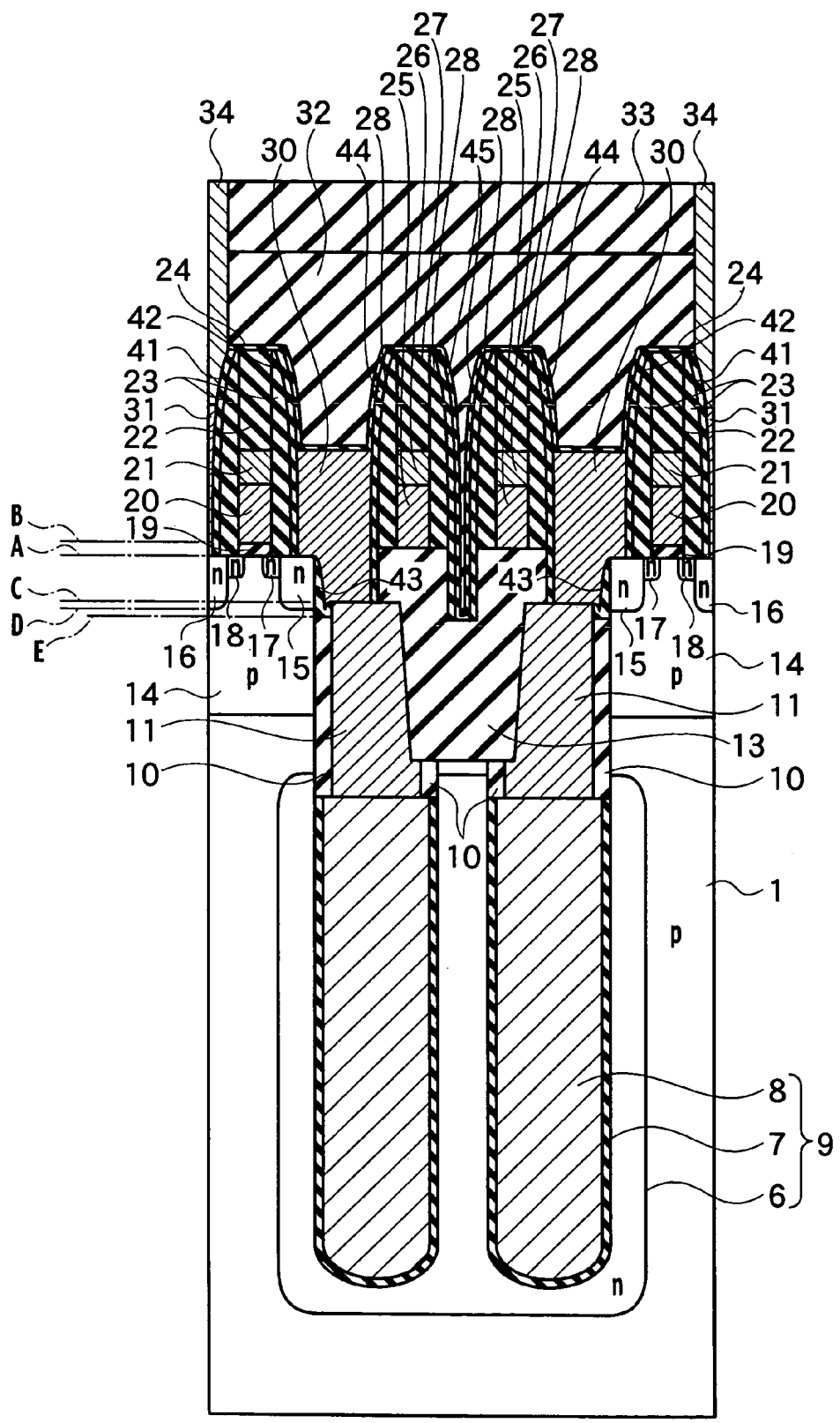
FIG. 38 is a cross-sectional diagram of a semiconductor device according to a fifth embodiment cut along the line II-II of FIG. 1.
Figure 39:
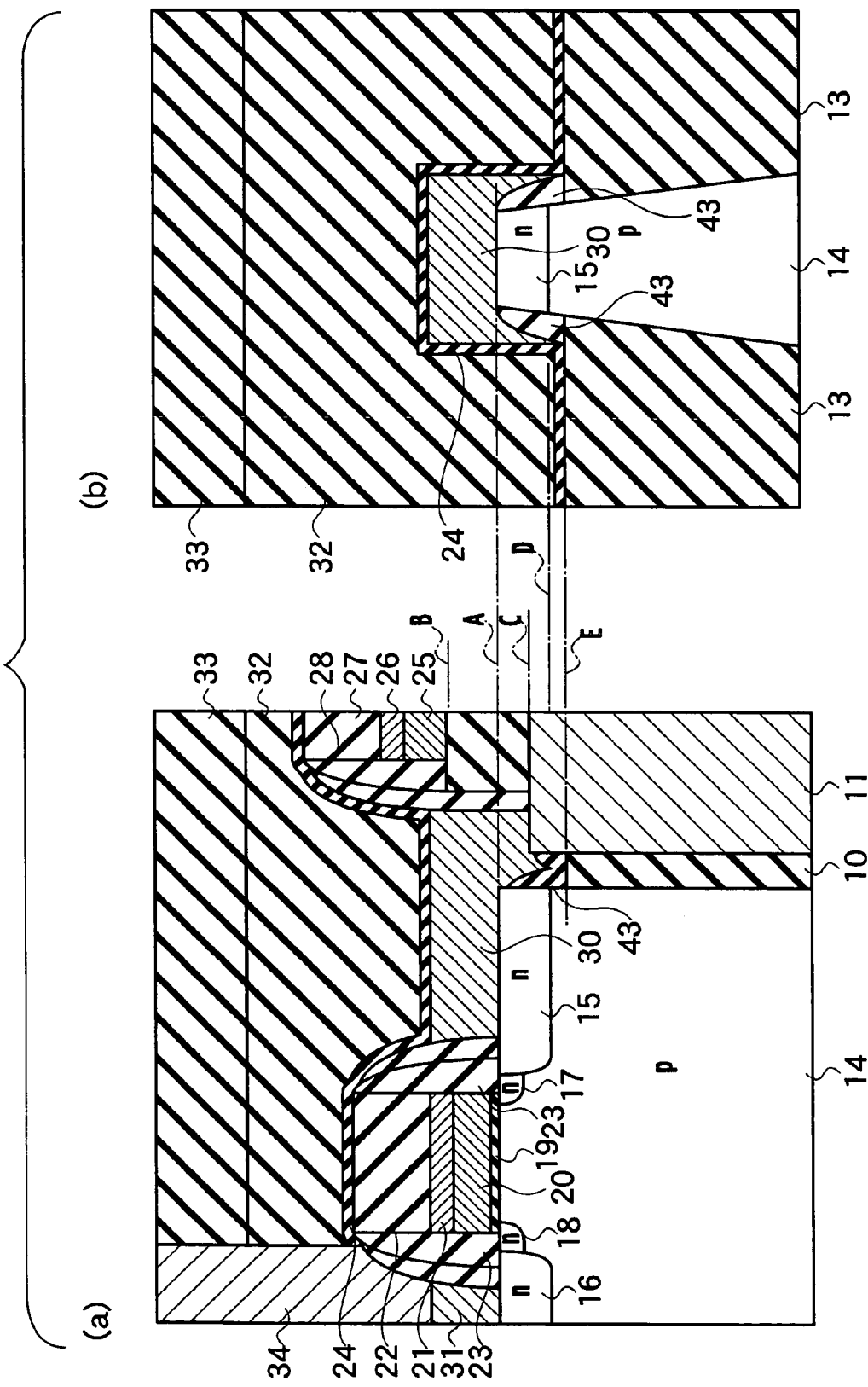
FIG. 39(a) is an enlarged view of FIG. 38.
FIG. 39(b) is a cross-sectional diagram of the semiconductor device according to the fifth embodiment cut along the line XXXIXB-XXXIXB of FIG. 1.

With a semiconductor device according to a fifth embodiment of the present invention, a top view is represented by FIG. 1 as with the first embodiment, and cross sections are represented by FIGS. 38 and 39. A difference with the semiconductor device of the fifth embodiment from the semiconductor device of the first embodiment is a difference between the structure around the spacer 12 and a structure around a spacer 43.

With the fifth embodiment, the spacer 43 is arranged not only upon the collar oxide film 10, but upon the STI 13 as well. The spacer 43 covers three sides of the source region 15 and three sides of the p-well 14. Portions of the spacer 43 are arranged facing each other via the source regions 15. The spacer 43 covers two sides of the drain regions 16 and two sides of the p-wells. Portions of the spacer 43 are arranged facing each other via the drain regions 16.

As a result, the side of the source region 15 and the side of the p-well 14 are not in contact with the SS contact 30. The side of the drain region 16 and the side of the p-well 14 are not in contact with the pullout electrode 31. Only the top face in the all faces of the source region 15 is in contact with the SS contact 30. Only the top face in the all faces of the drain region 16 is in contact with the pullout electrode 31. The p-well 14 is not in contact with the SS contact 30 and the pullout electrode 31.

With the fifth embodiment, the spacers 41 and 42 arranged on the sides of the sidewalls 23 are a difference from the first embodiment. With the fifth embodiment, the spacers 44 and 45 arranged on the sides of the sidewalls 28 and the sides of the STI 13 is a difference from the first embodiment.

For an increase in semiconductor device memory capacity, the integration density of the select transistors 15 through 23 is increased, and intervals therebetween are narrowed. Accordingly, the distance from the gate electrodes 20 and 21 to the storage nodes 11 of the select transistors 15 through 23 becomes shorter, and the area of the source regions 15 on the semiconductor substrate decreases. The contact areas between the SS contacts 30 and the source regions 15 can not be reduced. Therefore, contact regions of the SS contacts 30 with the source regions 15 are brought closer to the gate electrodes 20 and 21 of the select transistors 15 through 23. Due to the contact regions and the gate electrodes 20 and 21 becoming closer, necessary contact surface areas may be ensured. The operating speed of the semiconductor device can be improved without raising the contact resistance between the SS contacts 30 and the source regions 15. Furthermore, even if the contact regions and the gate electrodes 20 and 21 are brought close to each other, since the sides of the regions in the bottom of the source regions in the p-wells 14 cover the spacers 43, the sides of the regions in the bottom of the source regions in the p-wells 14 are not in direct contact with the SS contacts 30. Accordingly, an impurity such as arsenic doped in the SS contacts 30 does not diffuse to the bottoms of the source regions 15 in the p-wells 14. Therefore, the threshold of the select transistors 15 through 23 is not reduced, and punch-through does not develop.

Figure 40:
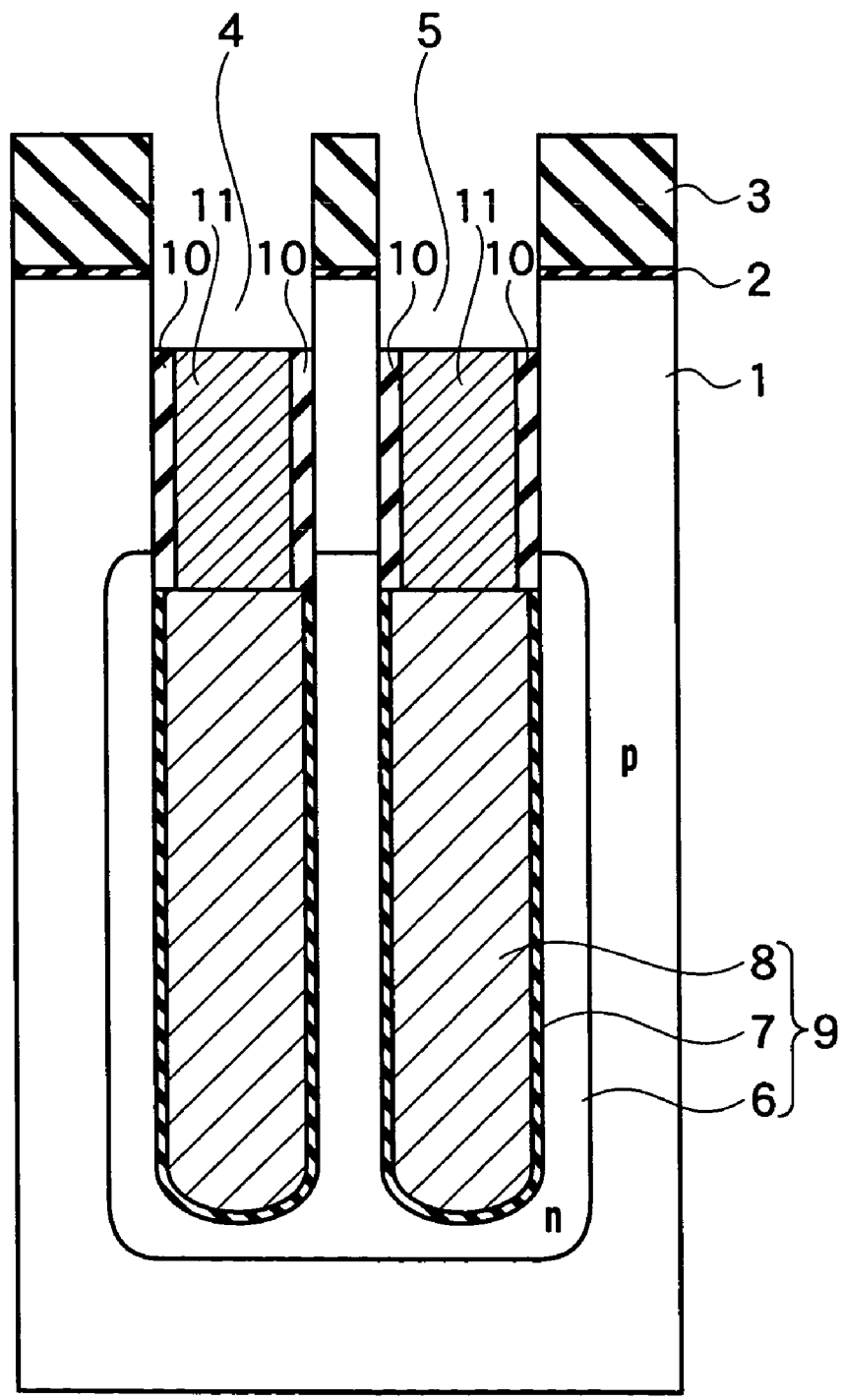
FIGS. 40 through 42 are cross-sectional diagrams of the semiconductor device according to the fifth embodiment in the course of fabrication.

A semiconductor device fabrication method according to the fifth embodiment is described forthwith. The semiconductor device fabrication method according to the fifth embodiment uses some of the same steps (a) through (c) as in the semiconductor device fabrication method according to the first embodiment, and consequently some of the same steps (a) and (b) as in the semiconductor device fabrication method according to the second embodiment as shown in FIG. 40.

Figure 41:
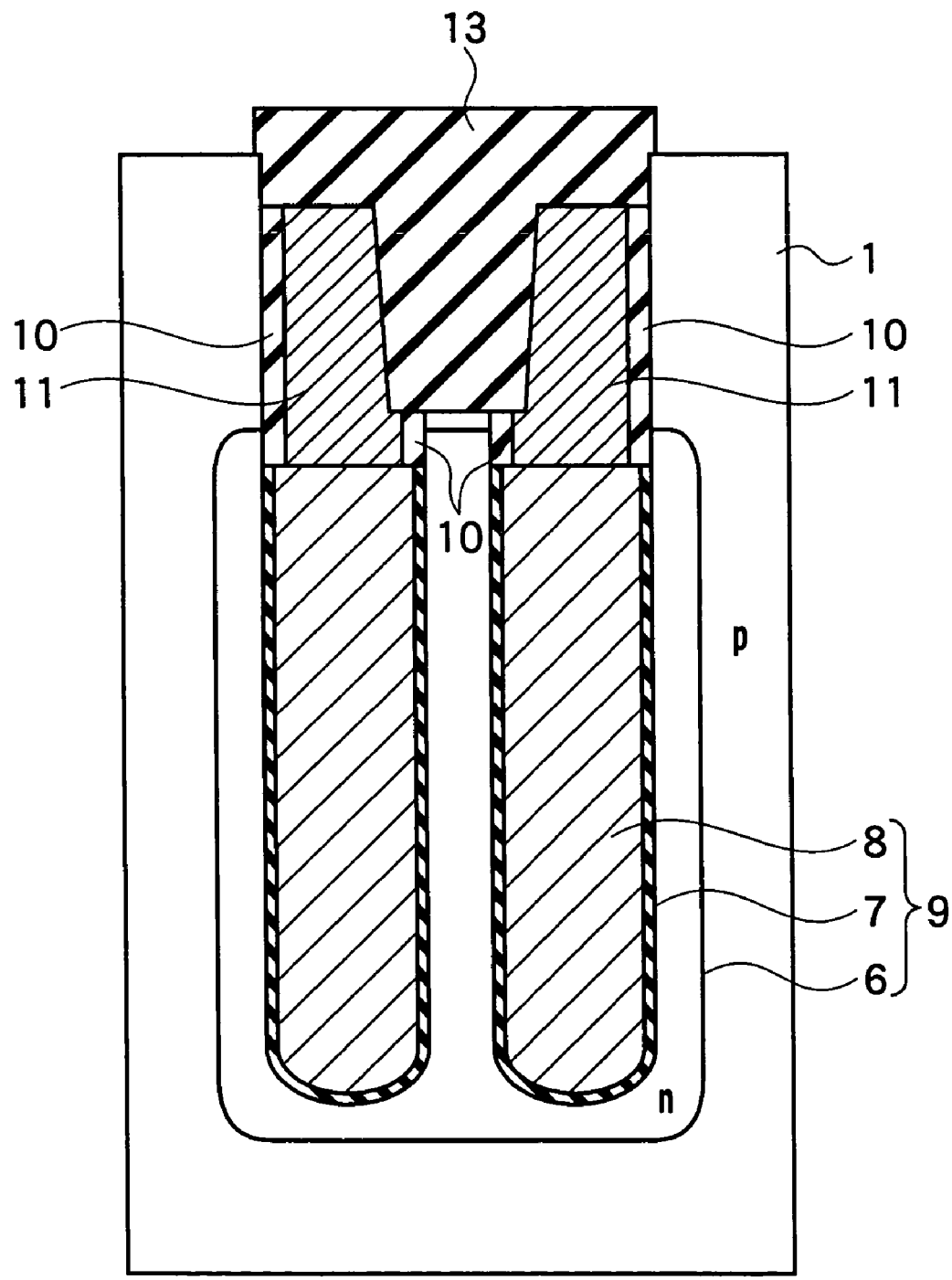
Figure 42:
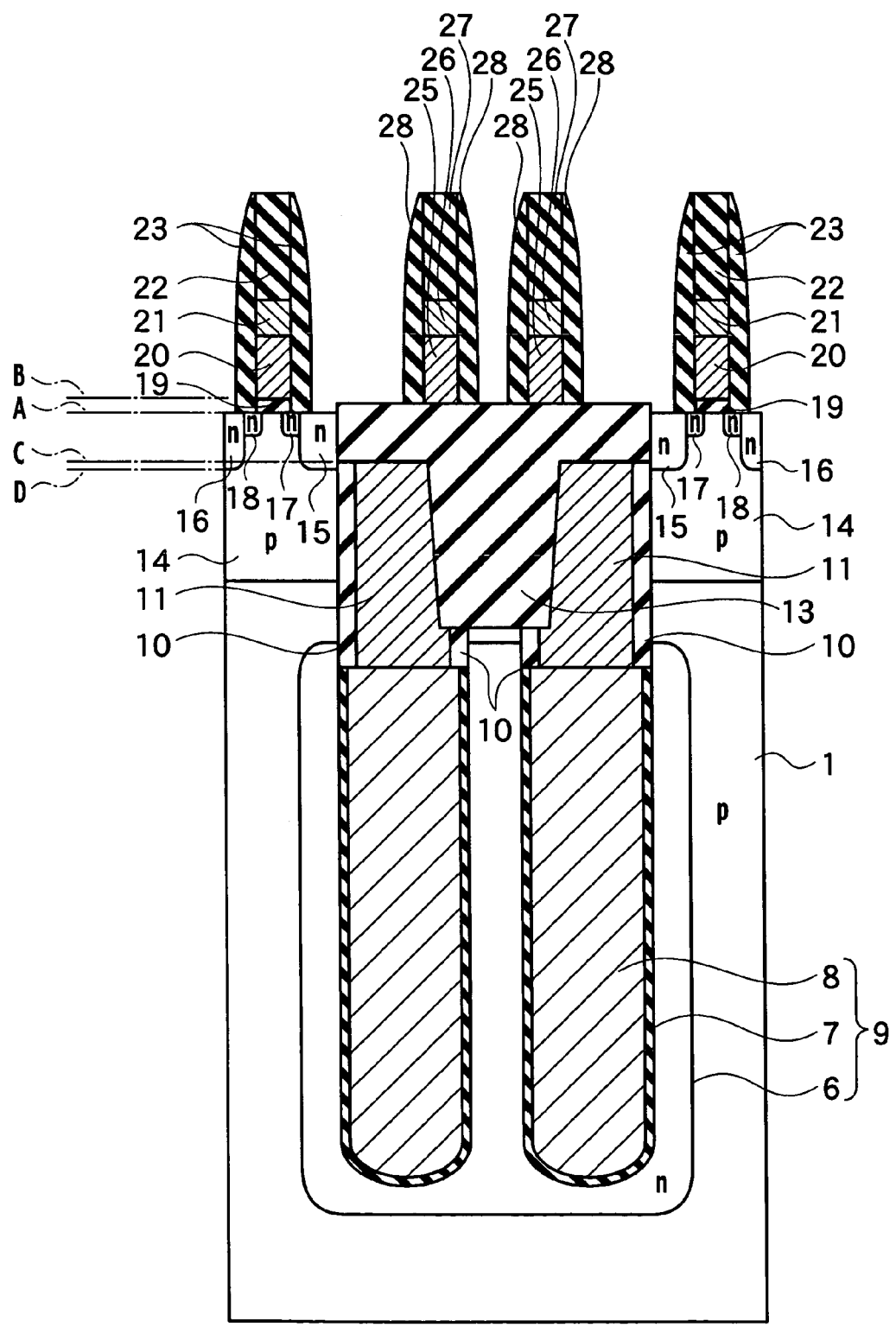
Figure 43:
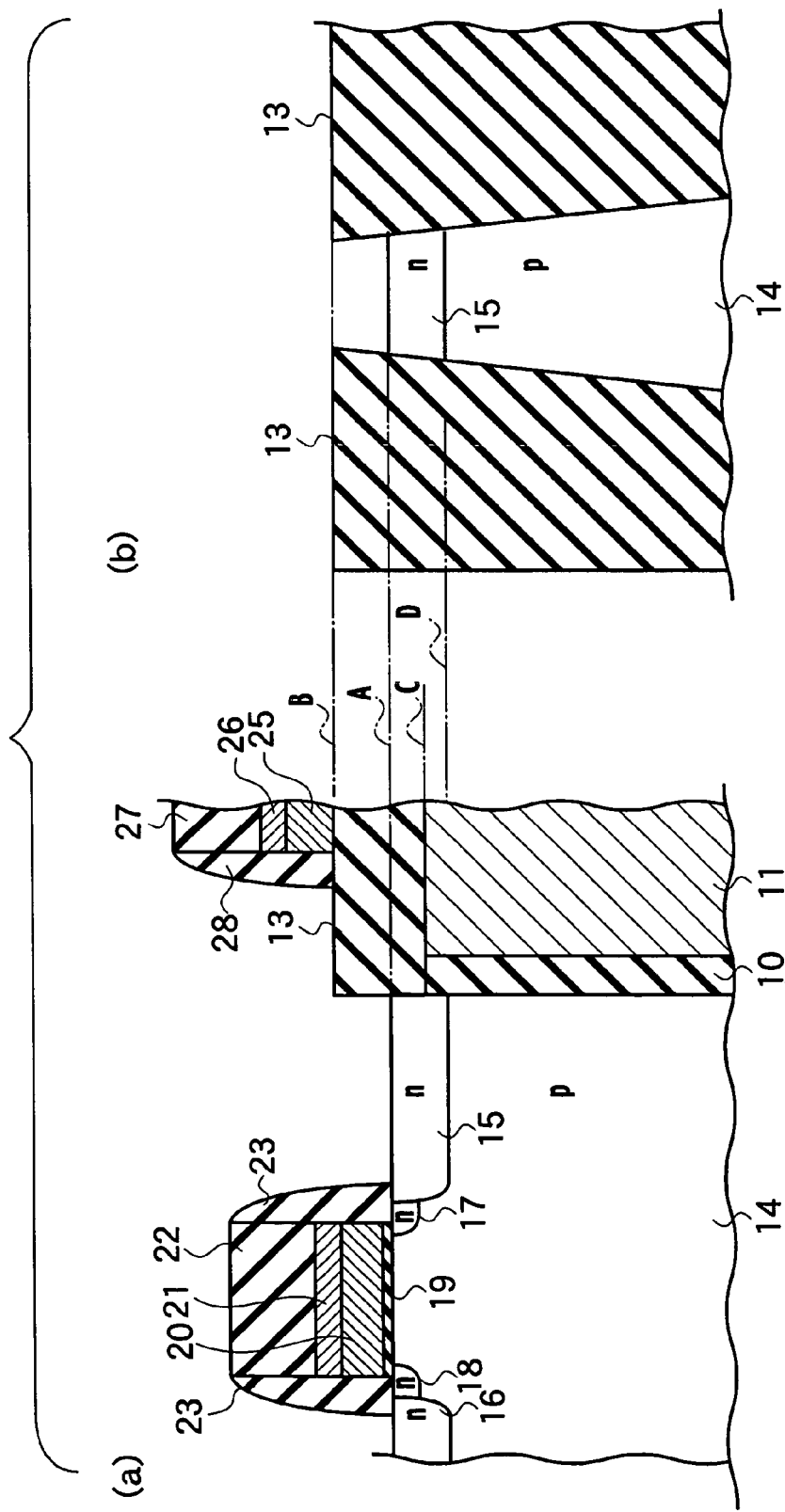
FIG. 43(a) is an enlarged view of FIG. 42.
FIG. 43(b) is a cross-sectional diagram of the semiconductor device according to the fifth embodiment cut along the line XXXIXB-XXXIXB of FIG. 1.

(a) As shown in FIG. 41, the STI 13 and the TTO are formed, establishing active areas for the select transistors 15 through 23. As shown in FIGS. 42 and 43, the p-wells 14, the select transistors 15 through 23, and the gate interconnects 25 through 28 are formed.

Figure 44:
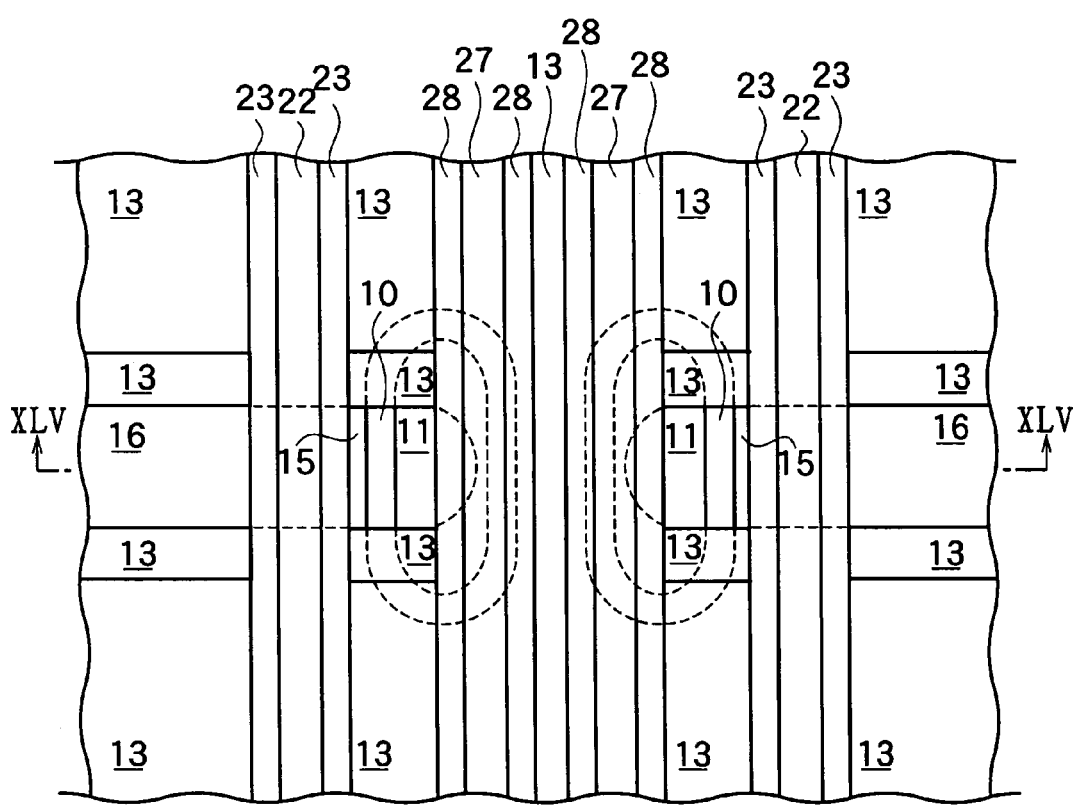
FIG. 44 is a top view of the semiconductor device according to the fifth embodiment in the course of fabrication.
Figure 45:
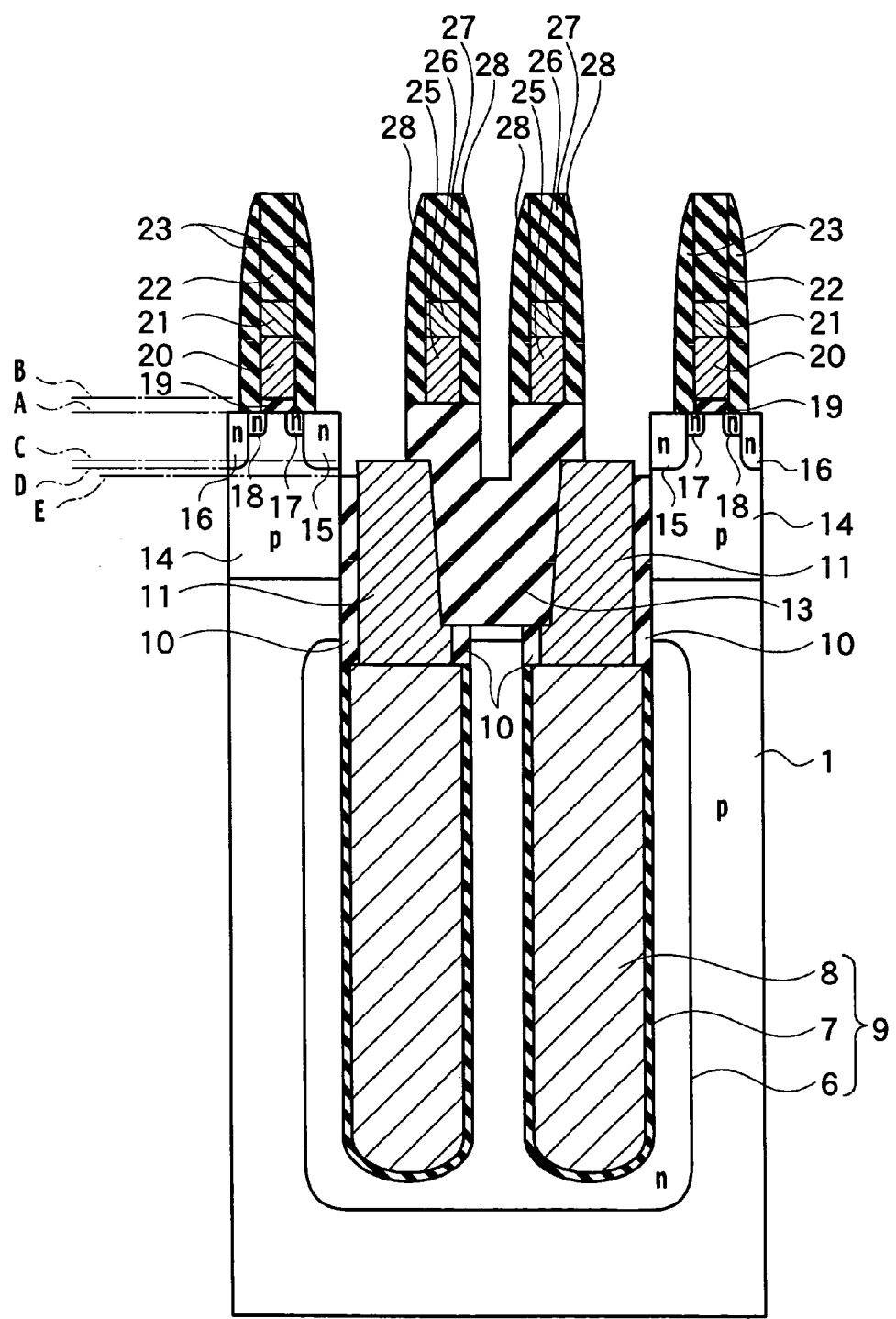
FIG. 45 is a cross-sectional diagram of the semiconductor device, according to the fifth embodiment in the course of fabrication, cut along the line XLV-XLV of FIG. 44.
Figure 46:
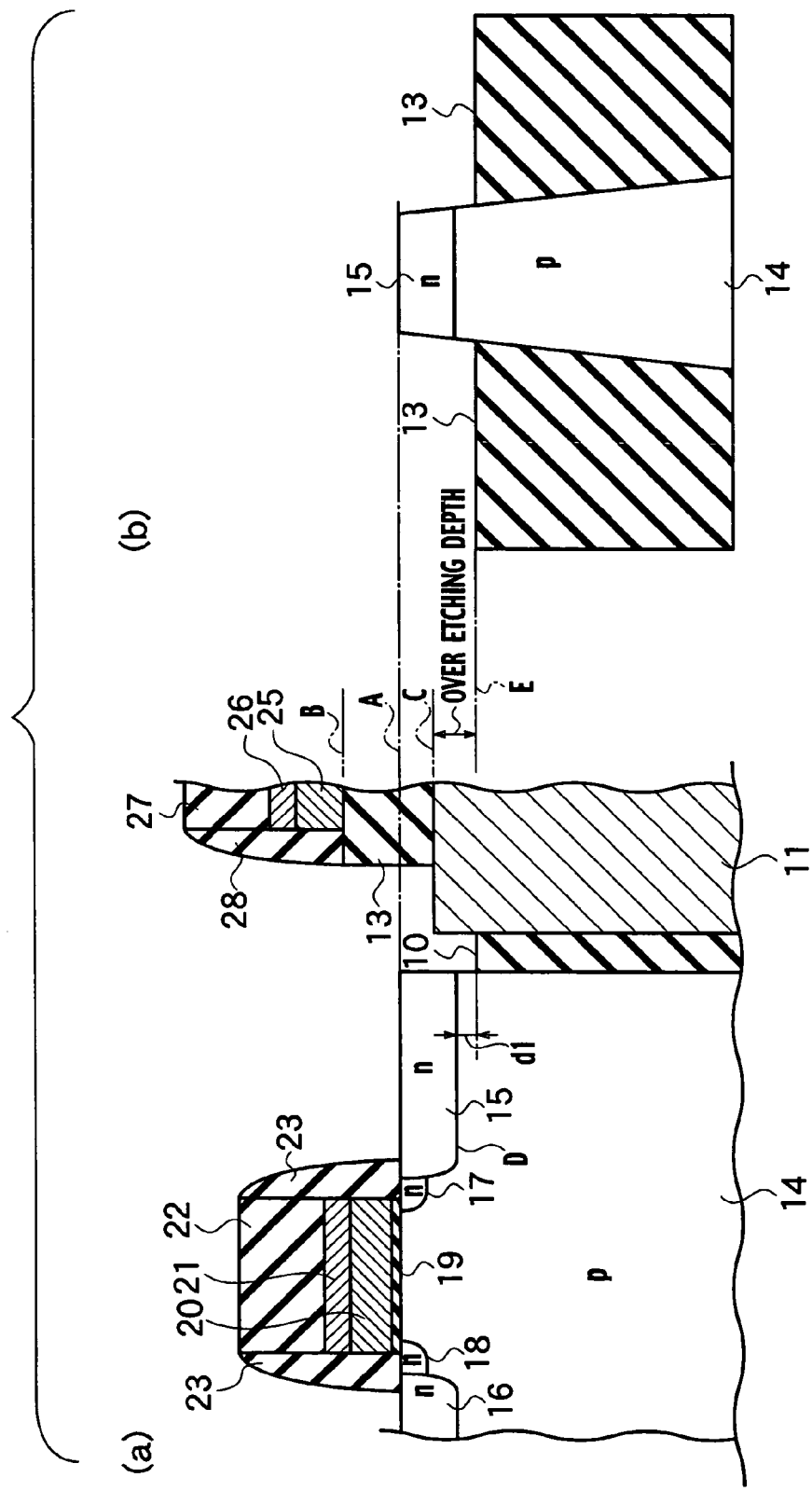
FIG. 46(a) is an enlarged view of FIG. 45.
FIG. 46(b) is a cross-sectional diagram of the semiconductor device according to the fifth embodiment cut along the line XXXIXB-XXXIXB of FIG. 1.

(b) As shown in FIGS. 44 through 46, the TTO of the STI 13 is etched using dry etching techniques such as RIE using the gate interconnects 25 through 28 as a mask, and the storage nodes 11 as a stopper. The storage nodes 11 are exposed. The source regions 15 and the drain regions 16 are already exposed before being etched. Over etching is then performed, so as to reliably expose the storage nodes 11. By over etching, the height of the tops (surface E) of the STI 13 and the collar oxide films 10 becomes lower than that of the tops (surface C) of the storage nodes 11. Furthermore, the height of the tops (surface E) of the STI 13 and the collar oxide films 10 becomes lower than that of the bottoms (surface D) of the source regions 15. Accordingly, the sides of the source regions 15 and the p-wells 14 are exposed.

Figure 47:
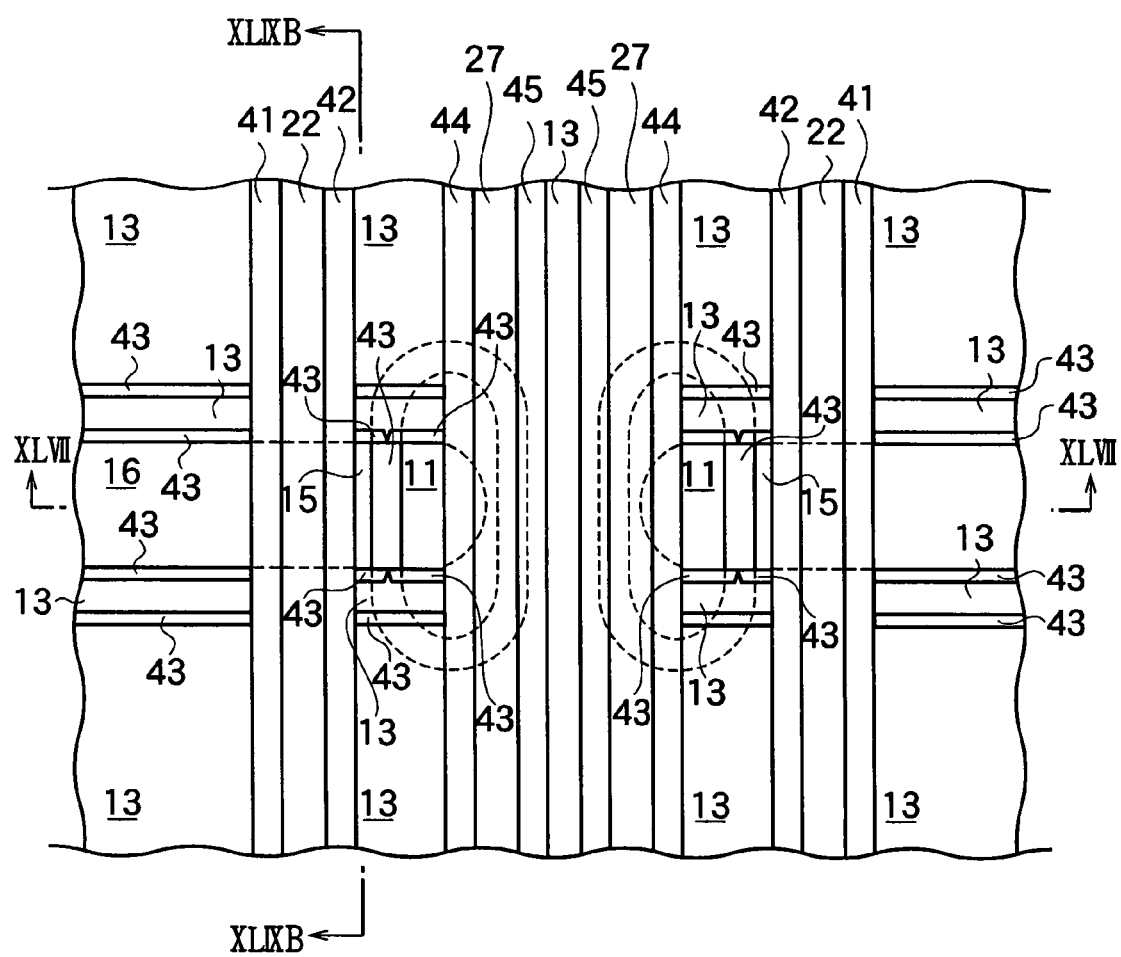
FIG. 47 is a top view of the semiconductor device according to the fifth embodiment in the course of fabrication.
Figure 48:
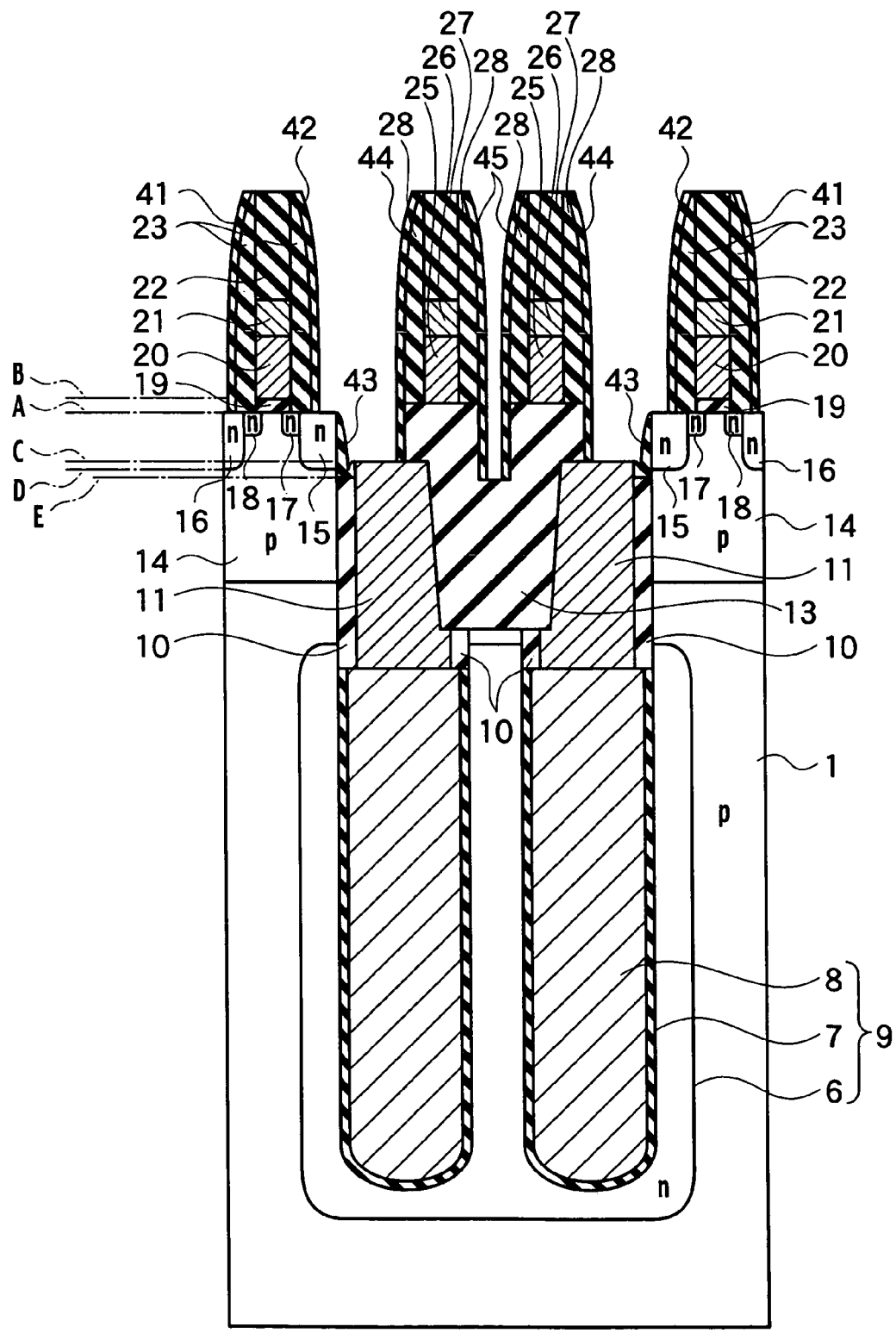
FIG. 48 is a cross-sectional diagram of the semiconductor device, according to the fifth embodiment in the course of fabrication, cut along the line XLVII-XLVII of FIG. 47.
Figure 49:
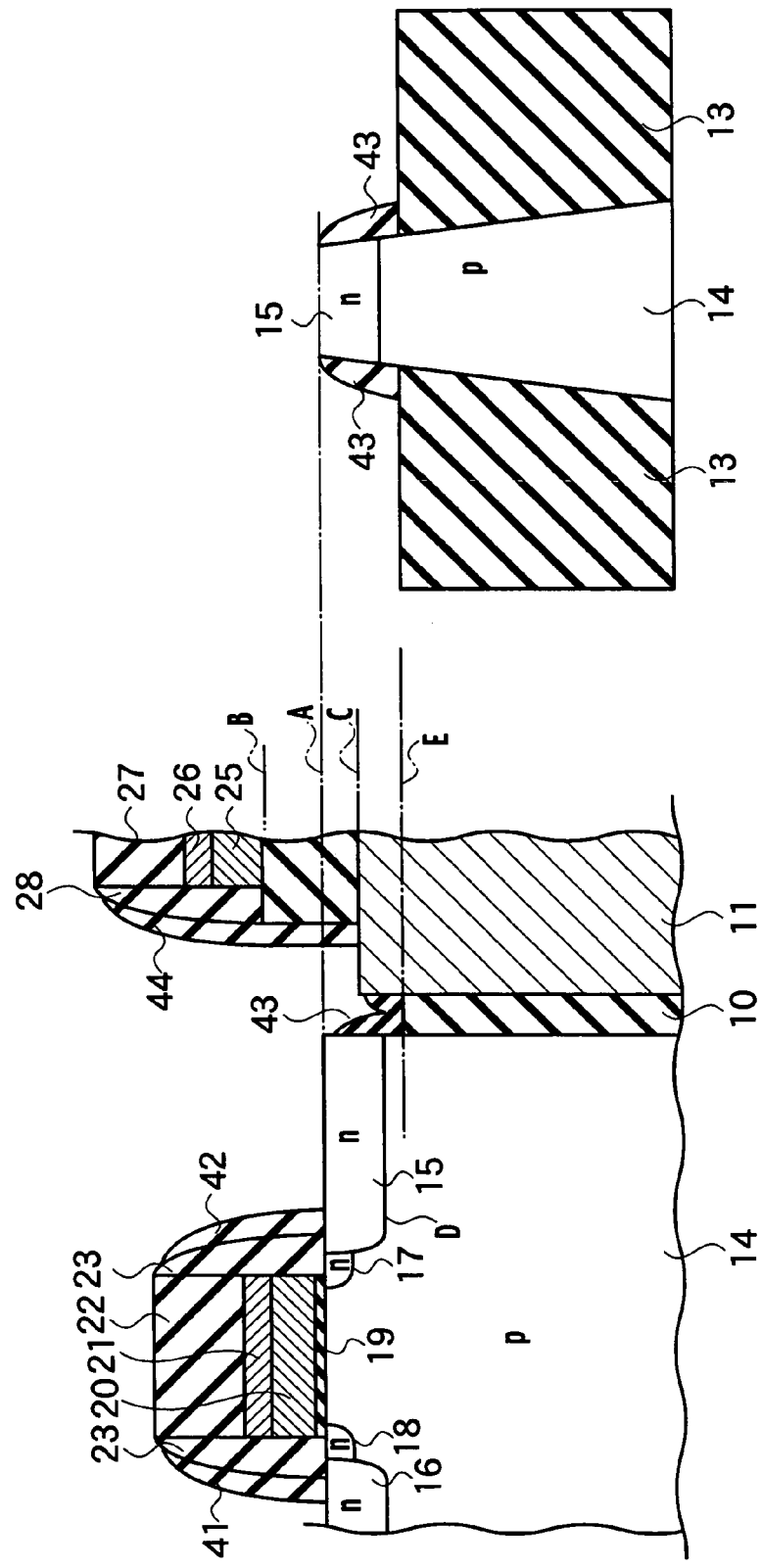
FIG. 49(a) is an enlarged view of FIG. 48.
FIG. 49(b) is a cross-sectional diagram of the semiconductor device according to the fifth embodiment cut along the line XLIXB-XLIXB of FIG. 47.

(c) A silicon nitride film, which becomes the spacers 41 through 45, is deposited through CVD with a thickness of approximately 10 nm. The silicon nitride film is etched back. As shown in FIGS. 47 through 49, the spacers 43 remain on the sides of the source regions 15, the sides of the storage nodes 11 and the sides of the drain regions 16. The sides of the source regions 15, the sides of the storage nodes 11, and the sides of the drain regions 16 are not exposed. The spacers 41 and 42 remain on the sides of the sidewalls 23. The spacers 44 and 45 remain on the sides of the sidewalls 28 and the sides of the STI 13.

Figure 50:
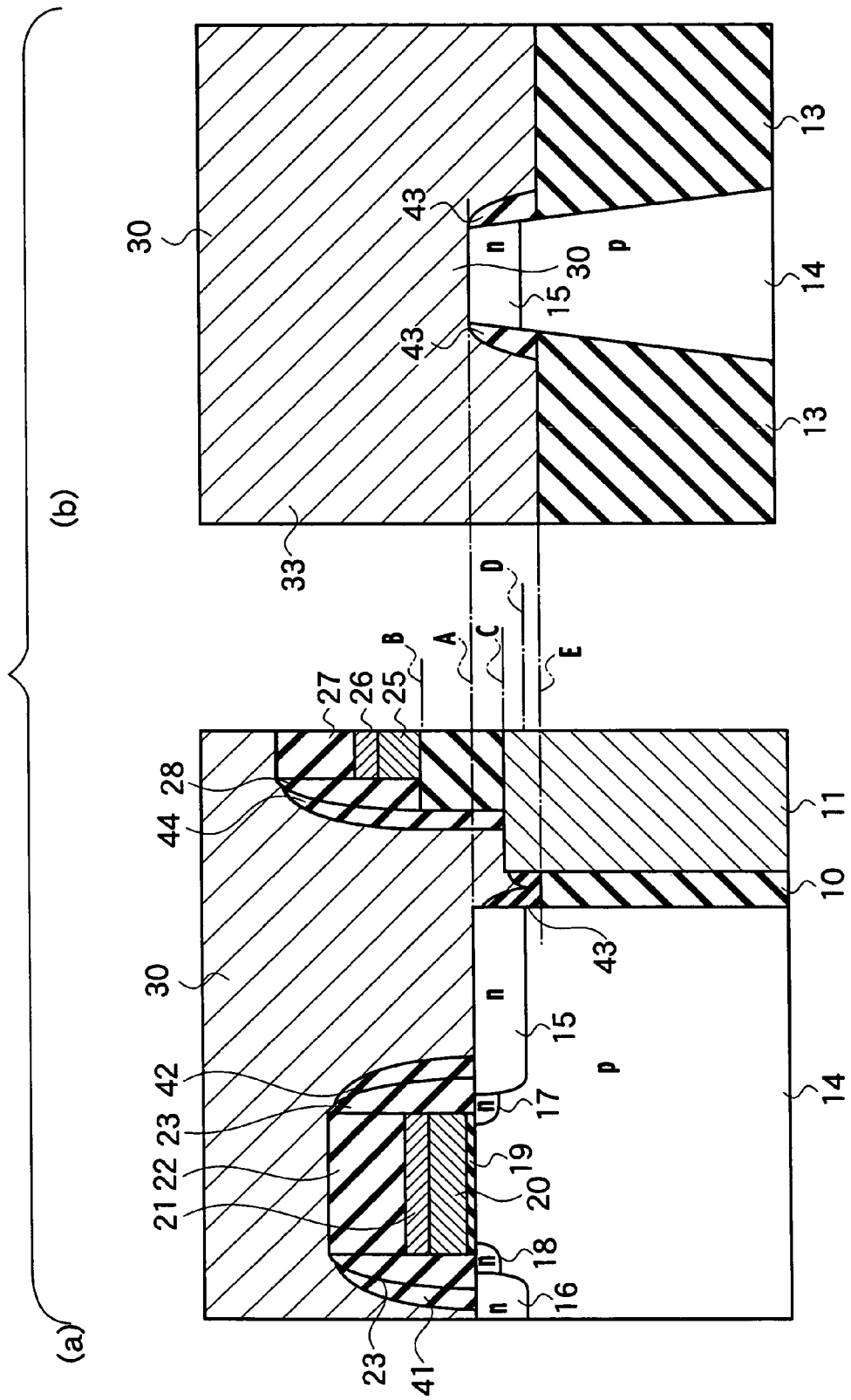
FIG. 50 is a cross-sectional diagram of the semiconductor device according to the fifth embodiment in the course of fabrication.
Figure 51:
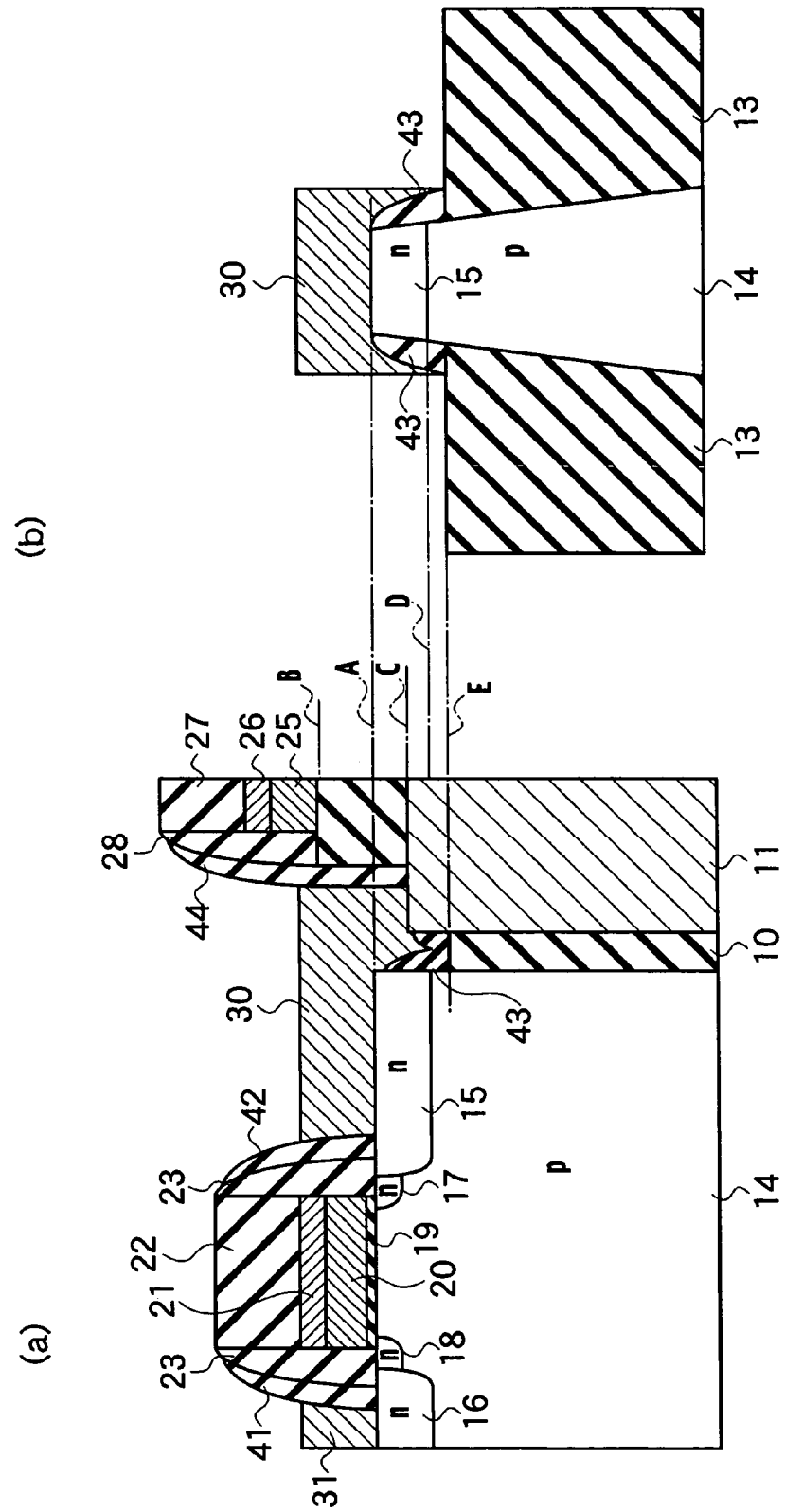
FIG. 51 is a cross-sectional diagram of the semiconductor device according to the fifth embodiment in the course of fabrication.

(d) Before deposition of the SS contacts 30 and the pullout electrodes 31, natural oxide films formed on the surfaces of the source regions 15 and the storage nodes 11 are removed. As shown in FIG. 50, an arsenic-doped polysilicon film 30 is deposited so as to form the SS contacts 30 and the pullout electrodes 31. The SS contacts 30 are not in contact with the sides of the source regions 15 and the p-wells 14. As shown in FIG. 51, patterns of the SS contacts 30 and the pullout electrodes 31 are formed in the resist film through photolithography, and the SS contacts 30 are etched using the resist film as a mask. The SS contacts 30 and the pullout electrodes 31 are formed separated from each other.

(e) As shown in FIGS. 1, 38 and 39, the barrier nitride film 24 and the BPSG film 32 are deposited. The thickness of the barrier nitride film 24 is approximately 8 nm. The surface of BPSG film 32 is smoothed, and the NSG film 33 is deposited through CVD using TEOS. The thickness of the NSG film 33 is approximately 150 nm. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the fifth embodiment, a semiconductor device allowing small areas of the source regions on the semiconductor substrate can be provided. Also according to the fifth embodiment, a fabrication method for the semiconductor device allowing small areas of the source regions on the semiconductor substrate can be provided.

SIXTH EMBODIMENT

Figure 52:
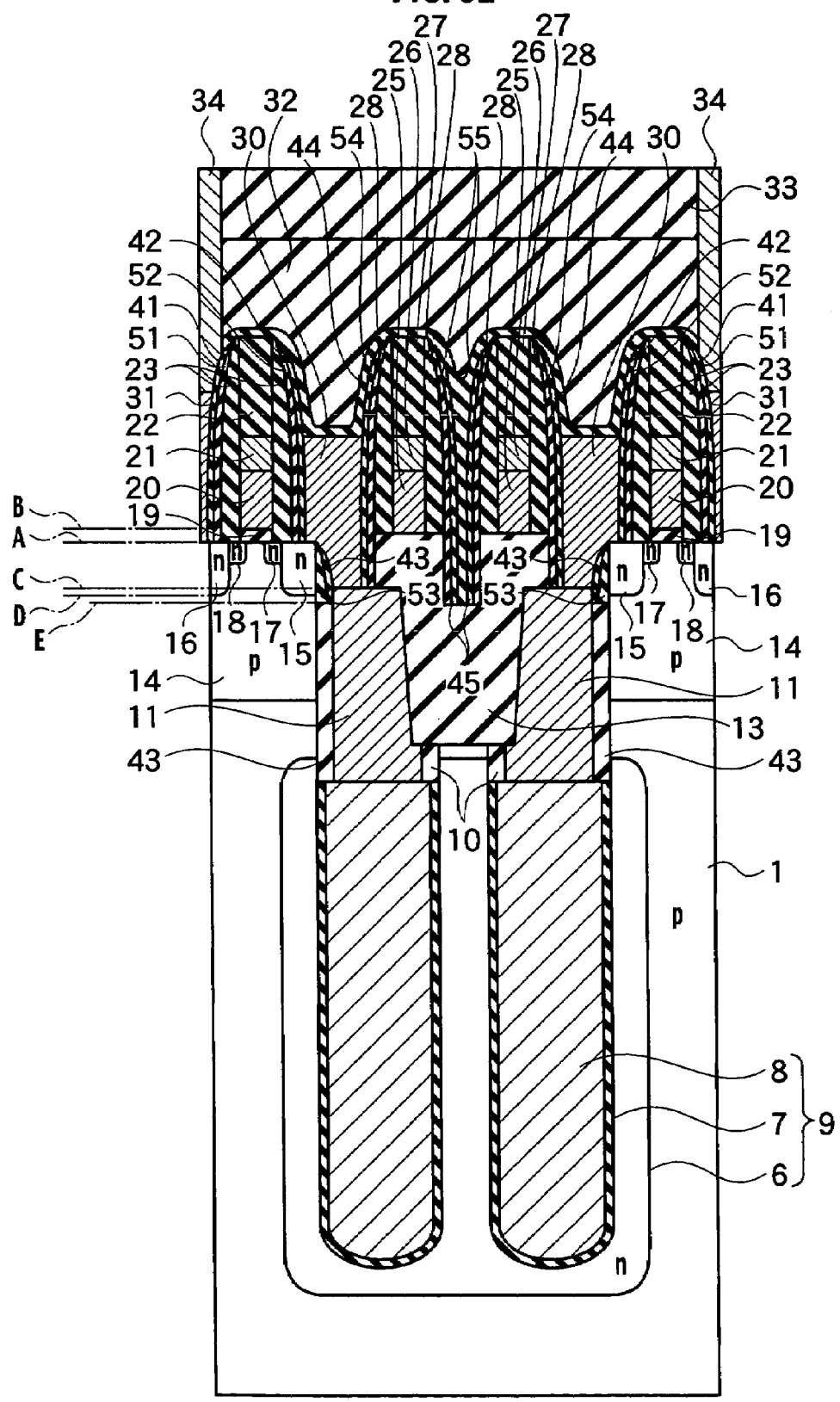
FIG. 52 is a cross-sectional diagram of a semiconductor device according to a sixth embodiment cut along the line II-II of FIG. 1.
Figure 53:
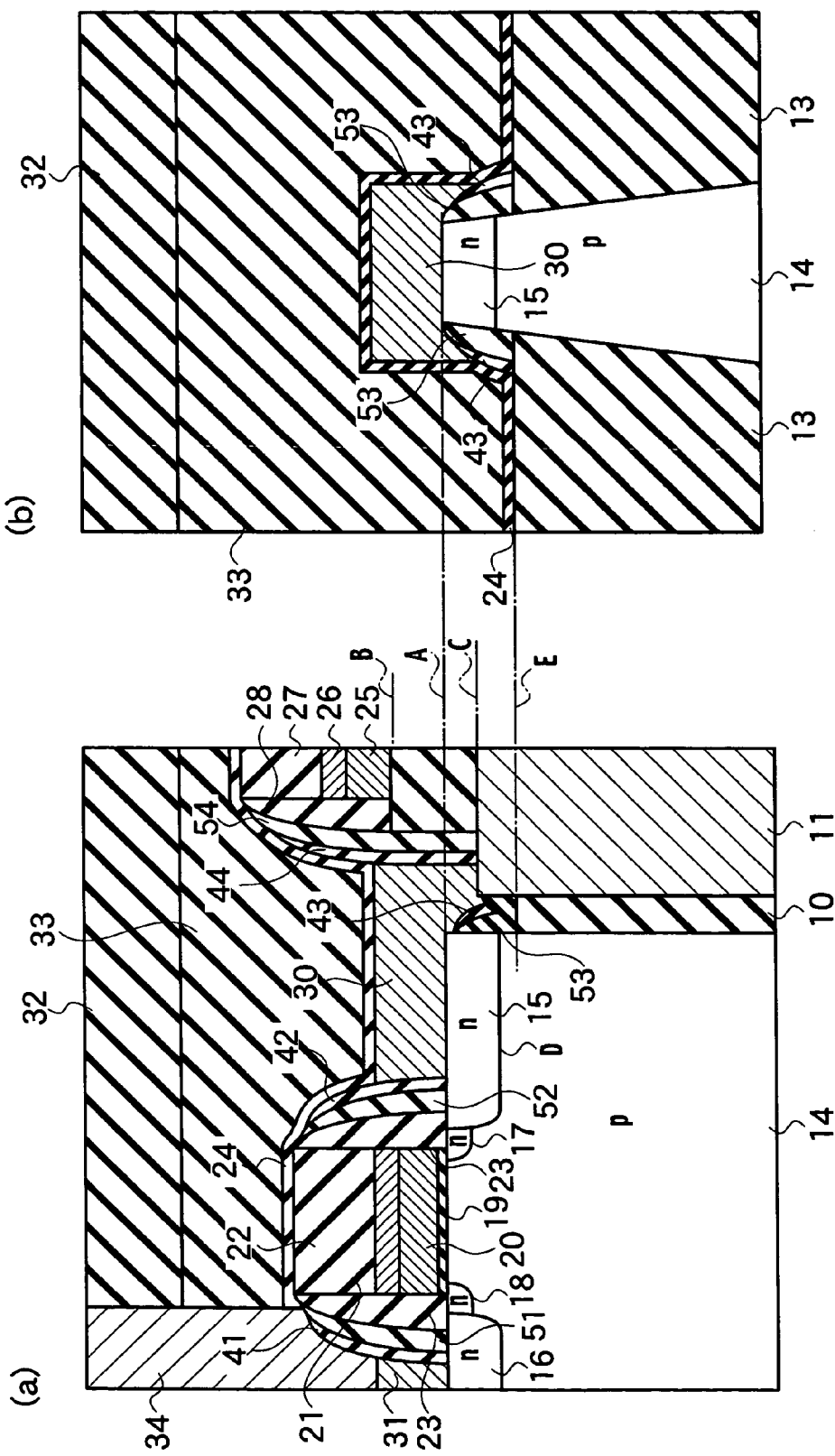
FIG. 53(a) is an enlarged view of FIG. 52.
FIG. 53(b) is a cross-sectional diagram of the semiconductor device according to the sixth embodiment cut along the line XXXIXB-XXXIXB of FIG. 1.

With a semiconductor device according to a sixth embodiment of the present invention, a top view is represented by FIG. 1 as with the first embodiment, and cross sections are represented by FIGS. 52 and 53. A difference with the semiconductor device of the sixth embodiment from the semiconductor device of the fifth embodiment is the structure around the spacers 41 through 45, especially the spacers 43.

With the sixth embodiment, spacers 41 through 45 and 51 through 55 include spacers 51 through 55, provided as a silicon oxide film, and spacers 41 through 45, which are provided as a silicon nitride film. The spacers 53 are arranged on the sides of the source regions 15, and the spacers 43 are arranged on the surfaces of the spacers 53.

As a result, the sides of the source regions 15 and the sides of the p-wells 14 are not in contact with the SS contacts 30, and the sides of the drain regions 16 and the sides of the p-wells 14 are not in contact with the pullout electrodes 31. Moreover, since the sides of the source regions 15 and the sides of the p-wells 14 cover the silicon oxide film spacers 53, the sides of the source regions 15 and the sides of the p-wells 14 are not in contact with the silicon nitride film spacers 43. Since the sides of the drain regions 15 and the sides of the p-wells 14 cover the silicon oxide film spacers 53, the sides of the source regions 15 and the sides of the p-wells 14 are not in contact with the silicon nitride film spacers 43. This structure allows reduction in the interfaces between the spacers 43 and 53 and the source regions 15 and the p-wells 14.

Furthermore, as with the first embodiment and the fifth embodiment, an impurity such as arsenic doped in the SS contacts 30 does not diffuse to the bottoms of the source regions 15 in the p-wells 14. Therefore, the threshold of the select transistors 15 through 23 does not reduce, and punch-through does not develop.

A semiconductor device fabrication method according to the sixth embodiment is described forthwith. The semiconductor device fabrication method according to the sixth embodiment uses the same initial steps (a) through (c) as in the semiconductor device fabrication method according to the first embodiment, the steps (a) and (b) as in the semiconductor device fabrication method according to the second embodiment, and further uses the initial steps (a) and (b) of the semiconductor device fabrication method according to the fifth embodiment.

(a) A silicon oxide film is deposited with a thickness of approximately 15 nm through CVD using TEOS. The silicon oxide film is etched back, forming the spacers 51 through 55. A silicon nitride film is deposited through CVD with a thickness of approximately 10 nm. The silicon nitride film is etched back, forming the spacers 41 through 45. Note that the silicon oxide film and the silicon nitride film may be etched back after they have been deposited.

Figure 54:
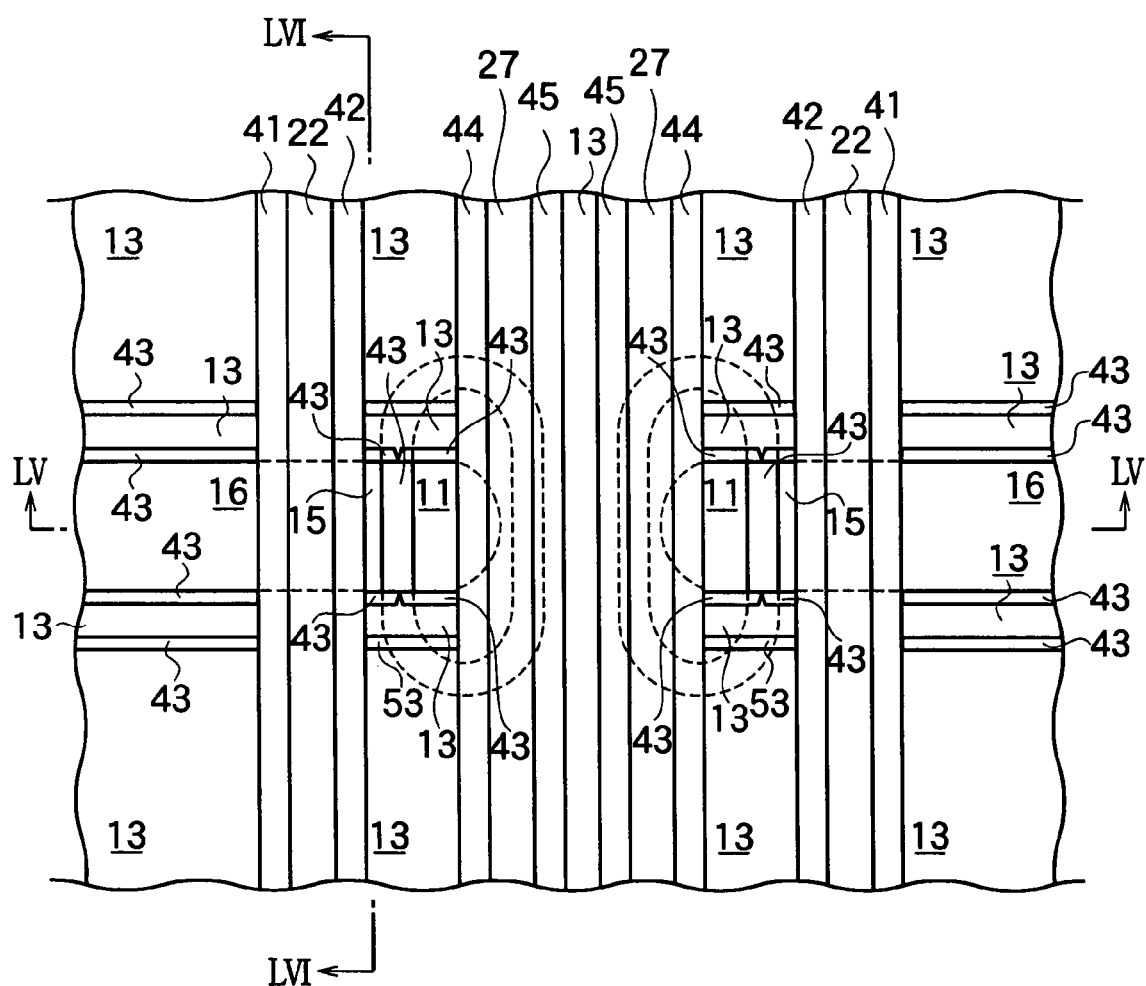
FIG. 54 is a top view of the semiconductor device according to the sixth embodiment in the course of fabrication.
Figure 55:
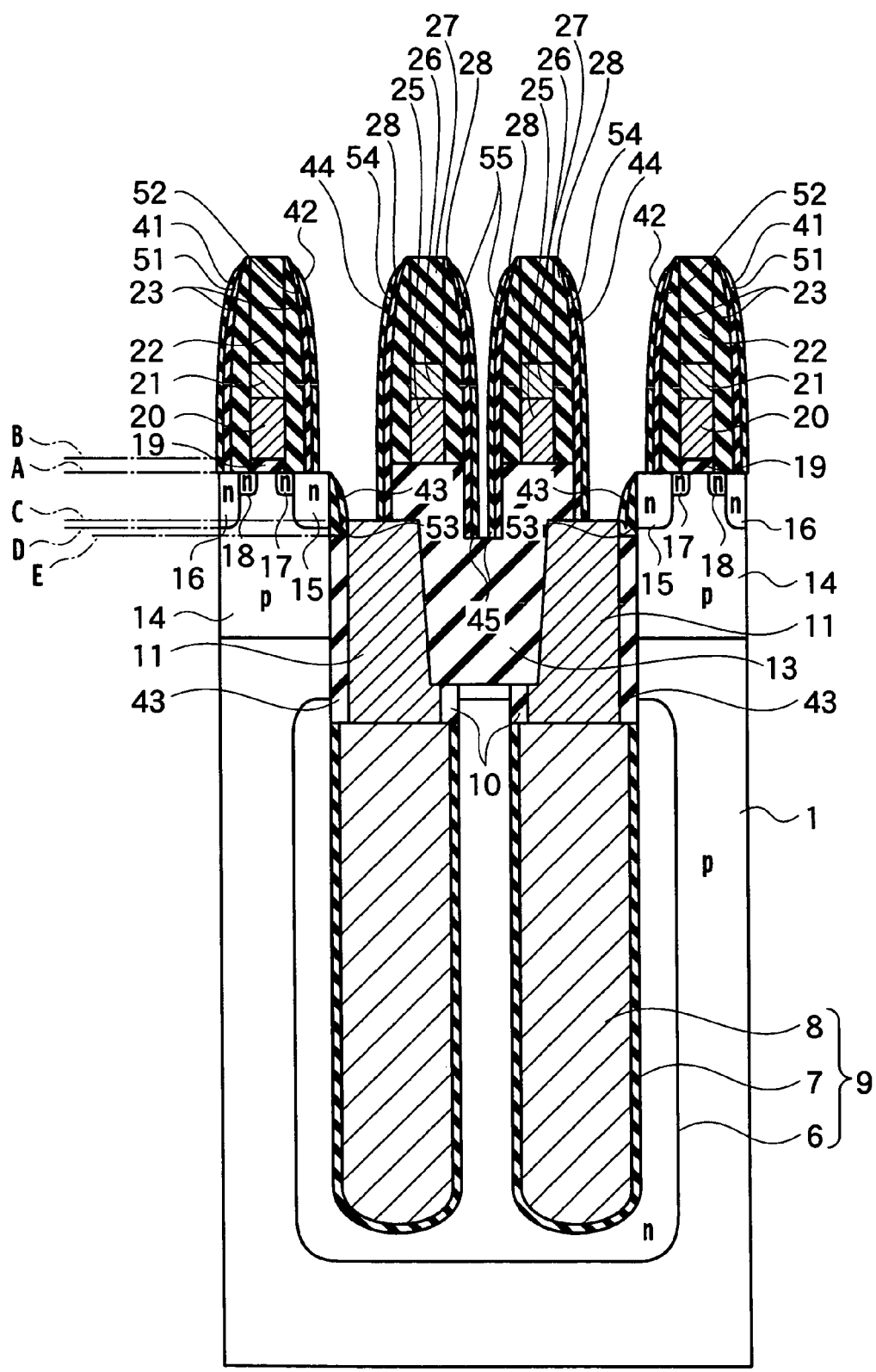
FIG. 55 is a cross-sectional diagram of the semiconductor device, according to the sixth embodiment in the course of fabrication, cut along the line LV-LV of FIG. 54.
Figure 56:
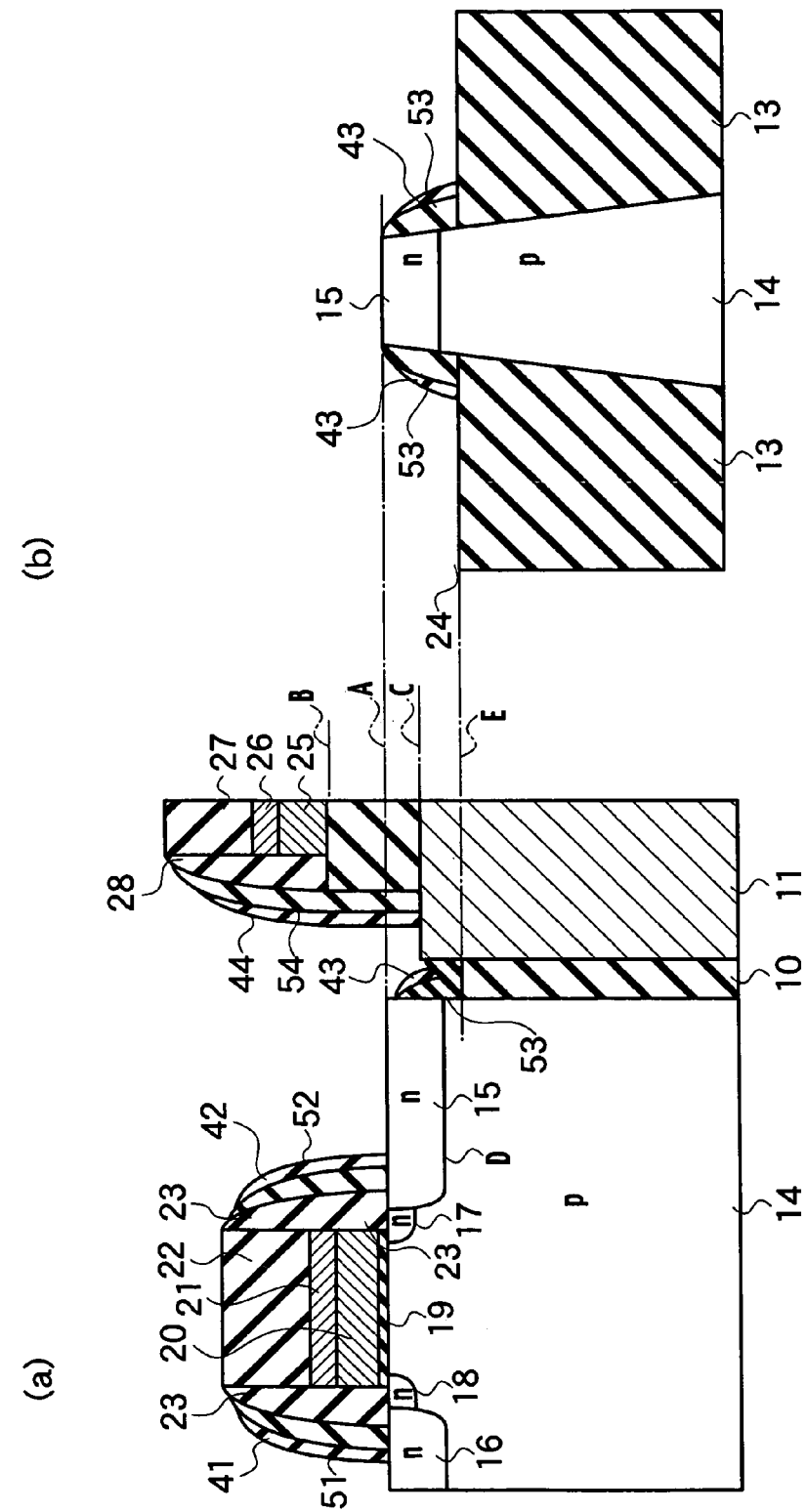
FIG. 56(a) is an enlarged view of FIG. 55.
FIG. 56(b) is a cross-sectional diagram of the semiconductor device according to the sixth embodiment in the course of fabrication cut along the line LVI-LVI of FIG. 54.

As shown in FIGS. 54 through 56, the spacers 53 remain on the sides of the source regions 15, the sides of the storage nodes 11 and the sides of the drain regions 16. The sides of the source regions 15, the sides of the storage nodes 11, and the sides of the drain regions 16 are not exposed. The spacers 51 and 52 remain on the sides of the sidewalls 23. The spacers 54 and 55 remain on the sides of the sidewalls 28 and the sides of the STI 13. The spacers 43 remain upon the spacers 53. The spacers 43 are not in contact with the sides of the source regions 15, the sides of the storage nodes 11, and the sides of the drain regions 16. The spacers 41 and 42 remain on the sides of the spacers 51 and 52. The spacers 44 and 45 remain on the sides of the spacers 54 and 55.

Figure 57:
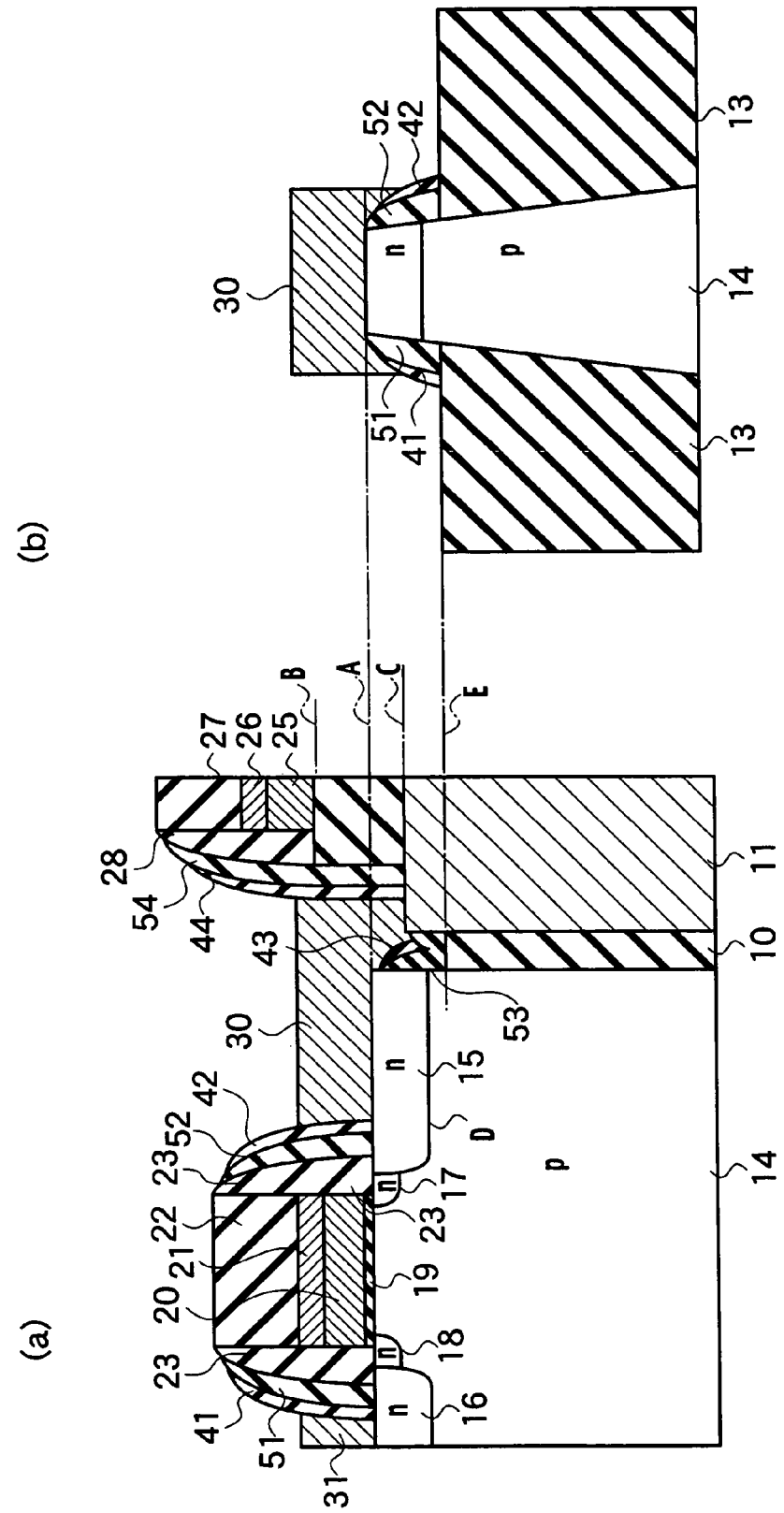
FIG. 57 is a cross-sectional diagram of the semiconductor device according to the sixth embodiment in the course of fabrication.

(b) Before deposition of the SS contacts 30 and the pullout electrodes 31, natural oxide films formed on the surfaces of the source regions 15 and the storage nodes 11 are removed. As shown in FIG. 57, an arsenic-doped polysilicon film is deposited so as to form the SS contacts 30 and the pullout electrodes 31. The SS contacts 30 are not in contact with the sides of the source regions 15 and the p-wells 14. Patterns of the SS contacts 30 and the pullout electrodes 31 are formed in the resist film through photolithography, and the SS contacts 30 are etched using the resist film as a mask. The SS contacts 30 and the pullout electrodes 31 are separated.

(c) As shown in FIGS. 1, 52 and 53, the barrier nitride films 24 and the BPSG film 32 are deposited. The surface of the BPSG film 32 is smoothed, and the NSG film 33 is deposited through CVD using TEOS. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the sixth embodiment, a semiconductor device allowing small areas of the source regions on the semiconductor substrate can be provided. Also according to the sixth embodiment, a fabrication method for the semiconductor device allowing small areas of the source regions on the semiconductor substrate can be provided.

SEVENTH EMBODIMENT

Figure 58:
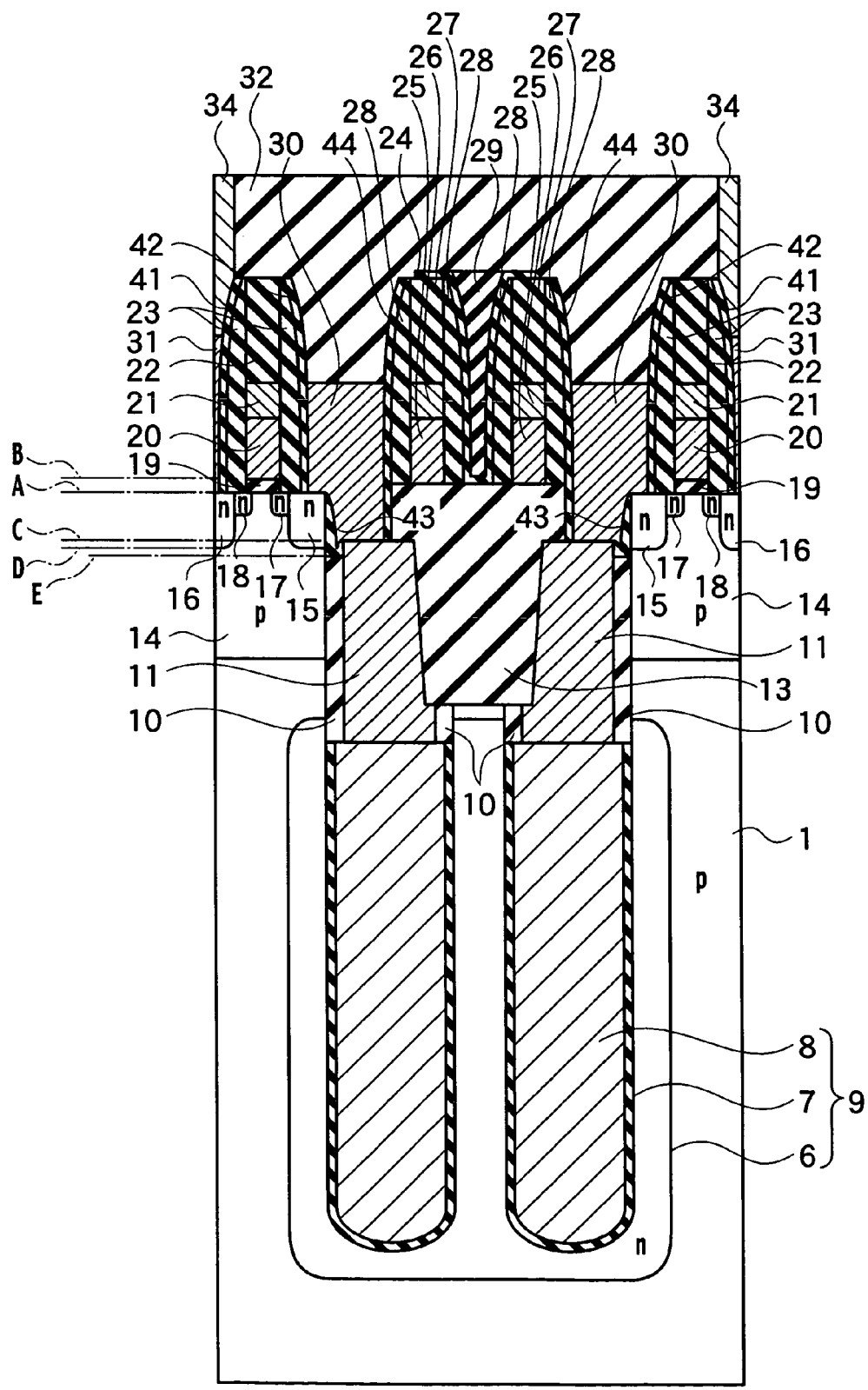
FIG. 58 is a cross-sectional diagram of a semiconductor device according to a seventh embodiment cut along the line II-II of FIG. 1.
Figure 59:
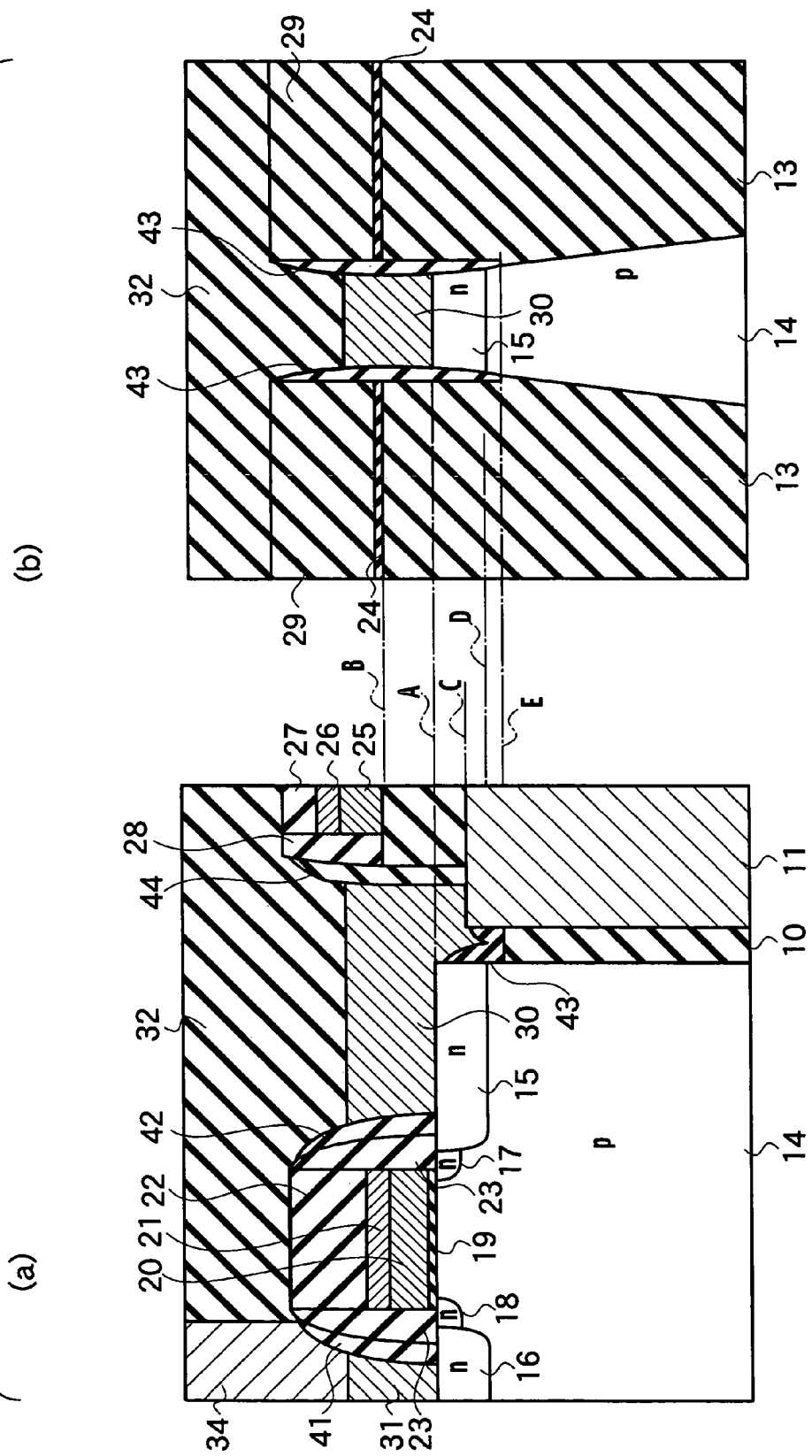
FIG. 59(a) is an enlarged view of FIG. 58.
FIG. 59(b) is a cross-sectional diagram of the semiconductor device according to the seventh embodiment cut along the line XXXIXB-XXXIXB of FIG. 1.

With a semiconductor device according to a seventh embodiment of the present invention, a top view is represented by FIG. 1 as with the first embodiment, and cross sections are represented by FIGS. 58 and 59. A difference with the semiconductor device of the seventh embodiment from the semiconductor device of the fifth embodiment is the structure around the spacers 41 through 45, especially the spacers 43.

With the seventh embodiment, the spacers 42 through 44 are in contact with the sides of the SS contacts 30. The spacers 41 are in contact with the sides of the pullout electrodes 31. Note that with the seventh embodiment, as with the fifth embodiment, the sides of the source regions 15 and the sides of the p-wells 14 are not in contact with the SS contacts 30, and the sides of the drain regions 16 and the sides of the p-wells 14 are not in contact with the pullout electrodes 31. An impurity such as arsenic doped in the SS contacts 30 and the pullout electrodes 31 does not diffuse to the bottoms of the source regions 15 and the drain regions 16 in the p-wells 14. Therefore, the threshold of the select transistors 15 through 23 does not reduce, and punchthrough does not develop.

A semiconductor device fabrication method according to the seventh embodiment is described forthwith. The semiconductor device fabrication method according to the seventh embodiment uses some of the same steps as with the semiconductor device fabrication method according to the first embodiment, and the semiconductor device fabrication method according to the second and fifth embodiments.

Figure 60:
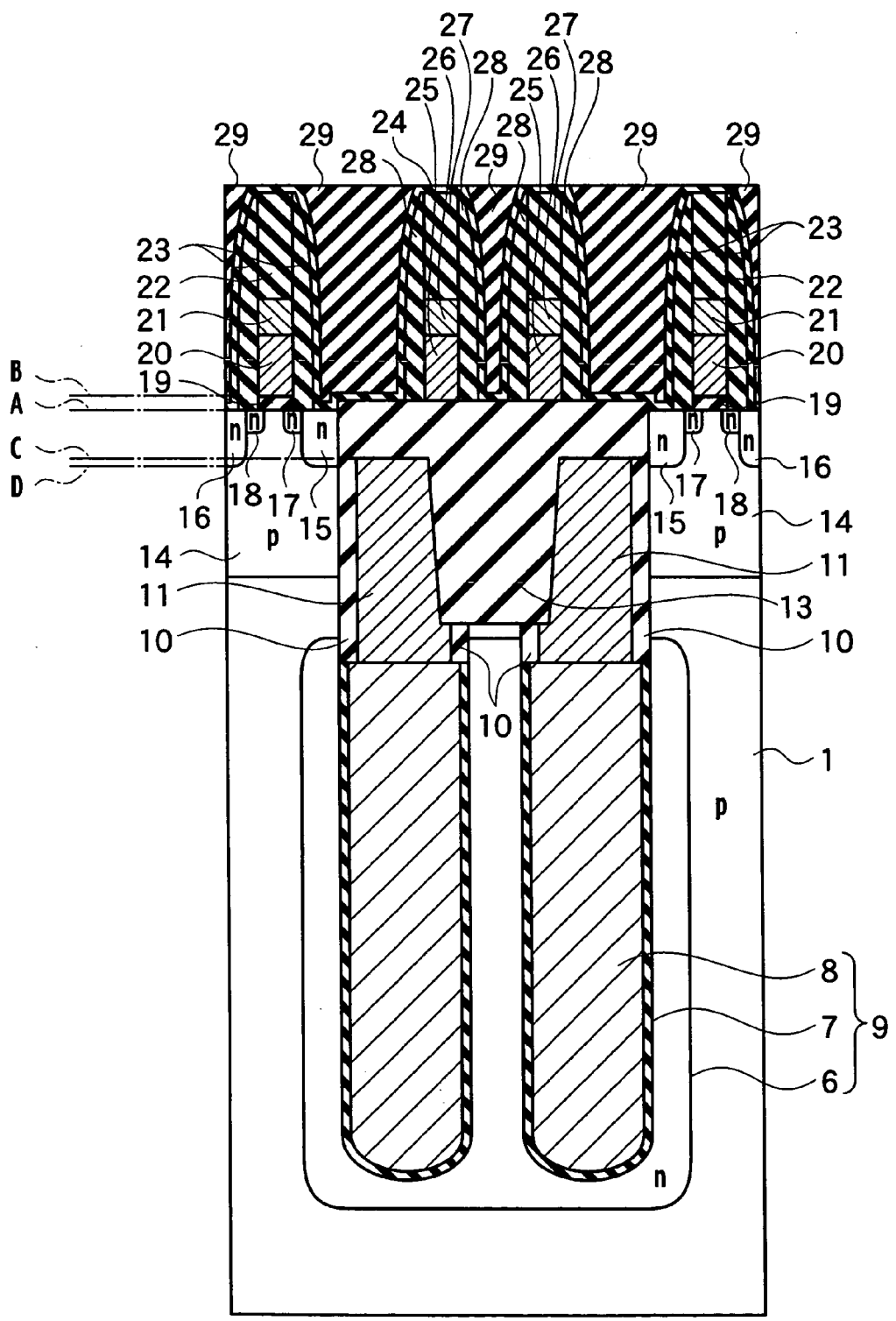
FIG. 60 is a cross-sectional diagram of the semiconductor device according to the seventh embodiment cut along the line II-II of FIG. 1.
Figure 61:
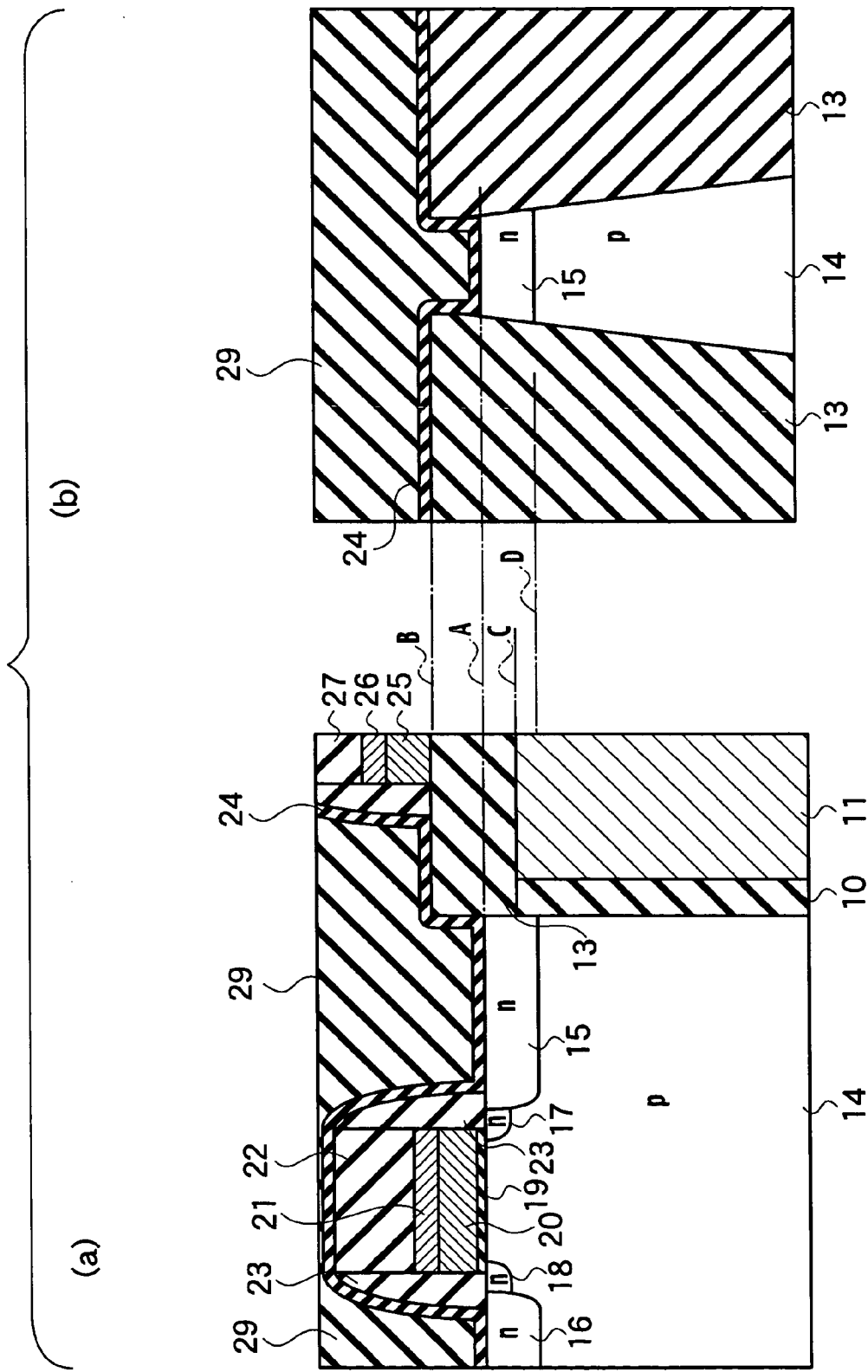
FIG. 61(a) is an enlarged view of FIG. 60.
FIG. 61(b) is a cross-sectional diagram of the semiconductor device according to the seventh embodiment cut along the line XXXIXB-XXXIXB of FIG. 1.

(a) As shown in FIGS. 60 and 61, a barrier nitride film 24 is deposited through CVD. A BPSG film is deposited as the interlayer insulator films 29 upon the barrier nitride film 24 through CVD. The BPSG film is removed through CMP until reaching the height of the tops of the barrier nitride film 24 upon the silicon nitride films 22 and 27.

Figure 62:
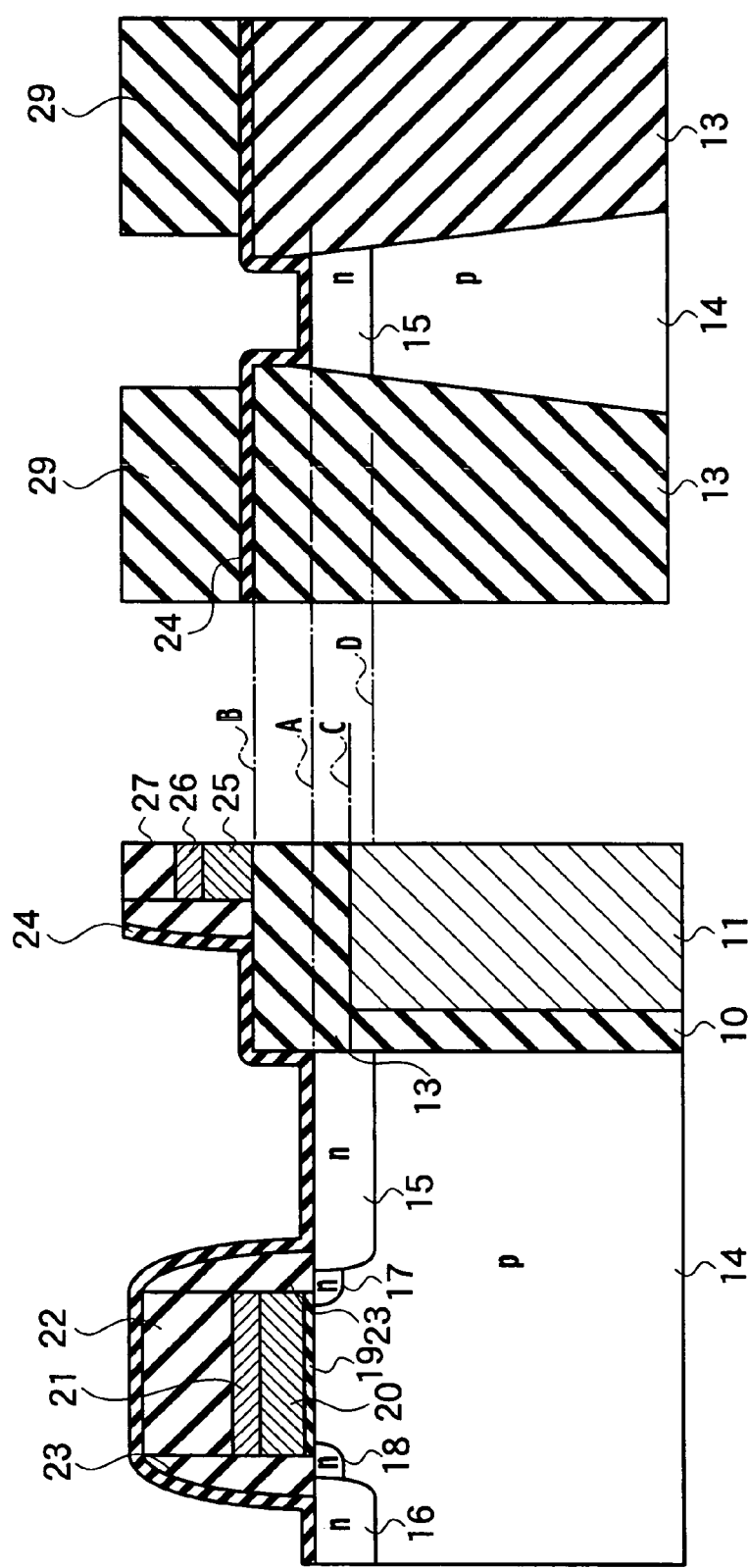
FIG. 62 is a cross-sectional diagram of the semiconductor device according to the seventh embodiment in the course of fabrication.

(b) As shown in FIG. 62, a negative pattern of the SS contacts 30 and the pullout electrodes 31 is formed in the resist film through photolithography, and the interlayer insulator films 29 are etched using the resist film as a mask and the barrier nitride film 24 as a stopper.

Figure 63:
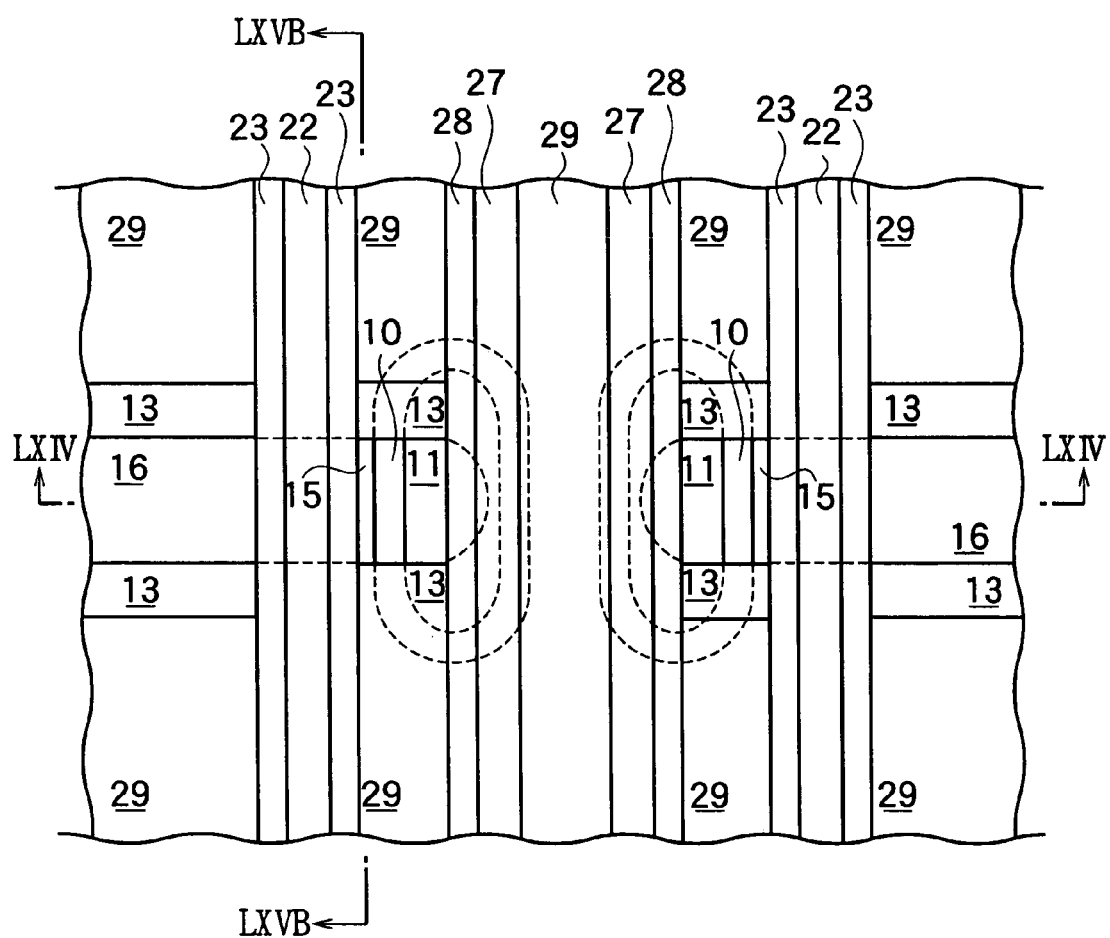
FIG. 63 is a top view of the semiconductor device according to the seventh embodiment in the course of fabrication.
Figure 64:
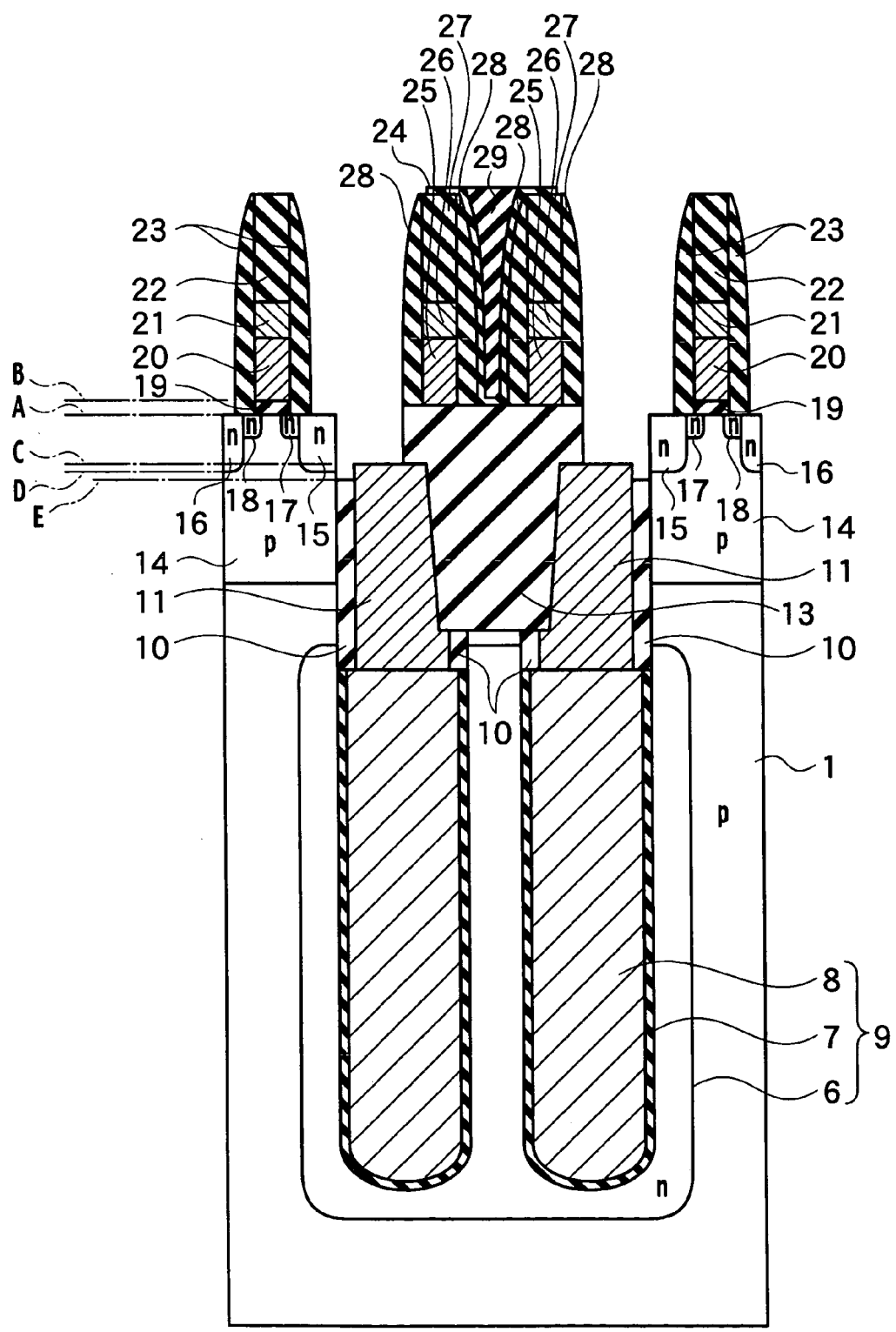
FIG. 64 is a cross-sectional diagram of the semiconductor device, according to the seventh embodiment in the course of fabrication, cut along the line LXIV-LXIV of FIG. 63.
Figure 65:
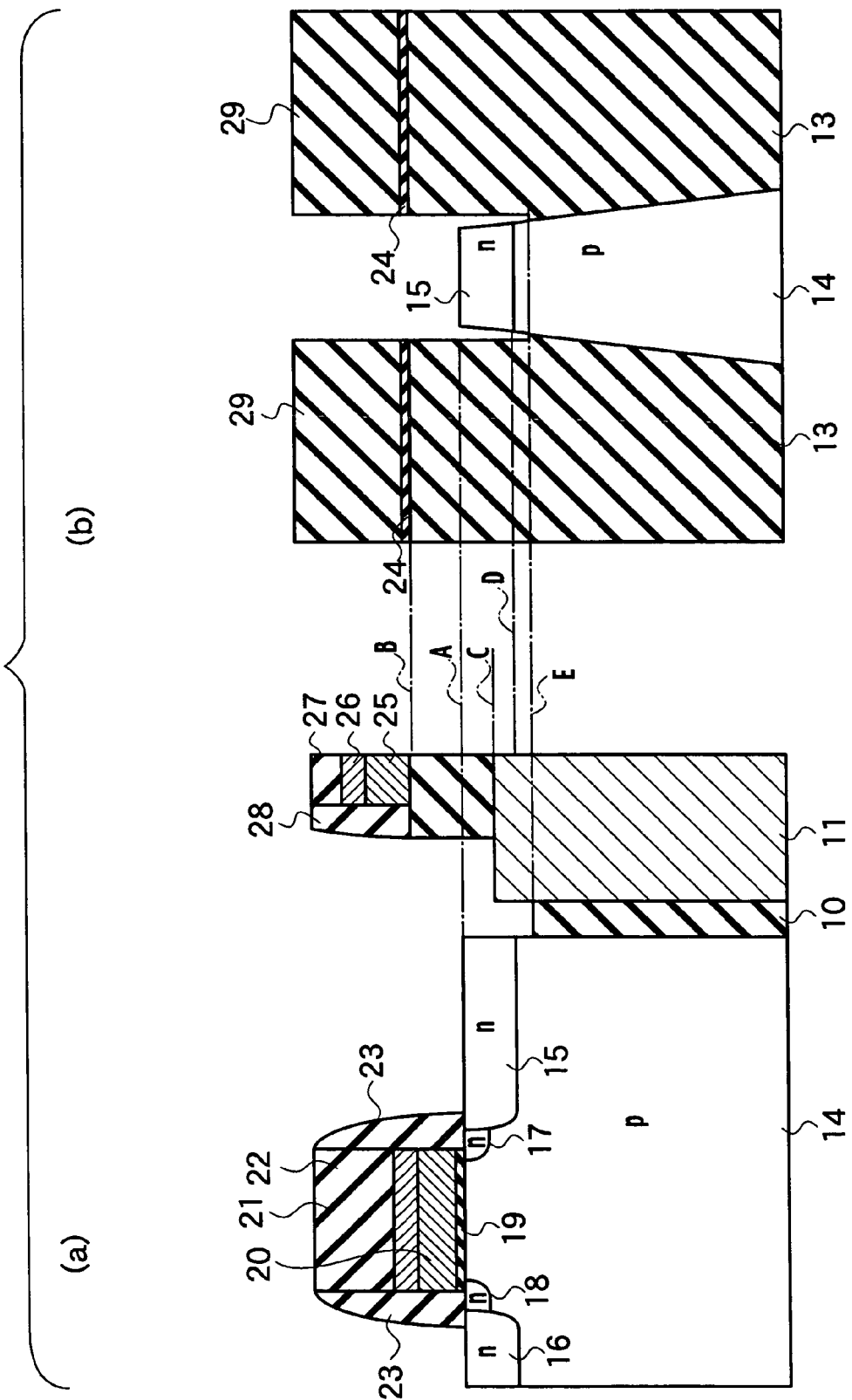
FIG. 65(a) is an enlarged view of FIG. 64.
FIG. 65(b) is a cross-sectional diagram of the semiconductor device according to the seventh embodiment cut along the line LXVB-LXVB of FIG. 63.

(c) As shown in FIGS. 63 through 65, the barrier nitride film 24 and the TTO of the STI 13 in areas becoming the SS contacts 30 and the pullout electrodes 31 are etched using dry etching techniques such as RIE using the storage nodes 11 as a stopper. The storage nodes 11 are exposed. The source regions 15 and the drain regions 16 are already exposed before being etched. By over etching, the height of the tops (surface E) of the STI 13 and the collar oxide films 10 becomes lower than that of the tops (surface C) of the storage nodes 11. Furthermore, the height of the tops (surface E) of the STI 13 and the collar oxide films 10 becomes lower than that of the bottoms (surface D) of the source regions 15. Accordingly, the source regions 15, the sides of the p-wells 14, and the sides of the storage nodes 11 are exposed.

Figure 66:
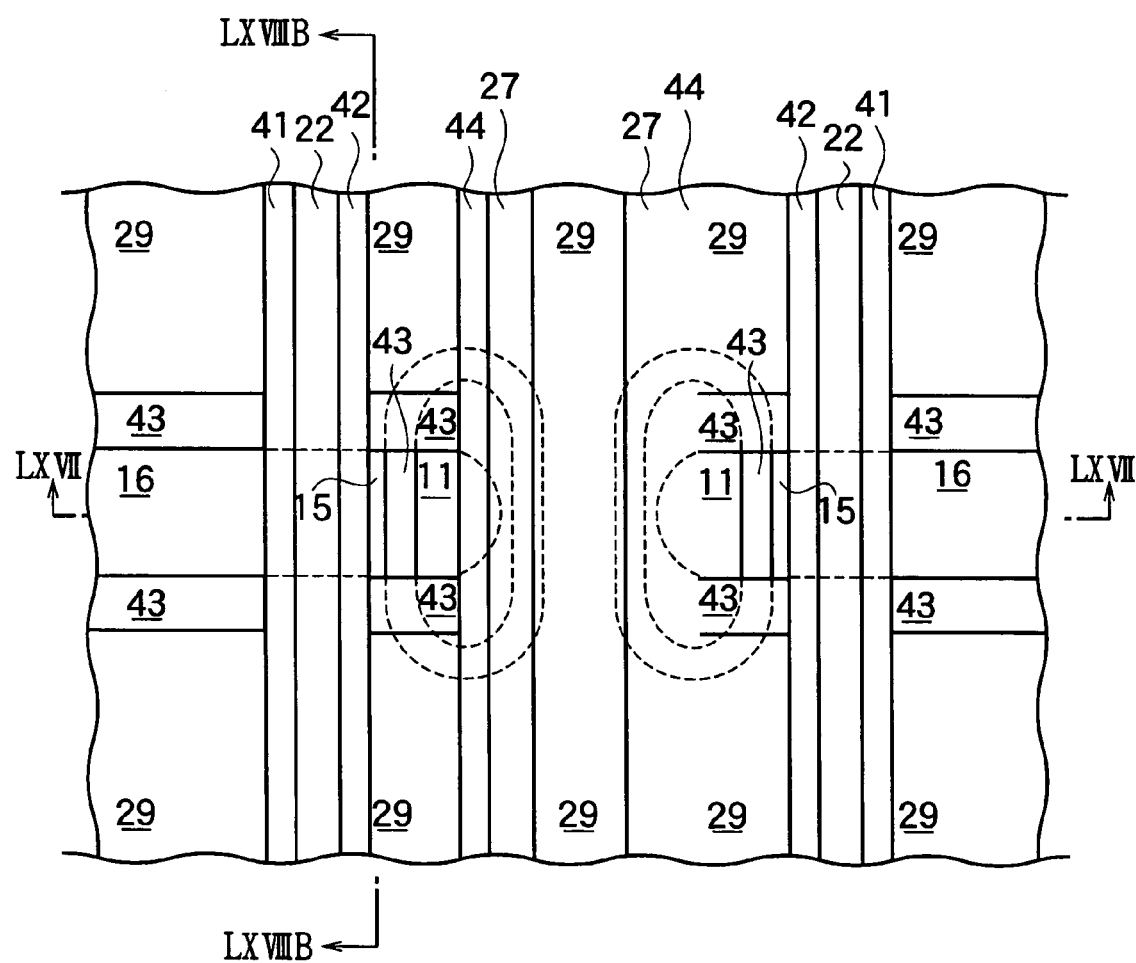
FIG. 66 is a top view of the semiconductor device according to the seventh embodiment in the course of fabrication.
Figure 67:
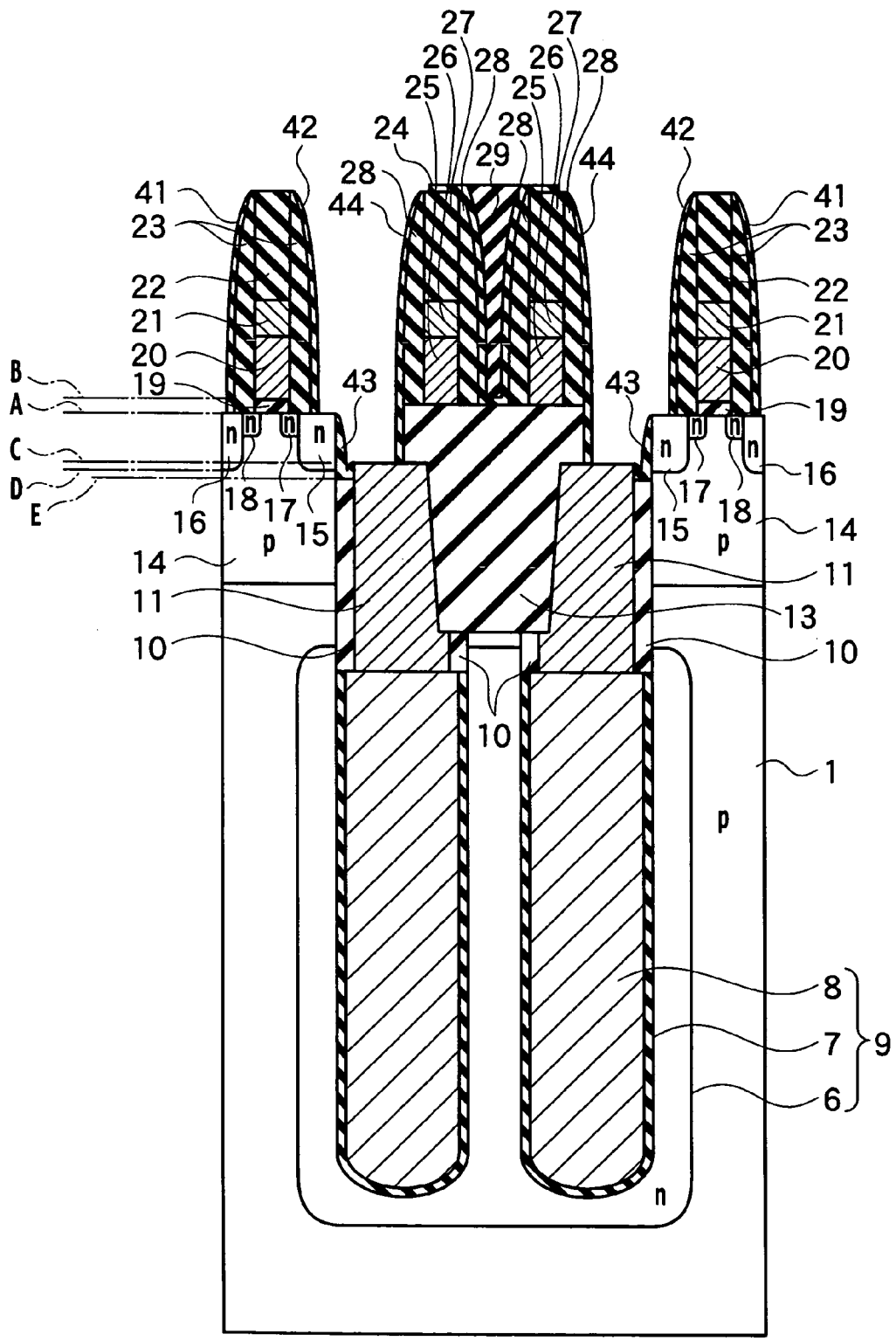
FIG. 67 is a cross-sectional diagram of the semiconductor device, according to the seventh embodiment in the course of fabrication, cut along the line LXVII-LXVII of FIG. 66.
Figure 68:
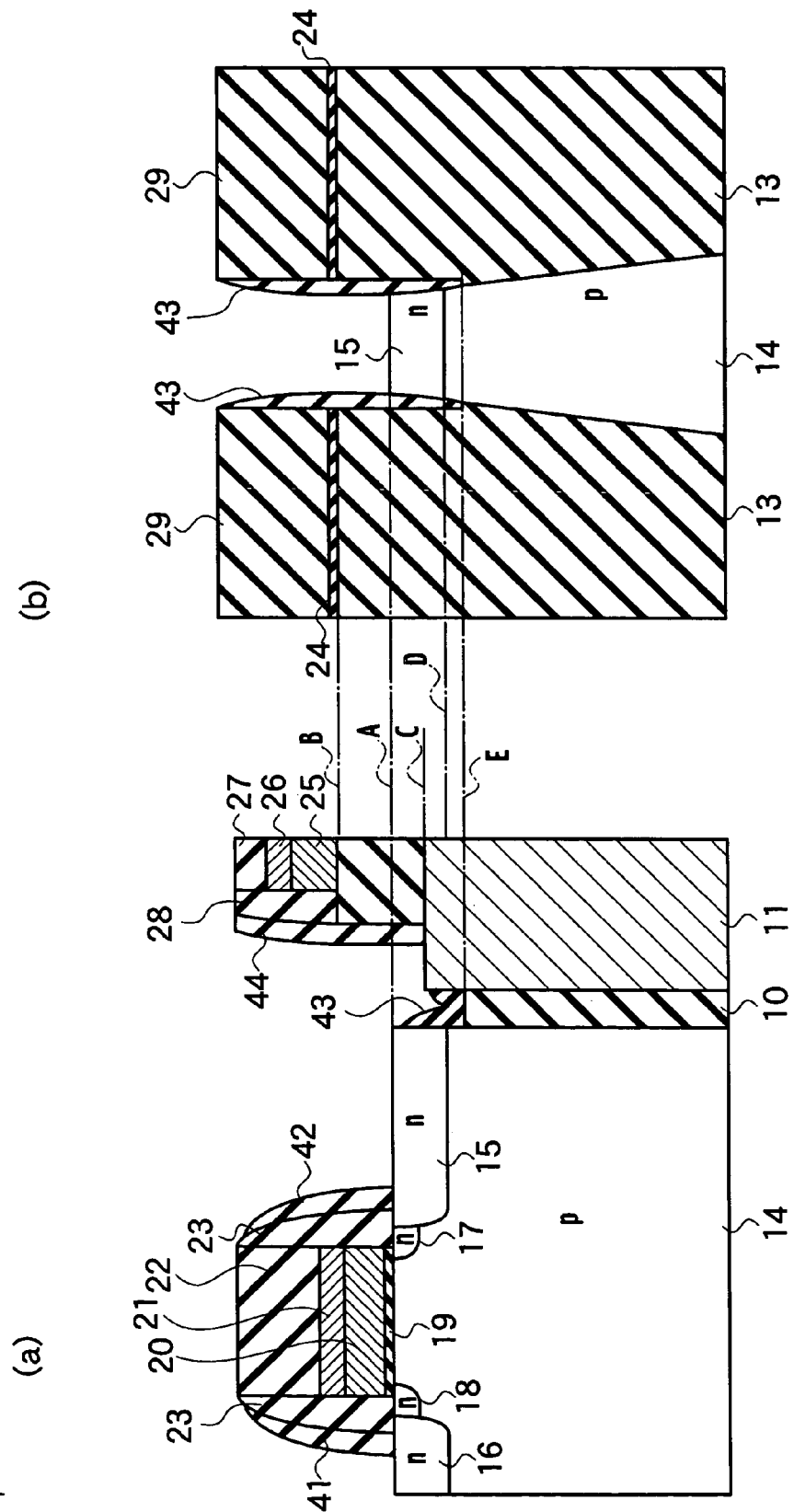
FIG. 68(a) is an enlarged view of FIG. 67.
FIG. 68(b) is a cross-sectional diagram of the semiconductor device according to the seventh embodiment cut along the line LXVIIIB-LXVIIIB of FIG. 66.

(d) A silicon nitride film, which becomes the spacers 41 through 44, is deposited through CVD with a thickness of approximately 10 nm. The silicon nitride film is etched back through isotropic etching such as RIE. As shown in FIGS. 66 through 68, the spacers 43 remain on the sides of the source regions 15, the sides of the storage nodes 11, the sides of the STI 13, the sides of the interlayer insulator films 29, and the sides of the drain regions 16. The spacers 43 remain upon the collar oxide films 10 and the STI 13. The sides of the source regions 15, the sides of the storage nodes 11, and the sides of the drain regions 16 are not exposed. The spacers 41 and 42 remain on the sides of the sidewalls 23. The spacers 44 remain on the sides of the sidewalls 28 and the sides of the STI 13.

Figure 69:
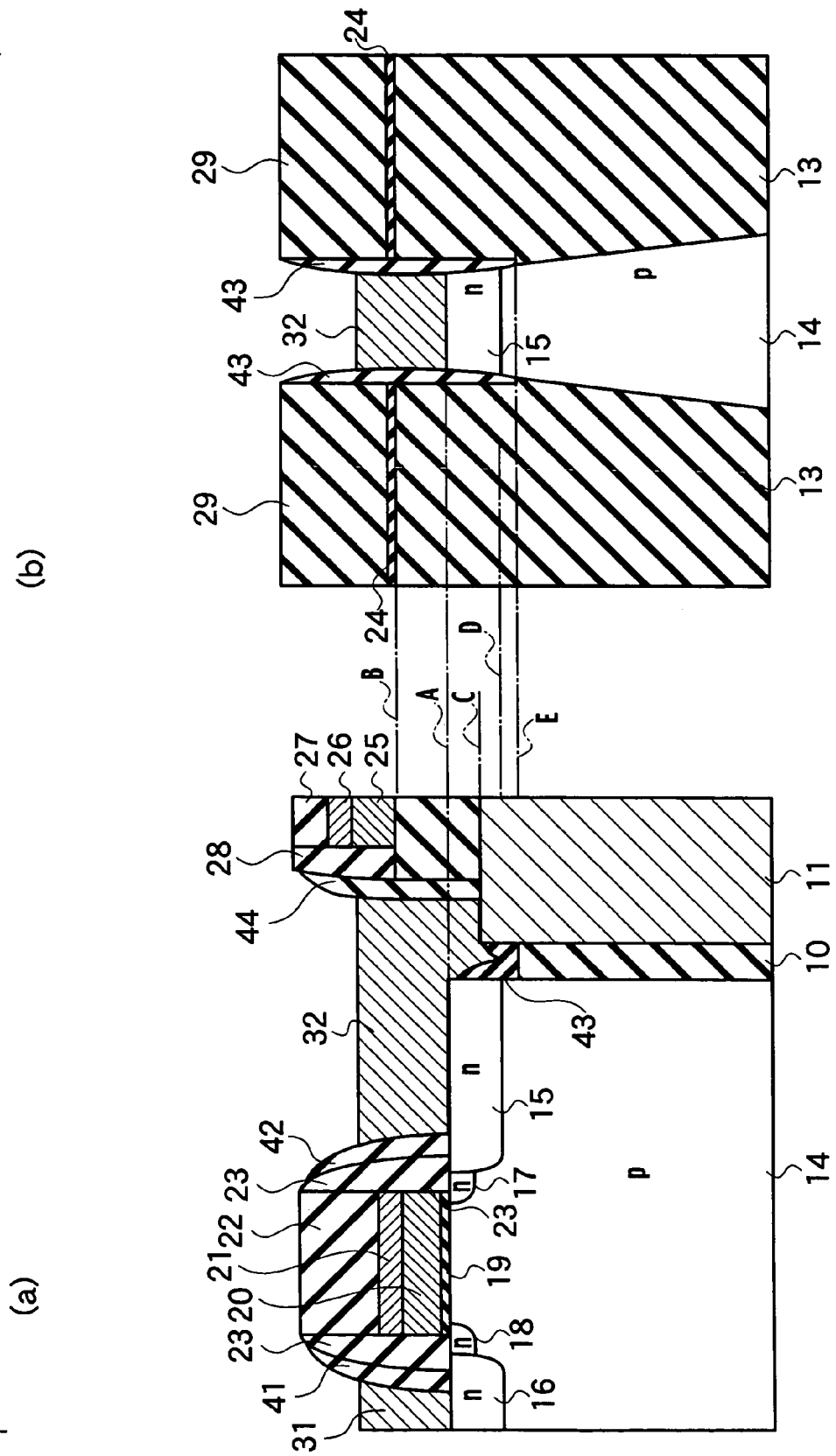
FIG. 69 is a cross-sectional diagram of the semiconductor device according to the seventh embodiment in the course of fabrication.

(e) Before deposition of the SS contacts 30 and the pullout electrodes 31, natural oxide films formed on the drain regions 16 and the surface of the storage nodes 11 are removed. As shown in FIG. 69, an arsenic-doped polysilicon film is deposited, the surface thereof is smoothened through CMP, and is etched back. The height of the tops of the SS contacts 30 and the pullout electrodes 31 is approximately 50 nm below the tops of the silicon nitride films 22 and 27, respectively. The SS contacts 30 and the pullout electrodes 31 are separated. The SS contacts 30 are not in contact with the sides of the source regions 15 and the p-wells 14.

(f) As shown in FIGS. 1, 58 and 59, an NSG film 32 is deposited through CVD using TEOS. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the seventh embodiment, a semiconductor device allowing small areas of the source regions on the semiconductor substrate can be provided. Also according to the seventh embodiment, a fabrication method for the semiconductor device allowing small areas of the source regions on the semiconductor substrate can be provided.

EIGHTH EMBODIMENT

Figure 70:
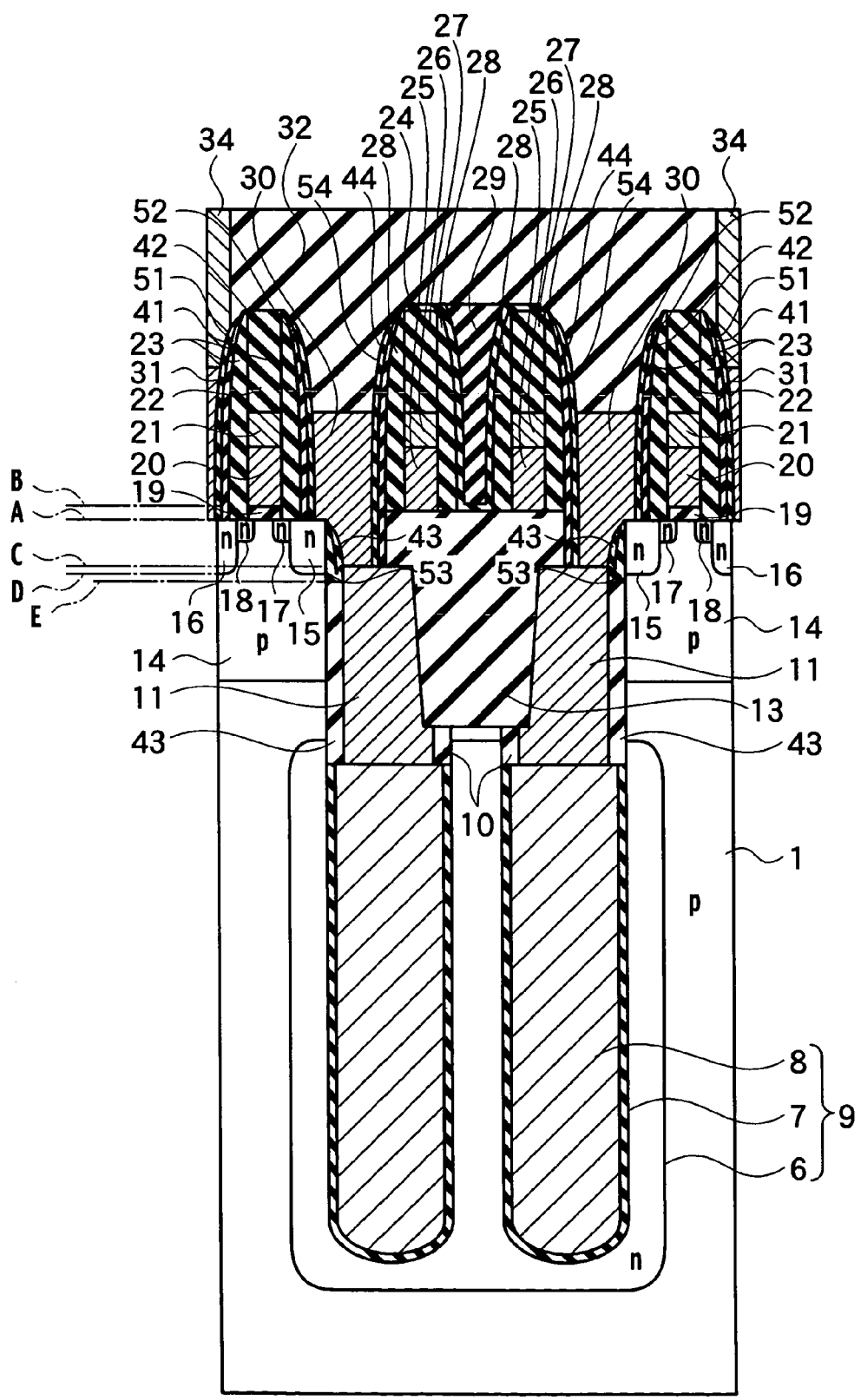
FIG. 70 is a cross-sectional diagram of a semiconductor device according to an eighth embodiment cut along the line II-II of FIG. 1.

With a semiconductor device according to an eighth embodiment of the present invention, a top view is represented by FIG. 1 as with the first embodiment, and cross sections are represented by FIGS. 70 and 71. A difference with the semiconductor device of the eighth embodiment from the semiconductor device of the seventh embodiment is the structure around the spacers 41 through 44, especially the spacers 43.

With the eighth embodiment, the spacers 41 through 44 and 51 through 54 include the spacers 51 through 54, which are made of a silicon oxide film, and the spacers 41 through 44, which are made of a silicon nitride film. The spacers 53 are arranged on the sides of the source regions 15, and the spacers 43 are arranged on the surfaces of the spacers 53.

As a result, the sides of the source regions 15 and the sides of the p-wells 14 are not in contact with the SS contacts 30, and the sides of the drain regions 16 and the sides of the p-wells 14 are not in contact with the pullout electrodes 31. Moreover, since the sides of the source regions 15 and the sides of the p-wells 14 cover the spacers 53 made of a silicon oxide film, the sides of the source regions 15 and the sides of the p-wells 14 are not in contact with the spacers 43 made of a silicon nitride film. Since the sides of the drain regions 15 and the sides of the p-wells 14 cover the spacers 53 made of a silicon oxide film, the sides of the source regions 15 and the sides of the p-wells 14 are not in contact with the spacers 43 made of a silicon nitride film. This allows reduction in the interface state at the interfaces between the spacers 43 and 53 and the source regions 15 and the p-wells 14.

Furthermore, as with the first embodiment and the fifth embodiment, an impurity such as arsenic doped in the SS contacts 30 does not diffuse to the bottoms of the source regions 15 in the p-wells 14. Therefore, the threshold of the select transistors 15 through 23 does not reduce, and punch-through does not develop.

A semiconductor device fabrication method according to the eighth embodiment is described forthwith. The semiconductor device fabrication method according to the eighth embodiment uses the same initial steps as in the semiconductor device fabrication method according to the first, second, fifth and seventh embodiments.

(a) A silicon oxide film is deposited with a thickness of approximately 15 nm through CVD using TEOS. The silicon oxide film is etched back, forming the spacers 51 through 54. A silicon nitride film is deposited through CVD with a thickness of approximately 10 nm. The silicon nitride film is etched back, forming the spacers 41 through 44. Note that the silicon oxide film and the silicon nitride film may be etched back after they have been deposited.

Figure 72:
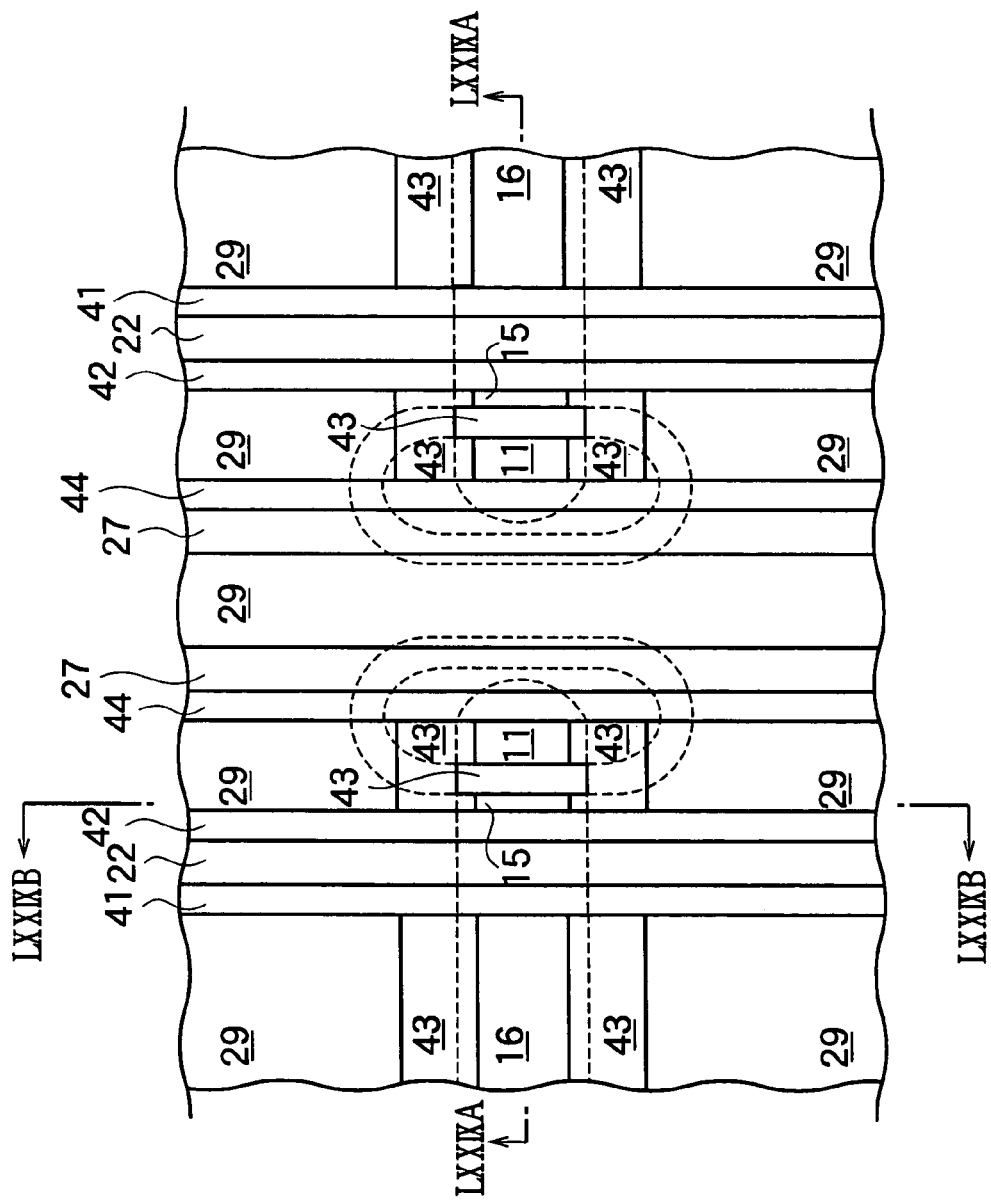
FIG. 72 is a top view of the semiconductor device according to the eighth embodiment in the course of fabrication.
Figure 73:
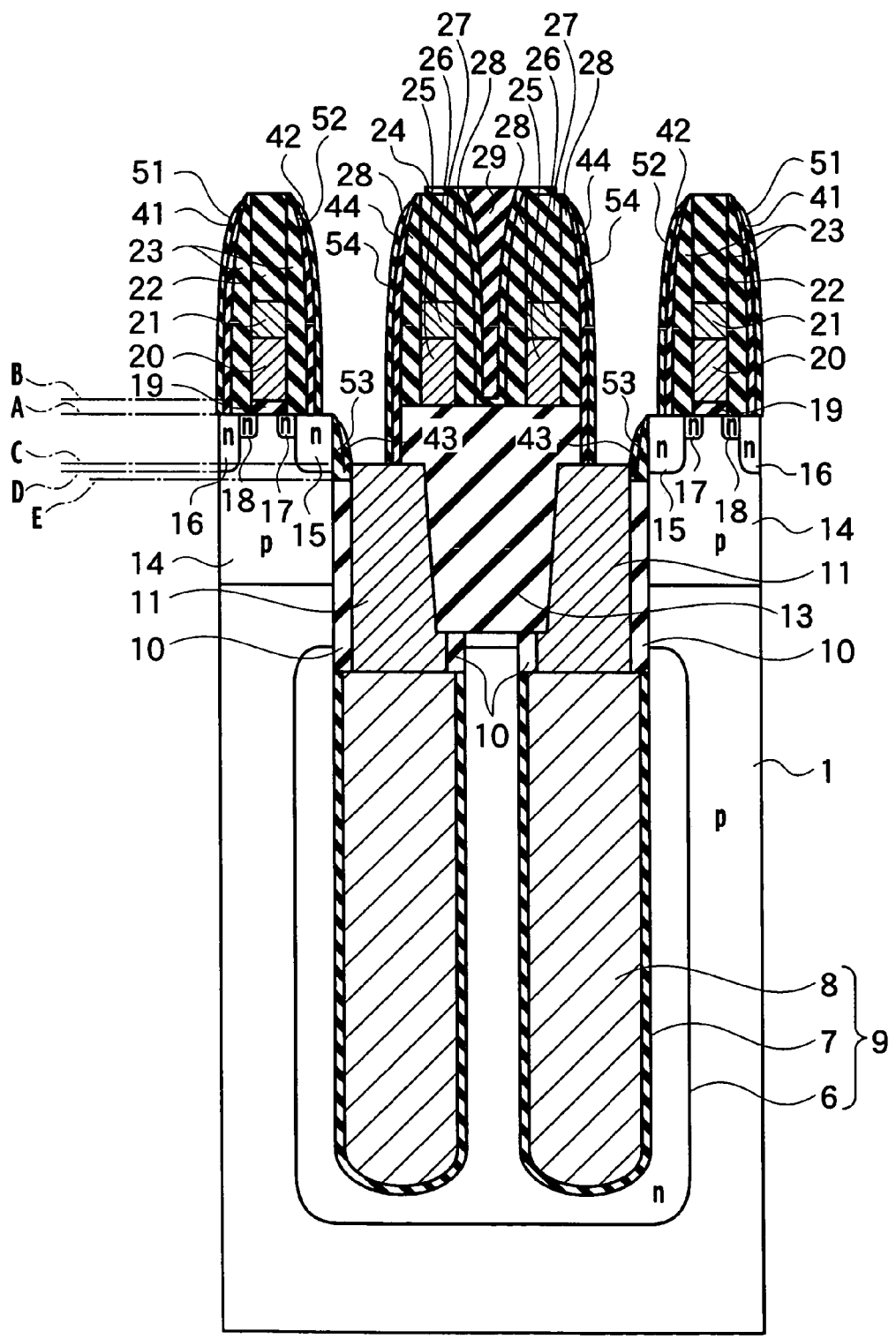
FIG. 73 is a cross-sectional diagram of the semiconductor device according to the eighth embodiment cut along the line LXXIVA-LXXIVA of FIG. 72.

As shown in FIGS. 72 through 74, the spacers 53 remain on the sides of the source regions 15, the sides of the storage nodes 11, the sides of the p-wells 14, the sides of the STI 13, and the sides of the drain regions 16. The spacers 53 are arranged upon the collar oxide films 10 and the STI 13. The sides of the source regions 15, the sides of the p-wells 14, the sides of the storage nodes 11, and the sides of the drain regions 16 are not exposed. The spacers 51 and 52 remain on the sides of the sidewalls 23. The spacers 54 remain on the sides of the sidewalls 28 and the sides of the STI 13. The spacers 43 remain upon the spacers 53, the source regions 15, and the drain regions 16. The spacers 43 are not in contact with the sides of the source regions 15, the sides of the storage nodes 11, and the sides of the drain regions 16. The spacers 41 and 42 remain on the sides of the spacers 51 and 52. The spacers 44 and 45 remain on the sides of the spacers 54 and 55.

Figure 75:
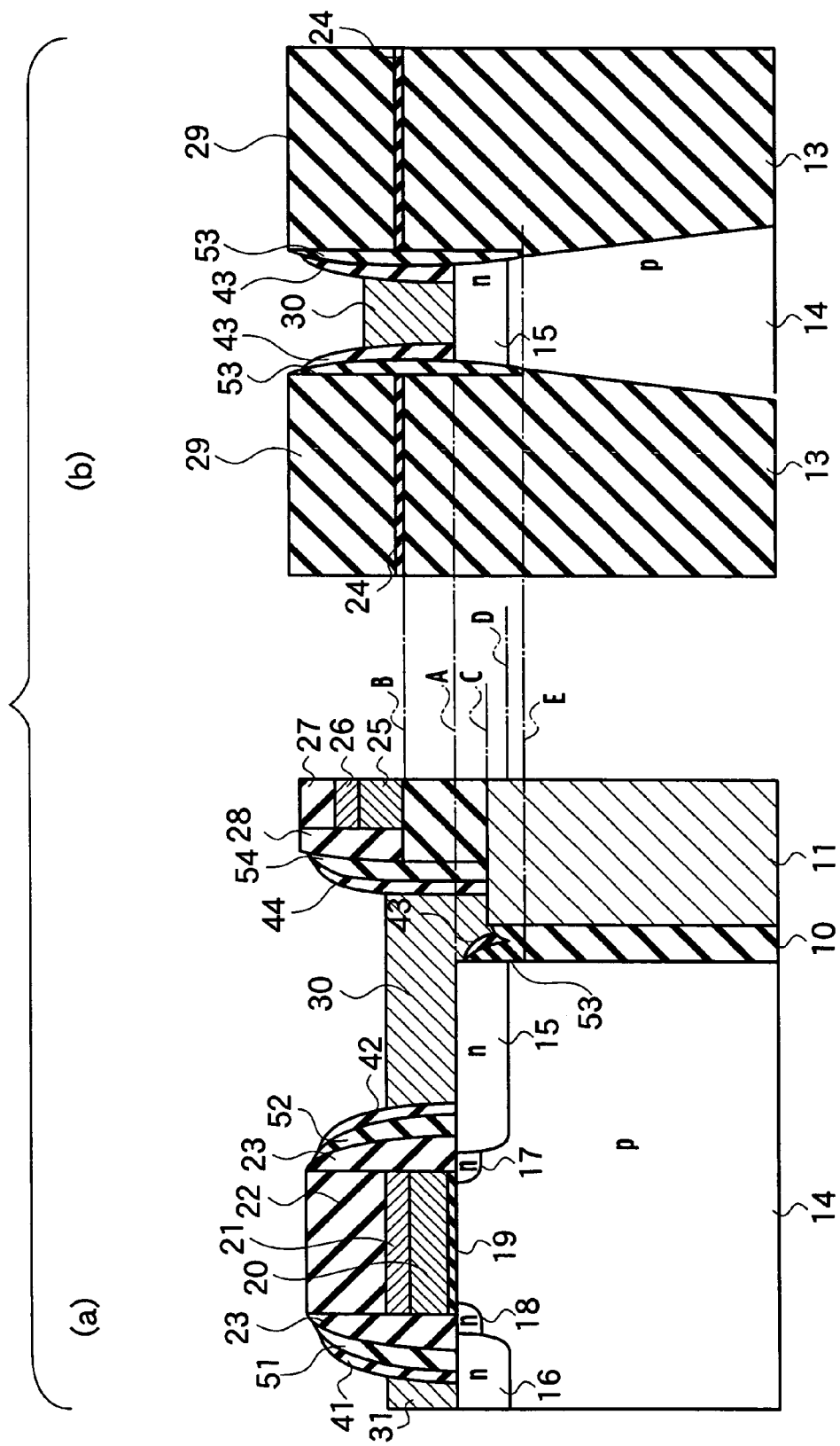
FIG. 75 is a cross-sectional diagram of the semiconductor device according to the eighth embodiment in the course of fabrication.

(b) Before deposition of the SS contacts 30 and the pullout electrodes 31, natural oxide films formed on the drain regions 16 and the surface of the storage nodes 11 are removed. As shown in FIG. 75, an arsenic-doped polysilicon film is deposited, the surface thereof is smoothed through CMP, and etched back. The SS contacts 30 and the pullout electrodes 31 are separated. The SS contacts 30 are not in contact with the sides of the source regions 15 and the p-wells 14.

(c) As shown in FIGS. 1, 70 and 71, an NSG film 32 is deposited through CVD using TEOS. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the eighth embodiment, a semiconductor device allowing small areas of the source regions on the semiconductor substrate can be provided. Also according to the eighth embodiment, a fabrication method for the semiconductor device allowing small areas of the source regions on the semiconductor substrate can be provided.

NINTH EMBODIMENT

Figure 76:
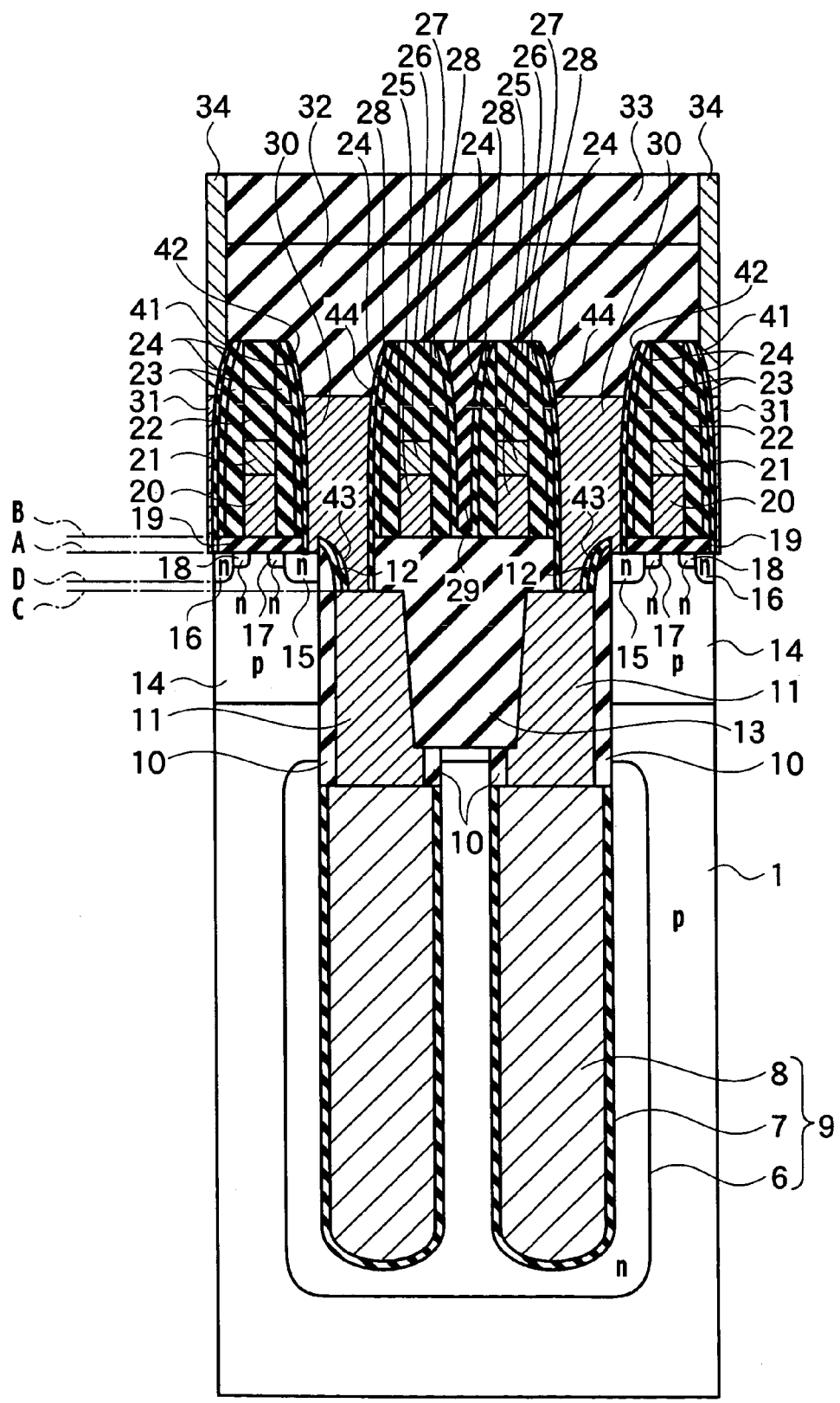
FIG. 76 is a cross-sectional diagram of a semiconductor device according to a ninth embodiment cut along the line II-II of FIG. 1.
Figure 77:
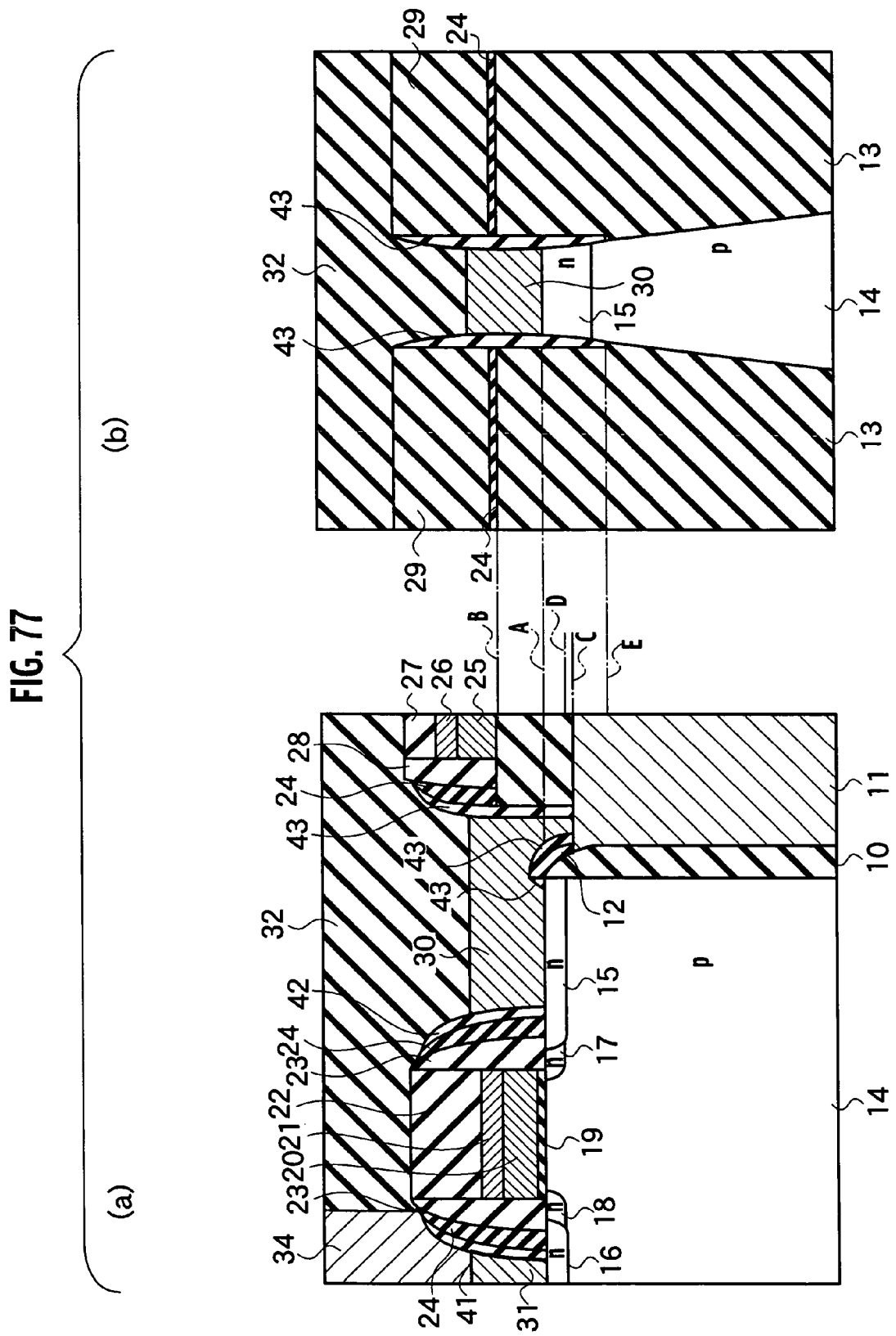
FIG. 77(a) is an enlarged view of FIG. 76.
FIG. 77(b) is a cross-sectional diagram of the semiconductor device according to the ninth embodiment cut along the line XXXIXB-XXXIXB of FIG. 1.

With a semiconductor device according to a ninth embodiment of the present invention, a top view is represented by FIG. 1 as with the first embodiment, and cross sections are represented by FIGS. 76 and 77. A difference with the semiconductor device of the ninth embodiment from the semiconductor device of the first embodiment is having the spacers 41 through 44 in addition to the spacers 12.

With the ninth embodiment, the spacers 12 are arranged upon the collar oxide films 10 and the storage nodes 11. The spacers 43 are arranged upon the spacers 12 and the storage nodes 11. The spacers 43 are also arranged upon the STI 13. The spacers 12 and 43 are arranged on the source region 15 side and cover the sides of the source regions 15. The spacers 43 are in contact with two sides of the source regions 15 and the p-wells facing each other. The spacers 43 cover three sides of the source regions 15 and the p-wells. The spacers 43 cover two sides of the drain regions 16 and the p-wells. The spacers 43 are arranged facing each other via the drain regions 16.

The spacers 42 through 44 are in contact with the sides of the SS contacts 30. The spacers 41 and 42 are in contact with the sides of the sidewalls 23. The spacers 44 are in contact with the sides of the sidewalls 28 and the sides of the STI 13. The spacers 41 are in contact with the sides of the pullout electrodes 31. Note that with the ninth embodiment, as with the fifth embodiment, the sides of the source regions 15 and the sides of the p-wells 14 are not in contact with the SS contacts 30, and the sides of the drain regions 16 and the sides of the p-wells 14 are not in contact with the pullout electrodes 31. An impurity such as arsenic doped in the SS contacts 30 and the pullout electrodes 31 does not diffuse to the bottoms of the source regions 15 and the drain regions 16 in the p-wells 14. Therefore, the threshold of the select transistors 15 through 23 does not reduce, and punch-through does not develop.

Figure 78:
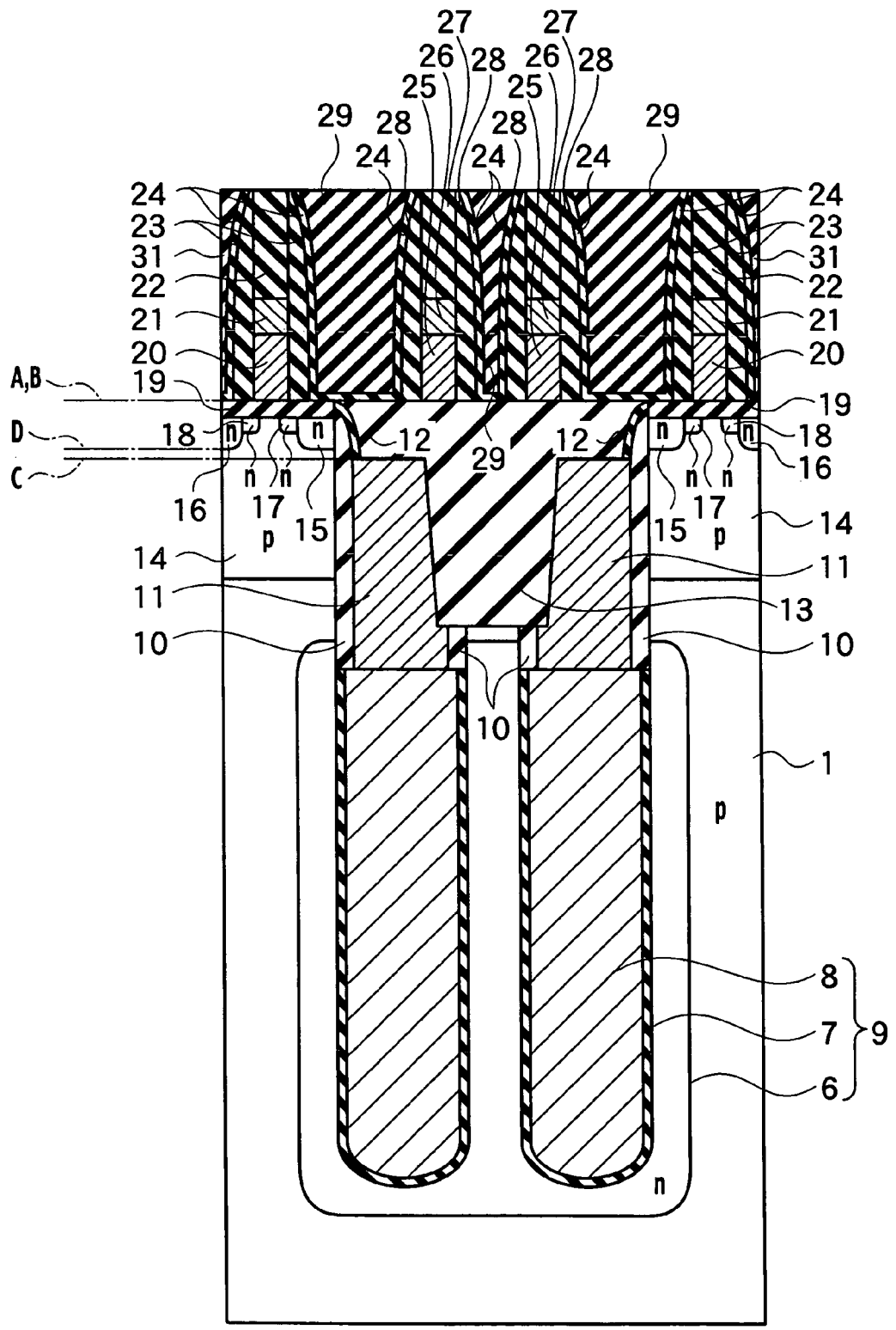
FIG. 78 is a cross-sectional diagram of the semiconductor device according to the ninth embodiment cut along the line II-II of FIG. 1.

A semiconductor device fabrication method according to the ninth embodiment is described. The semiconductor device fabrication method according to the ninth embodiment can use the same initial steps (a) through (g) as in the semiconductor device fabrication method according to the first embodiment, as shown in FIG. 78.

Figure 79:
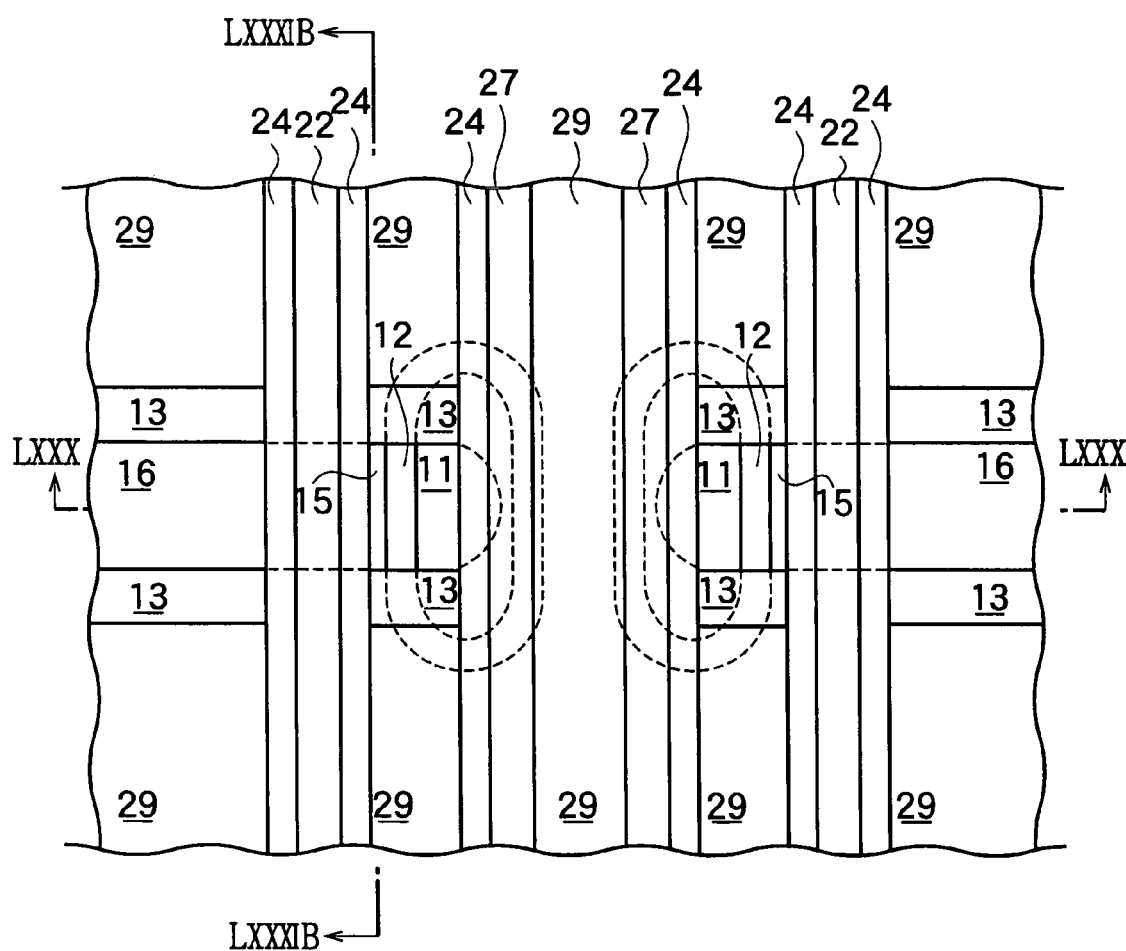
FIG. 79 is a top view of the semiconductor device according to the ninth embodiment in the course of fabrication.
Figure 80:
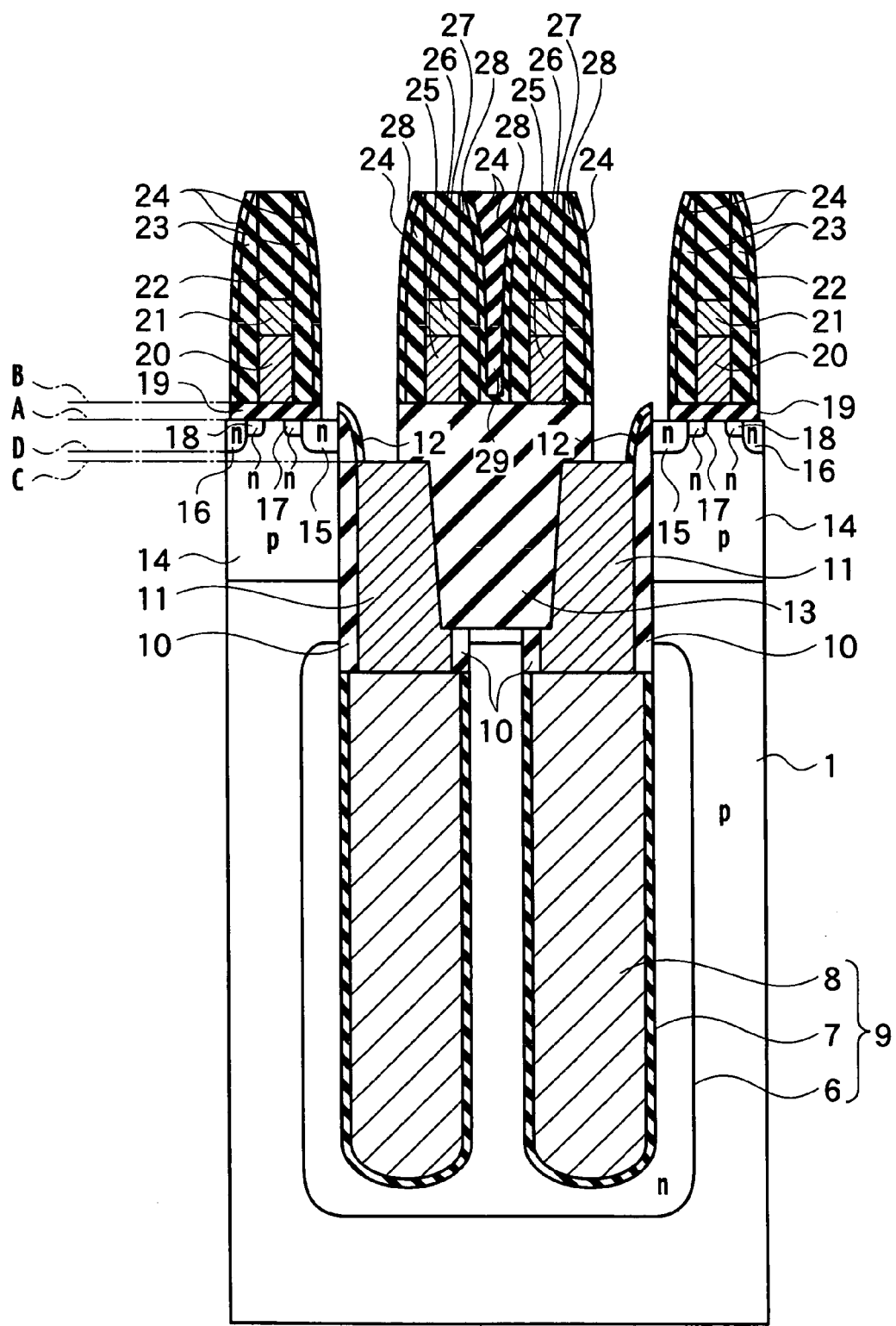
FIG. 80 is a cross-sectional diagram of the semiconductor device according to the ninth embodiment cut along the line LXXX-LXXX of FIG. 79.
Figure 81:
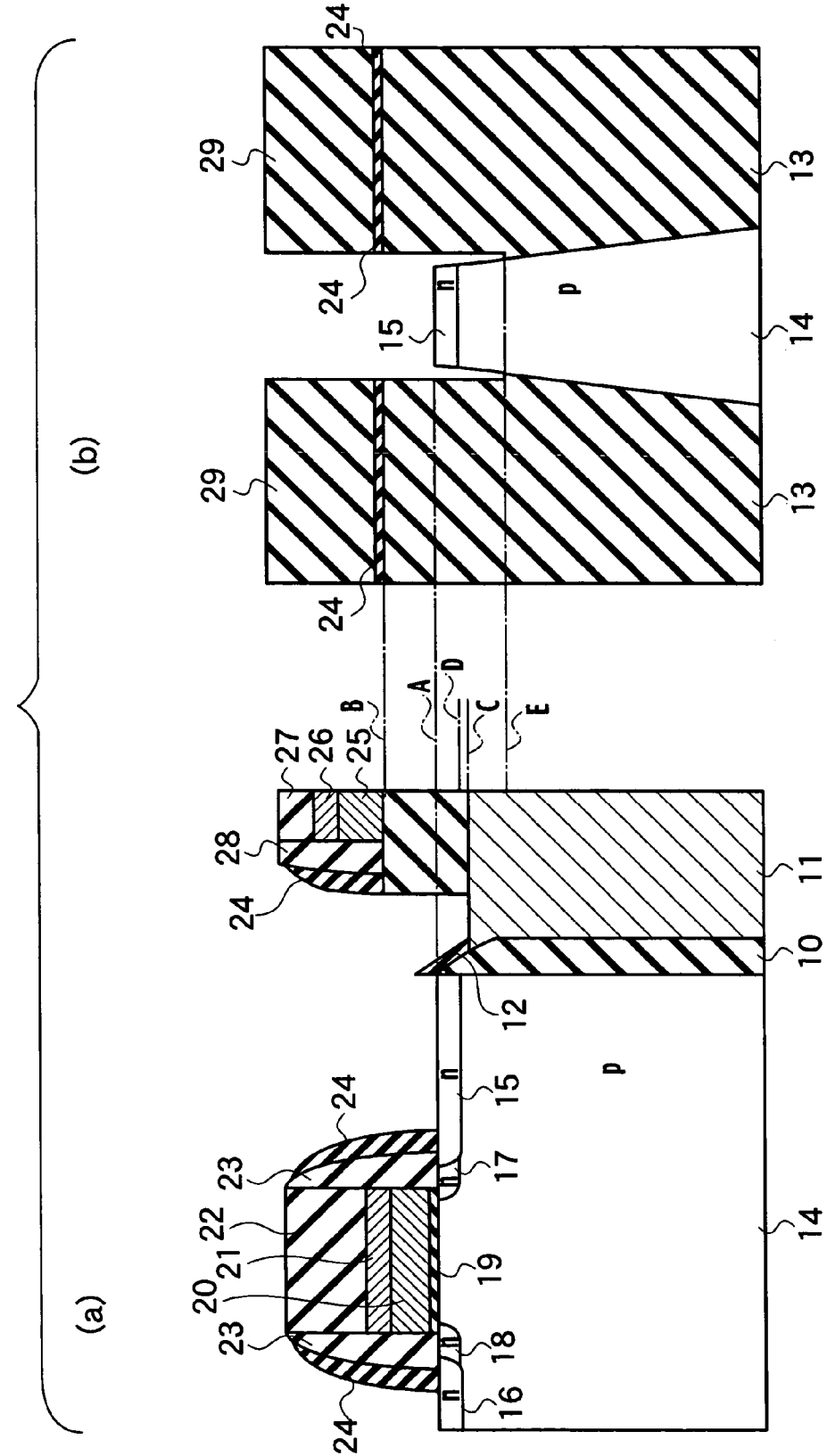
FIG. 81(a) is an enlarged view of FIG. 80.
FIG. 81(b) is a cross-sectional diagram of the semiconductor device according to the ninth embodiment cut along the line LXXXIB-LXXXIB of FIG. 79.

(a) As shown in FIGS. 79 through 81, a negative pattern of the SS contacts 30 and the pullout electrodes 31 is formed in the resist film through photolithography, and the interlayer insulator films 29 are etched using the resist film as a mask and the barrier nitride film 24 as a stopper.

(b) The barrier nitride film 24 and the TTO of the STI 13 in areas which become the SS contacts 30 and the pullout electrodes 31 are etched using dry etching techniques such as RIE using the storage nodes 11 as a stopper. The storage nodes 11 are exposed. The source regions 15 and the drain regions 16 are already exposed before being etched. By over etching, the height of the top (surface E) of the STI 13 becomes lower than that of the tops (surface C) of the storage nodes 11. Furthermore, the height of the top (surface E) of the STI 13 becomes lower than that of the bottoms (surface D) of the source regions 15. Accordingly, the sides of the source regions 15 and the p-wells 14 are exposed. The collar oxide films 10 are not etched since the spacers 12 act as a mask. The sides of the storage nodes 11 are not exposed. Furthermore, the sides of the source regions 15 and the sides of the p-wells 14 facing the sides of the storage nodes 11 are not exposed.

Figure 82:
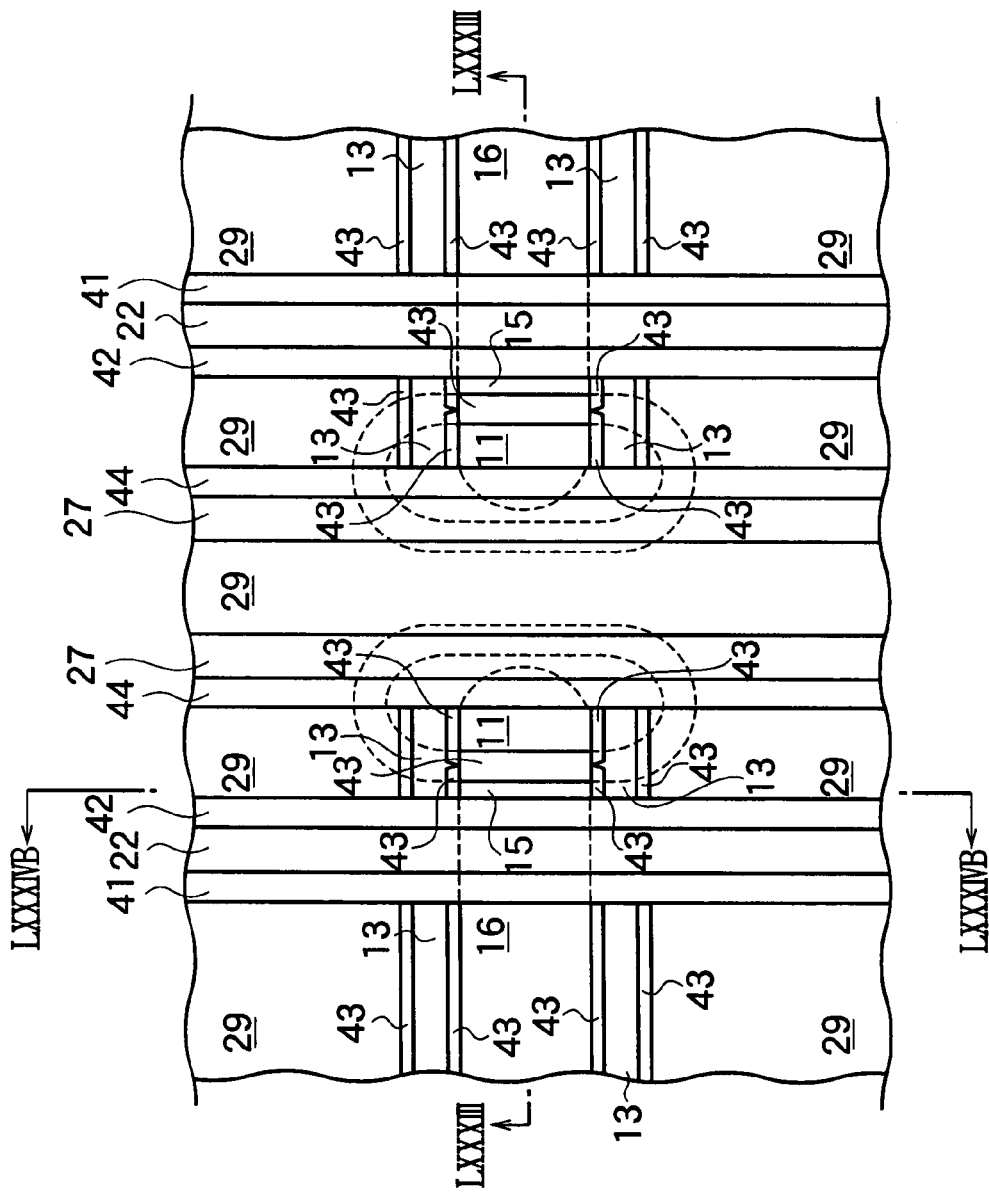
FIG. 82 is a top view of the semiconductor device according to the ninth embodiment in the course of fabrication.
Figure 83:
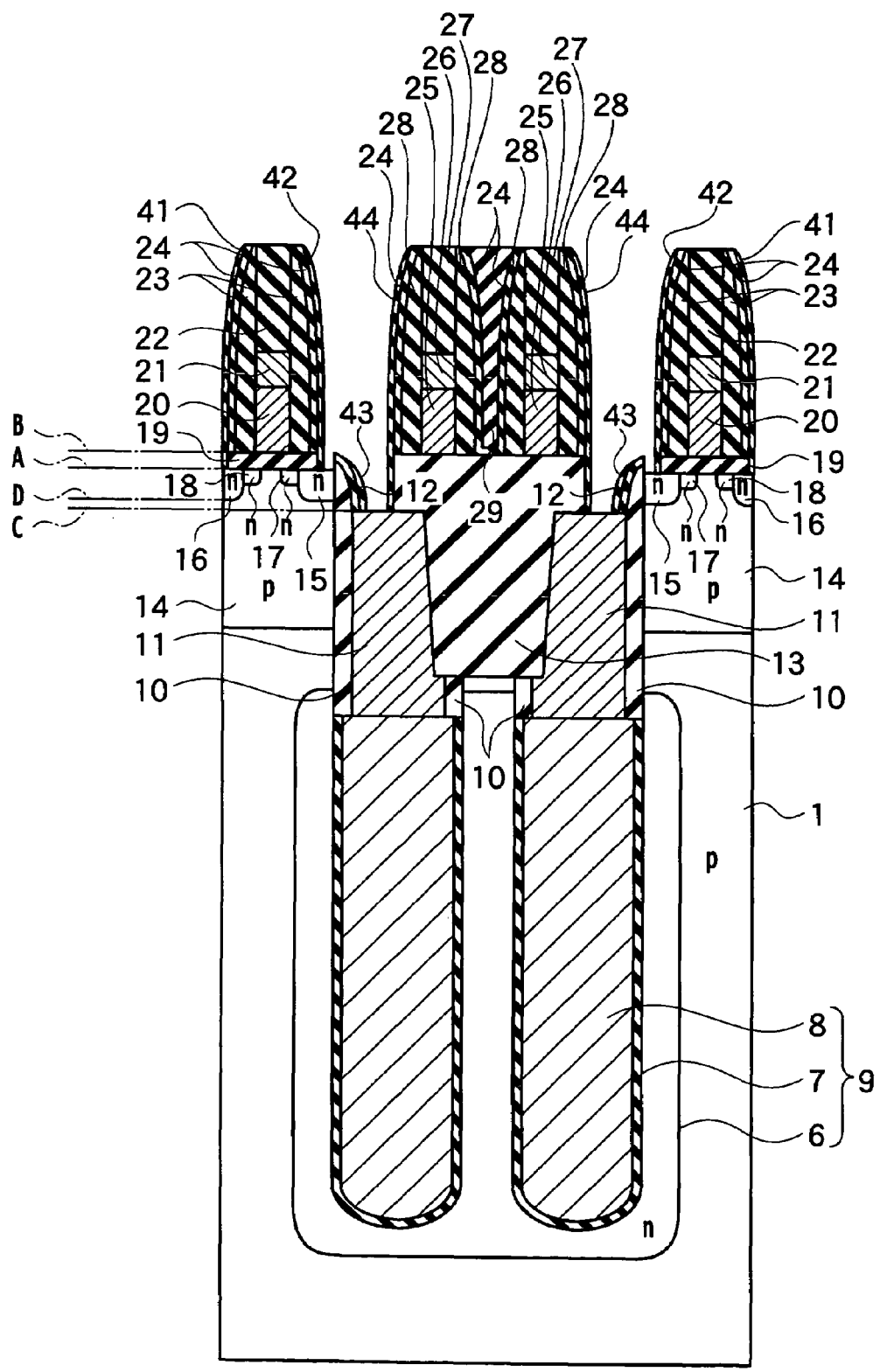
FIG. 83 is a cross-sectional diagram of the semiconductor device according to the ninth embodiment cut along the line LXXXIII-LXXXIII of FIG. 82.

(c) A silicon nitride film, which becomes the spacers 41 through 44, is deposited through CVD with a thickness of approximately 10 nm. The silicon nitride film is etched back through isotropic etching such as RIE. As shown in FIGS. 82 through 84, the spacers 43 remain upon the spacers 12 and the storage nodes 11. The spacers 43 also remain upon the STI 13 and on the sides of the interlayer insulator films 29. The spacers 43 are in contact with two sides of the source regions 15 and the p-wells facing each other. The spacers 43 cover three sides of the source regions 15 and the p-wells. The spacers 43 cover two sides of the drain regions 16 and the p-wells. The spacers 43 remain so as to face each other via the drain regions 16. The spacers 41 and 42 are in contact with the sides of the sidewalls 23. The spacers 44 are in contact with the sides of the sidewalls 28 and the sides of the STI 13. The sides of the source regions 15, the sides of the storage nodes 11, and the sides of the drain regions 16 are not exposed.

Figure 85:
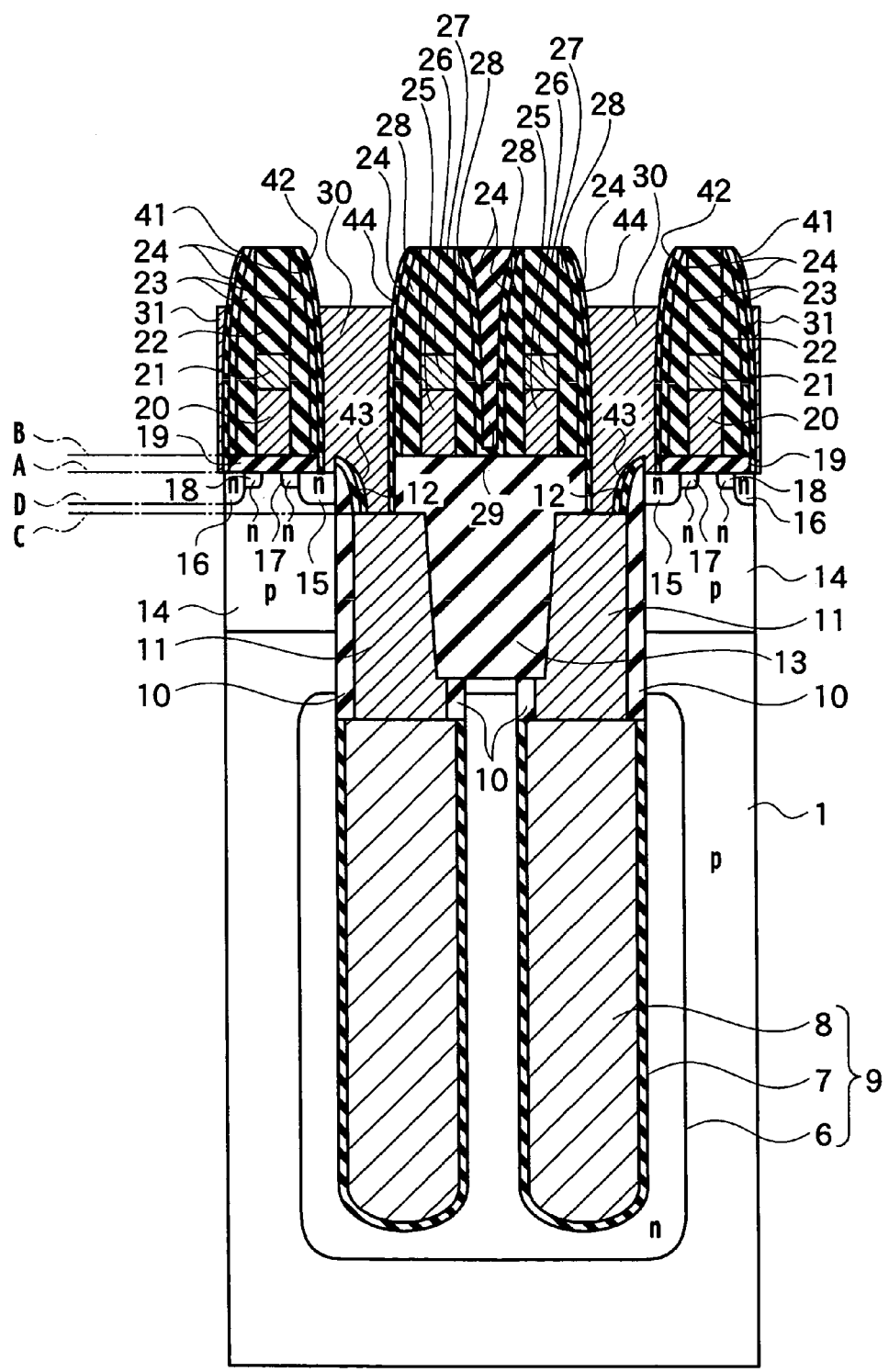
FIG. 85 is a cross-sectional diagram of the semiconductor device according to the ninth embodiment cut along the line LXXXIII-LXXXIII of FIG. 82.

(d) Before deposition of the SS contacts 30 and the pullout electrodes 31, natural oxide films formed on the drain regions 16 and the surfaces of the storage nodes 11 are removed. As shown in FIGS. 85 and 86, an arsenic-doped polysilicon film is deposited, the surface thereof is smoothed through CMP, and etched back. The SS contacts 30 and the pullout electrodes 31 are separated. The SS contacts 30 are not in contact with the sides of the source regions 15, the sides of the drain regions 16, and the sides of the p-wells 14.

(e) As shown in FIGS. 1, 76 and 77, an NSG film 32 is deposited through CVD using TEOS. Contact holes are formed in the pullout electrodes 31, and the contact plugs 34 are formed in these contact holes. Bit lines are formed so as to be connected to the contact plugs 34.

Since the SS contacts 30 are not in contact with the sides of the source regions 15 and the p-wells 14, an impurity such as arsenic in the SS contacts 30 does not diffuse to the p-wells 14.

As described above, according to the ninth embodiment, a semiconductor device allowing small areas of the source regions on the semiconductor substrate can be provided. Also according to the ninth embodiment, a fabrication method for the semiconductor device allowing small areas of the source regions on the semiconductor substrate can be provided.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
    a semiconductor substrate having a trench;
    a capacitor having a storage electrode and arranged in a lower portion of the trench;
    a collar oxide film arranged on a portion of a side of the trench above the capacitor;
    a storage node arranged on a bottom portion of a side of the collar oxide film in an upper portion of the trench and electrically connected to the storage electrode;
    a select transistor provided on a surface of the semiconductor substrate and having a source region in contact with the trench;
    a spacer arranged on a top portion of the side of the collar oxide film, the top portion of the side of the collar oxide film being above the storage node and disposed between the spacer and a side of the source region, the spacer consisting essentially of a silicon nitride film; and
    a surface strap contact arranged upon the spacer, the source region, and the storage node.

2. The semiconductor device of claim 1, wherein the spacer is arranged upon the collar oxide film.

3. The semiconductor device of claim 1, wherein the spacer is arranged upon the storage node.

4. The semiconductor device of claim 1, further comprising an isolation film arranged on a side of the storage node, wherein the spacers are arranged upon the isolation film.

5. The semiconductor device of claim 1, wherein the select transistor further comprises a drain region separated from the source region and the trench, the drain region provided on the surface of the semiconductor substrate, and
    the semiconductor device further comprises another spacer arranged on a side of the drain region.

6. The semiconductor device of claim 1, the capacitor further comprising:
    a plate electrode buried in the semiconductor substrate so as to include another portion of the side of the trench; and
    a capacitor dielectric film arranged between the plate electrode and the storage electrode in the trench,
    wherein the capacitor dielectric film extends to a portion between the spacer and the source region.

7. The semiconductor device of claim 1, wherein the top of the collar oxide film is higher than that of the storage node.

8. The semiconductor device of claim 1, wherein the height of the upper portion of the spacer is higher than that of the bottom of the source region.

9. The semiconductor device of claim 1, wherein a side of the surface strap contact is in contact with the spacer.

10. The semiconductor device of claim 1, wherein the storage electrode and the storage node are formed of a single piece of material.

11. The semiconductor device of claim 1, wherein a width of the trench is wider at the capacitor than at the collar oxide film.

12. A semiconductor device fabrication method comprising:
    forming a trench in a semiconductor substrate;
    forming a capacitor having a storage electrode, in a lower portion of the trench;
    forming a collar oxide film on a portion of a side of the trench;
    forming a storage node electrically connected to the storage electrode, on a bottom portion of a side of the collar oxide film in an upper portion of the trench;

forming a select transistor having a source region in contact with the trench and provided on a surface of the semiconductor substrate;

forming a spacer on a top portion of the side of the collar oxide film, the top portion of the side of the collar oxide film being above the storage node and disposed between the spacer and a side of the source region, the spacer consisting essentially of a silicone nitride film; and forming a surface strap contact upon the spacer, the source region, and the storage node.

13. The method of claim 12, wherein the spacer is formed above the collar oxide film.

14. The method of claim 12, wherein forming the spacer is carried out before formation of the select transistor.

15. A semiconductor device comprising:
a semiconductor substrate having a trench;
a capacitor having a storage electrode and arranged in a lower portion of the trench;
a collar oxide film arranged on a portion of a side of the trench above the capacitor;
a storage node arranged on a bottom portion of a side of the collar oxide film in an upper portion of the trench and electrically connected to the storage electrode;
a select transistor provided on a surface of the semiconductor substrate and having a source region in contact with the trench;
a spacer arranged in physical contact with a top portion of the side of the collar oxide film, the spacer being positioned above the storage node and arranged laterally to a side of the source region, the spacer consisting essentially of a silicon nitride film; and
a surface strap contact arranged upon the spacer, the source region, and the storage node.

* * * * *